United States Patent
Suzuki

(10) Patent No.: US 7,391,353 B2
(45) Date of Patent: Jun. 24, 2008

(54) ANALOG/DIGITAL CONVERTER

(75) Inventor: Masahiro Suzuki, Osaka (JP)

(73) Assignee: Fuetrek Co., Ltd., Osaka-shi (JP)

( * ) Notice: Subject to any disclaimer, the term of this patent is extended or adjusted under 35 U.S.C. 154(b) by 42 days.

(21) Appl. No.: 11/628,651

(22) PCT Filed: Apr. 12, 2006

(86) PCT No.: PCT/JP2006/007731

§ 371 (c)(1),
(2), (4) Date: Dec. 6, 2006

(87) PCT Pub. No.: WO2006/126338

PCT Pub. Date: Nov. 30, 2006

(65) Prior Publication Data

US 2008/0036638 A1  Feb. 14, 2008

(30) Foreign Application Priority Data

May 27, 2005  (JP) .................. 2005-155575

(51) Int. Cl.
*H03M 1/12* (2006.01)
(52) U.S. Cl. .................. 341/155; 341/156
(58) Field of Classification Search .......... 341/155, 341/156; 331/46, 56
See application file for complete search history.

(56) References Cited

U.S. PATENT DOCUMENTS

| | | | | |
|---|---|---|---|---|
| 3,868,677 | A * | 2/1975 | Kidd | 341/157 |
| 6,111,533 | A * | 8/2000 | Yuan et al. | 341/157 |
| 6,753,798 | B2 * | 6/2004 | Feldtkeller | 341/143 |
| 6,809,599 | B2 * | 10/2004 | Shimoda | 331/17 |
| 2002/0008585 | A1 * | 1/2002 | Welland | 331/2 |

FOREIGN PATENT DOCUMENTS

| | | |
|---|---|---|
| JP | 57 084620 | 5/1982 |
| JP | 05 259907 | 10/1983 |
| JP | 04 314210 | 11/1992 |
| JP | 06 112825 | 4/1994 |
| JP | 2003 032113 | 1/2003 |
| JP | 3701668 | 7/2005 |

* cited by examiner

OTHER PUBLICATIONS

Barrie Gilbert, et al., Analog Devices AN-277 Application Note, III Instrumentation Applications, Analog-to-Digital Conversion, 18 pages, 1995.

*Primary Examiner*—Peguy JeanPierre
(74) *Attorney, Agent, or Firm*—Oblon, Spivak, McClelland, Maier & Neustadt, P.C.

(57) ABSTRACT

An A-D converter utilizing V-F conversion is realized that is capable of performing A-D conversion with high precision without increasing conversion frequency. Two VCOs are provided to find a V-F conversion value that is less than a period of the main VCO by making use of a period difference between the two VCOs. By counting the number of pulses in a pulse signal that is output from a BASE-VCO with a counter, a high order bit of a digital signal is generated. A low order bit, on the other hand, is generated by calculating, for each sampling period, a phase difference from the beginning of a sampling period until a first pulse generation in the sampling period for the output of the BASE-VCO by a third register and second and third subtracters, based on the number of pulses in the output of the BASE-VCO contained in a period from a current activation time point of sampling signal Ps to a time point at which phases of outputs of the BASE-VCO and JAW-VCO match.

13 Claims, 33 Drawing Sheets

F I G . 1
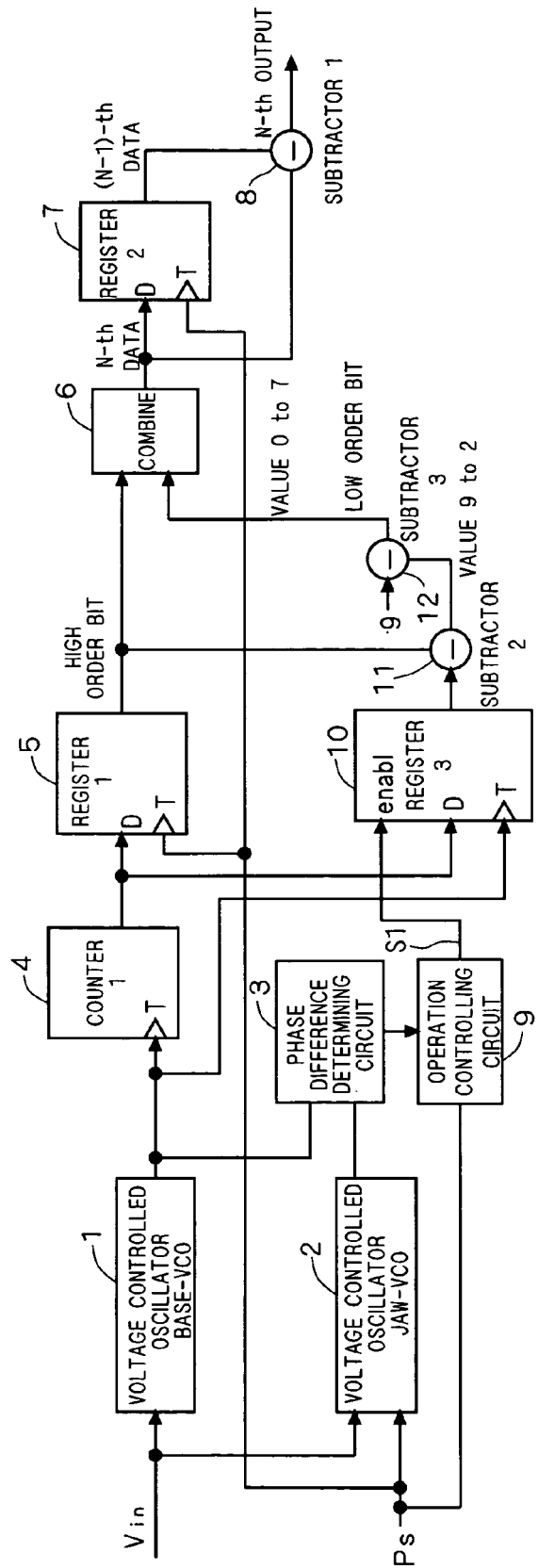

F I G . 5
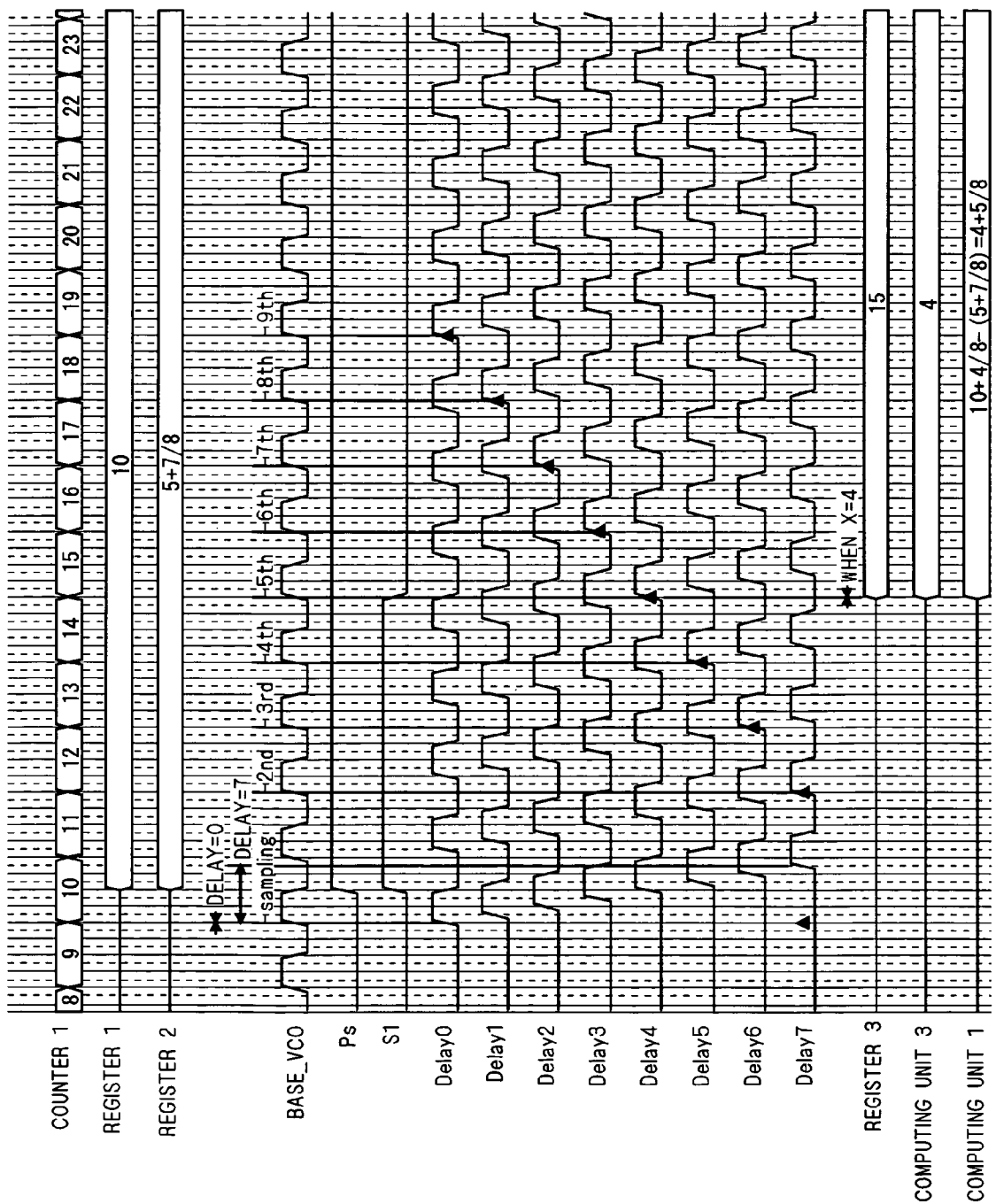

F I G . 1 6
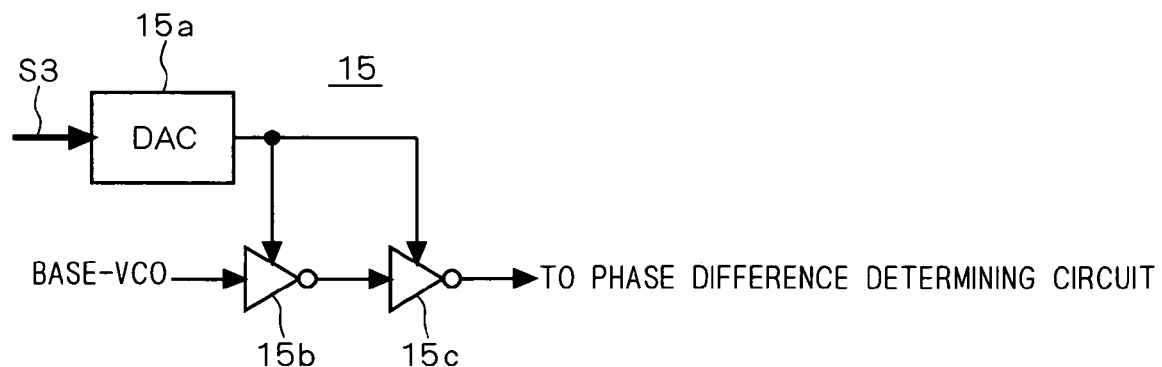

F I G . 1 7
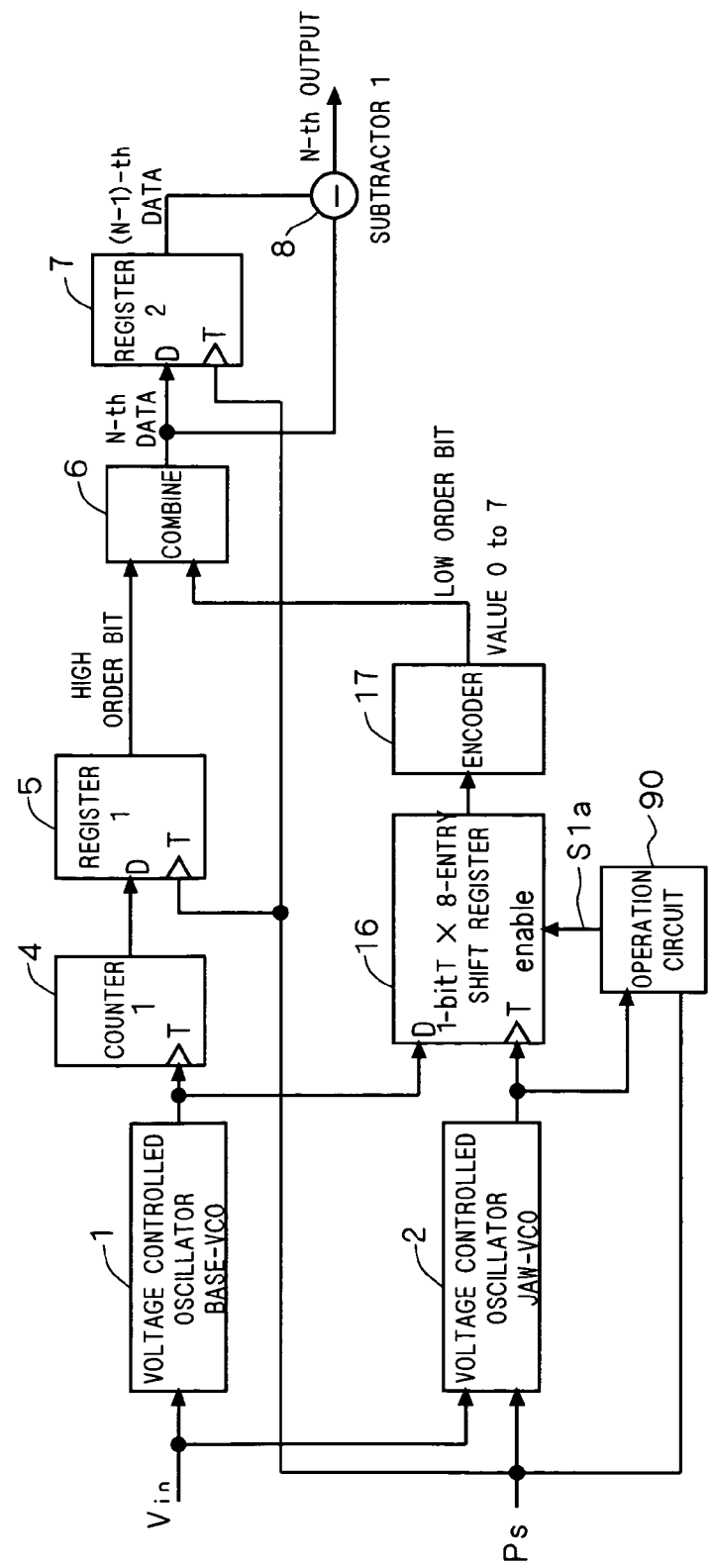

F I G . 1 8
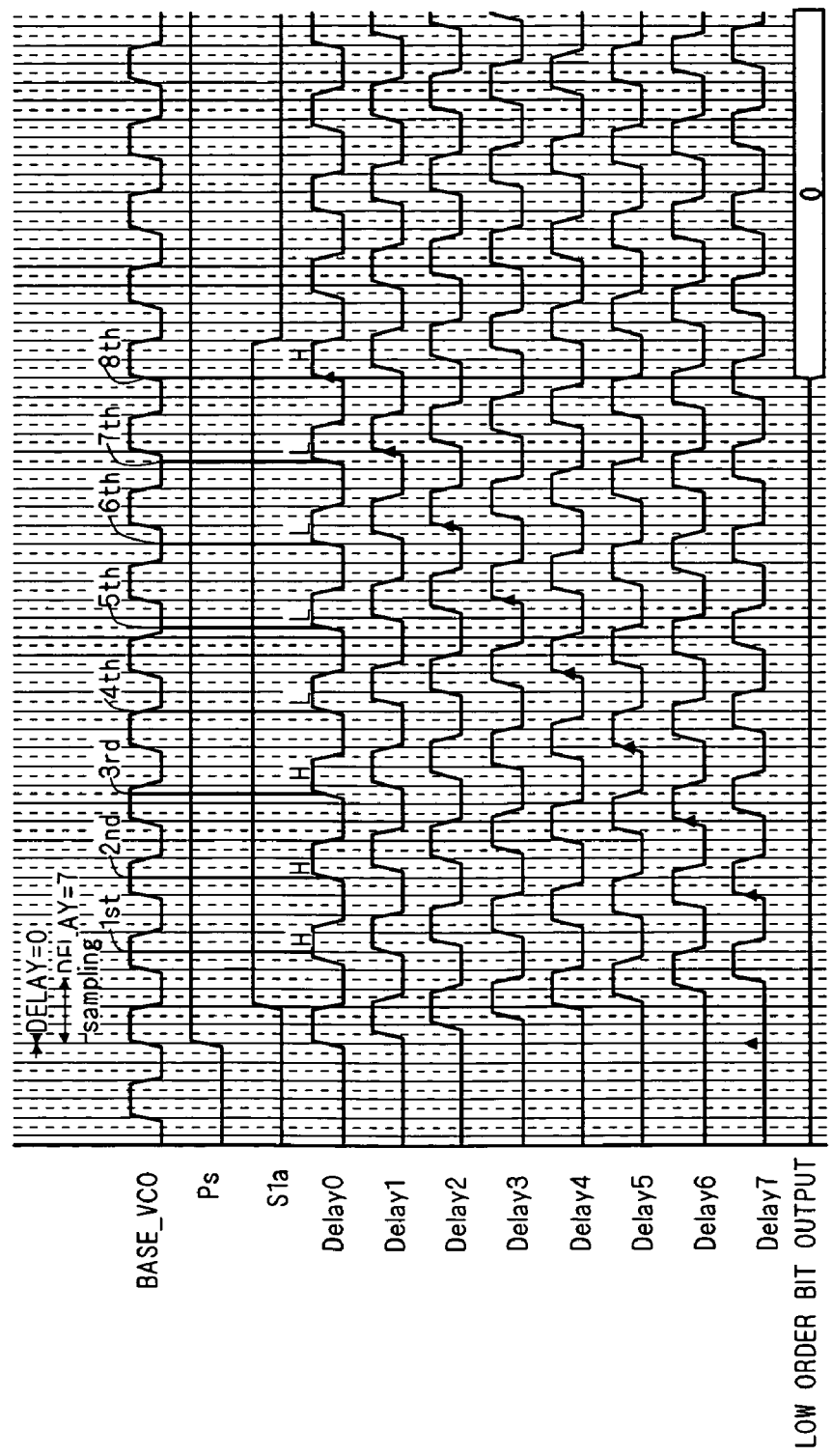

F I G . 2 6
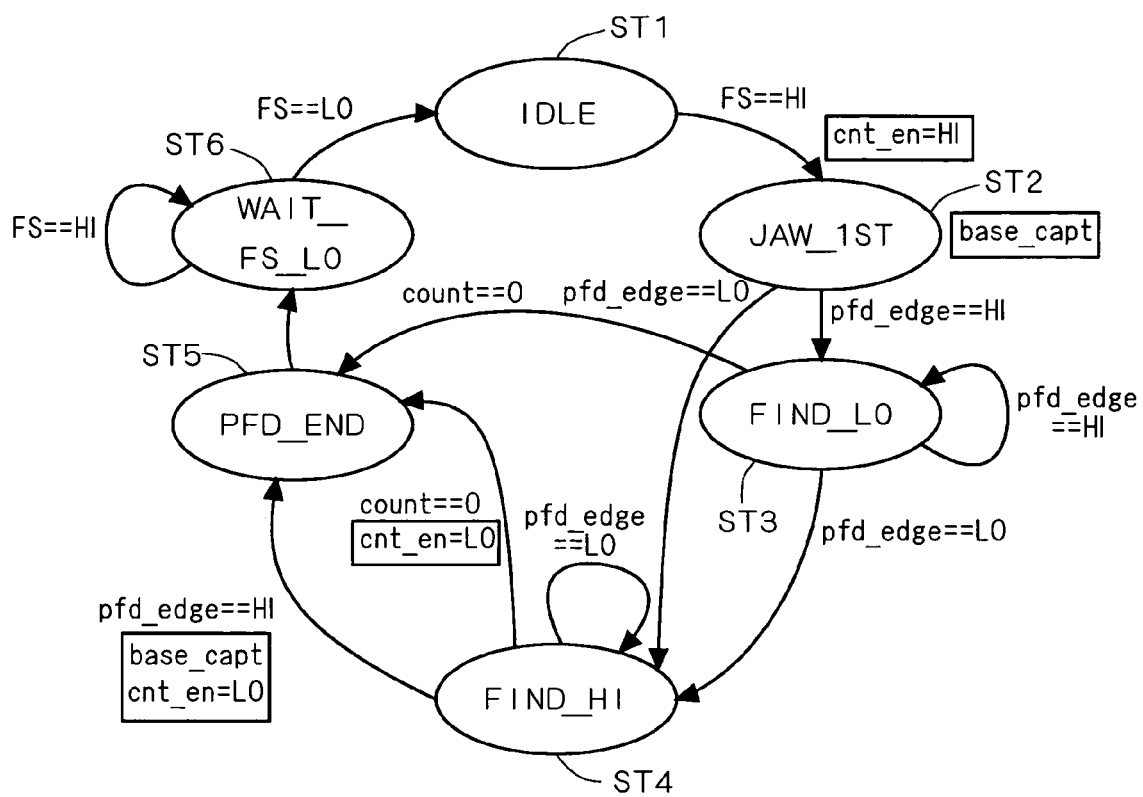
※ == REPRESENTS JUDGMENT, = REPRESENTS SUBSTITUTION

F I G . 3 0
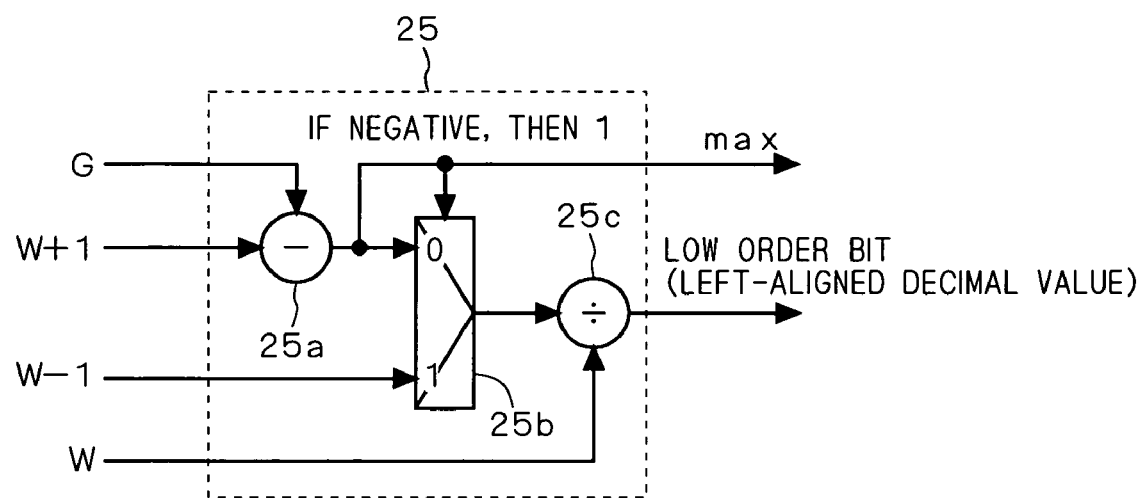

※== REPRESENTS JUDGMENT, = REPRESENTS SUBSTITUTION
ONE SHOT WHERE ONLY SIGNAL NAME IS SHOWN

F I G . 3 4
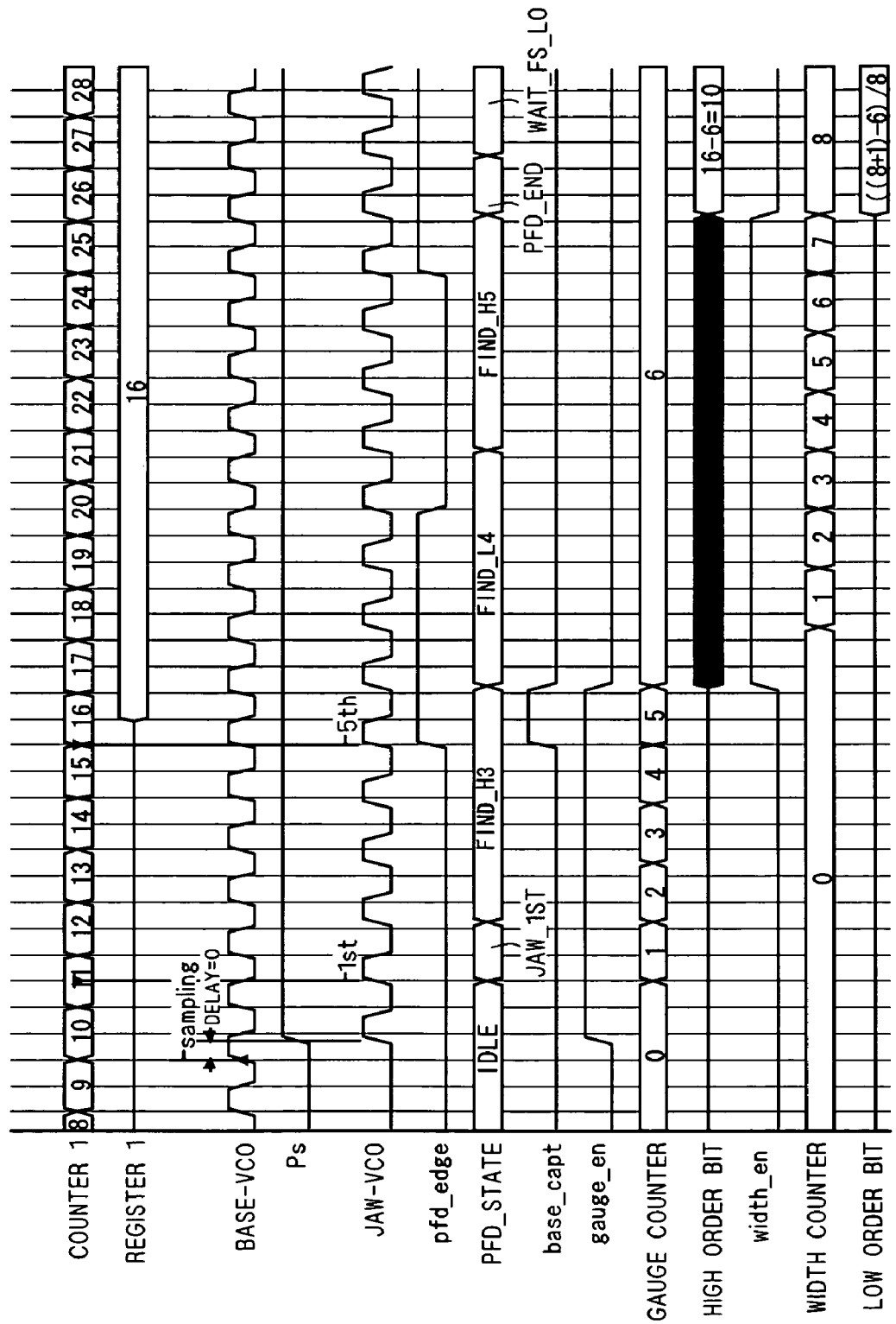

ANALOG/DIGITAL CONVERTER

TECHNICAL FIELD

This invention relates to an analog-to-digital converter (hereinafter referred to as an "A-D converter") capable of converting an analog signal to a digital signal with high precision.

BACKGROUND ART

An A-D converter that utilizes V-F (Voltage-Frequency) conversion is disclosed in the following Non patent document 1. In this type of A-D converter, the frequency of a pulse signal that is output from the V-F conversion unit fluctuates according to the magnitude of the input voltage, which is an analog signal, and the A-D converter generates a digital signal by counting the number of pulses contained in that pulse signal with a counter.

Non patent document 1: ANALOG DEVICES AN-277 APPLICATION NOTE, III INSTRUMENTATION APPLICATIONS, Analog-to-Digital Conversion, FIG. 9, Internet<URL:http://www.analog.com/UploadedFiles/Application_Notes/511072672AN 277.pdf>

DISCLOSURE OF INVENTION

Problem to be Solved by the Invention

In the A-D converter disclosed in the above-cited document, the number of pulses of the pulse signal that is output from the V-F conversion unit is simply counted by a single counter. Therefore, in a case where the value of the input voltage is small and as such the pulse signal contains only a small number of pulses, or in a case where the fluctuation of the input voltage is small and as such the number of pulses that the pulse signal contains shows substantially no change, the value counted by the counter shows almost no fluctuation. Thus, highly precise A-D conversion has not been possible.

A-D conversion can be made more accurate if the conversion frequency of V-F conversion can be increased. However, the conversion frequency cannot be increased easily because there are limitations on the conditions under which the circuit is manufactured, the permissible frequency jitter value, and the like.

This invention has been accomplished in view of the foregoing circumstances, and it achieves an A-D converter utilizing V-F conversion that is capable of performing A-D conversion with high precision without increasing the conversion frequency.

According to a first aspect of the present invention, an analog-to-digital converter for converting an input voltage that is an analog signal into a digital signal, includes a first VCO (Voltage Controlled Oscillator) for outputting a first pulse signal oscillating at a first period; a second VCO for outputting a second pulse signal oscillating at a second period; and a digital value calculating unit, wherein: a ratio of the first period and the second period is A:B (A≠B); the first and second periods are controlled by the input voltage while the ratio is maintained; the first VCO starts oscillation of the first pulse signal by free running; the second VCO starts oscillation of the second pulse signal in response to activation of a sampling signal indicating a sampling period for the digital signal; and the digital value calculating unit calculates a high order bit of the digital signal according to a pulse number of the first pulse signal contained in the sampling period, and a low order bit of the digital signal according to the number of pulses of the first or second pulse signal contained from an activation time point of the sampling signal to a time point at which phases of the first and second pulses match each other.

Preferably, in the analog-to-digital converter, the digital value calculating unit includes: a high-order calculating unit; a low-order calculating unit; a high- and low-order combining unit; a first register; and a subtracter, wherein the high-order calculating unit calculates, as a high order, the number of pulses in the first pulse signal from start of oscillation of the first pulse signal until a current activation time point of the sampling signal for each the sampling period; the low-order calculating unit calculates, as a low order, a phase difference from the last pulse within the sampling period of the first pulse signal until the end point of the sampling period for each the sampling period, based on the number of pulses contained in the first or second pulse signal from the current activation time point until a time point at which phases of the first and second pulse signals of the sampling signal match each other; the high- and low-order combining unit combines the high order and the low order to generate a combined value and lets the first register hold the combined value; and the subtracter outputs a difference value between a value held in the first register in the sampling period that is one before a current period and a current value of the combined value, as the digital signal composed of the high order bit and the low order bit.

Preferably, in the analog-to-digital converter, the high-order calculating unit includes: a first counter for counting the number of pulses of the first pulse signal; and a second register, and the low-order calculating unit includes: a third register, and wherein: the second register holds the number of pulses of the first counter at the activation time point of the sampling signal for each the sampling period and outputs it as the high order; the third register holds the number of pulses of the first counter at a time point at which the phases of the first and second pulse signals match each other for each the sampling period; and the low-order calculating unit calculates the phase difference based on a difference between the number of pulses held in the third register and the number of pulses held in the second register for each the sampling period.

Preferably, in the analog-to-digital converter, the low-order calculating unit includes a second counter for counting corresponding to oscillation of the second pulse signal from the activation time point of the sampling signal until the time point at which the phases of the first and second pulse signals match each other, and wherein the low-order calculating unit calculates the phase difference for each the sampling period, based on a count value of the second counter.

Preferably, in the analog-to-digital converter, a maximum value of the low order bit calculated is a value obtained by subtracting 1 from a power of 2.

Preferably, in the analog-to-digital converter, one of the first and second VCOs includes a plurality of inverting circuits connected in series in a ring shape; the other one of the first and second VCOs includes a plurality of other inverting circuits connected in series in a ring shape; the plurality of other inverting circuits has a dual input NAND circuit or a dual input NOR circuit as a first stage inverting circuit; one of input terminals of the dual input NAND circuit or the dual input NOR circuit is supplied with an output of a last stage inverting circuit among the plurality of other inverting circuits; the other input terminal of the dual input NAND circuit or the dual input NOR circuit is supplied with an output of an inverting circuit that is prior to the last stage among the plurality of other inverting circuits; an output of a last stage inverting circuit among the plurality of inverting circuits functions as one of the first and second pulse signals corresponding to the one of the first and second VCOs; and the output of the last stage inverting circuit among the plurality of other inverting circuits functions as the other one of the first and second pulse signals corresponding to the other one of the first and second VCOs.

Preferably, the analog-to-digital converter further includes a first prescaler for dividing a frequency corresponding to the first period of the first pulse signal by the B; a second prescaler for dividing a frequency corresponding to the second period of the second pulse signal by the A; a phase comparator for comparing phases of outputs of the first and second prescalers; and a LPF (Low Pass Filter) receiving an output from the phase comparator, and wherein: at least one of the first and second periods is controlled by an output from the LPF in addition to the input voltage.

Preferably the analog-to-digital converter further includes a delay circuit for adding a predetermined delay amount to the first pulse signal, and wherein the predetermined delay amount is a delay amount that has been measured in advance and is produced between activation of the sampling signal and start of oscillation of the second pulse signal.

Preferably, in the analog-to-digital converter, the low-order calculating unit includes: a shift register having one of the first and second pulse signals as a signal input and the other one of the first and second pulse signals as a clock input; and an encoder for outputting a numerical value corresponding to an output pattern of the shift register as the phase difference.

Preferably, in the analog-to-digital converter, the high-order calculating unit includes: a first counter for counting the number of pulses of the first pulse signal; and a register, and wherein: the register holds, for each the sampling period, at least a count value of the first counter at a time point that is shifted half a period of the second period from the time point at which the phases of the first and second pulse signals match each other; and the high-order calculating unit identifies, for each the sampling period, the number of pulses of the first pulse signal at the activation time point of the sampling signal based on the count value held in the register and the phase difference calculated by the low-order calculating unit.

Preferably, in the analog-to-digital converter, the register is a shift register capable of holding, for each the sampling period, at least the count value of the first counter at the time point shifted half a period of the second period from the time point at which the phases of the first and second pulse signals match each other in response to the count value of the first counter, and the high-order calculating unit further includes: a selecting unit for selecting, for each the sampling period, a count value of the first counter stored in the shift register at the time point shifted half a period of the second period from the time point at which the phases of the first and second pulse signals match each other, based on the phase difference calculated by the low-order calculating unit; and a computing unit for identifying the number of pulses of the first pulse signal at the activation time point of the sampling signal, based on the count value of the first counter selected by the selecting unit, and the phase difference calculated by the low-order calculating unit.

Preferably, in the analog-to-digital converter, the high-order calculating unit further includes: a detecting unit; and a computing unit, and wherein: the detecting unit causes the register to hold the count value of the first counter at the time point shifted half a period of the second period from the time point at which the phases match each other when the detecting unit has detected the time point at which the phases of the first and second pulse signals match each other; and the computing unit identifies the number of pulses of the first pulse signal at the activation time point of the sampling signal based on the count value of the first counter held by the register and on the phase difference calculated by the low-order calculating unit.

Preferably, in the analog-to-digital converter, the low-order calculating unit includes: a detecting unit for detecting a time point at which phases of the first and second pulse signals match each other and a time point at which the phases of the first and second pulse signals inversely match each other; a third counter for counting corresponding to oscillation of the second pulse signal from an activation time point of the sampling signal until the time point detected by the detecting unit, at which the phases of the first and second pulse signals match each other; a fourth counter for counting corresponding to oscillation of the second pulse signal from the time point detected by the detecting unit at which the phases of the first and second pulse signals match each other to a next time point detected by the detecting unit at which the phases of the first and second pulse signals match each other, or oscillation of the second pulse signal from the time point detected by the detecting unit, at which the phases of the first and second pulse signals inversely match each other, to a next time point detected by the detecting unit at which the phases of the first and second pulse signals inversely match each other; and a computing unit, wherein the computing unit calculates the phase difference by dividing a count value of the third counter by a count value of the fourth counter for each the sampling period.

Effects of the Invention

In one embodiment of the analog-to-digital converter according to the invention, the digital value calculating unit calculates a high order bit of the digital signal based on the number of pulses of the first pulse signal contained in the sampling period, and it calculates a low order bit of the digital signal based on the number of pulses of the first or second pulse signal contained in a period from the activation time point of the sampling signal to the time point at which the phases of the first and second pulse signals match each other. Because the first period and the second period are different from each other, the number of pulses of the first or second pulse signal contained in the period from the activation time point of the sampling signal to the time point at which the phases of the first and second pulse signals match each other is a V-F (Voltage-Frequency) conversion value that is less than the first period, thus making available an A-D converter utilizing V-F conversion that is capable of performing highly precise A-D conversion.

In one embodiment of the analog-to-digital converter according to the invention, the digital value calculating unit includes: a high-order calculating unit; a low-order calculating unit; a high- and low-order combining unit; a first register; and a subtracter, and it outputs a difference value between a value held in the first register in the sampling period that is one before a current period and a current value of the combined value, as the digital signal. Therefore, the invention is achieved with a simple circuit configuration.

In one embodiment of the analog-to-digital converter according to the invention, the high-order calculating unit includes: a first counter and a second register, and the low-order calculating units includes a third register and the low-order calculating unit calculates the phase difference based on a difference the number of pulses held in the third register and the number of pulses held in the second register for each the sampling period. Therefore, the invention is achieved with a simple circuit configuration.

In one embodiment of the analog-to-digital converter according to the invention, the low-order calculating unit includes a second counter, and the low-order calculating unit calculates the phase difference for each the sampling period, based on a count value of the second counter. Therefore, the invention can be achieved with a simple circuit configuration.

In one embodiment of the analog-to-digital converter according to the invention, a maximum value of the low order bit calculated is a value obtained by subtracting 1 from a power of 2. Therefore, the low order bit can be output without being converting into a base other than binary, and the circuit configuration can be made simple.

In one embodiment of the analog-to-digital converter according to the invention, one of input terminals of the dual input NAND circuit or the dual input NOR circuit is supplied with an output of a last stage inverting circuit among the plurality of other inverting circuits; and the other input terminal of the dual input NAND circuit or the dual input NOR circuit is supplied with an output of an inverting circuit that is an even number prior to the last stage among the plurality of other inverting circuits. Thereby, the other one of the first and second pulse signals oscillates at the same period as the VCO containing a predetermined number less inverting circuits than the one of the first and second pulse signals. Thus, while ring oscillation is reliably generated by making the other inverting circuit of the first and second VCOs an odd-numbered stage, and the inverting circuit in which the output is supplied to the other input terminal of the dual input NAND circuit or the dual input NOR circuit is selected to be near the last stage, whereby the difference between the second period of the second pulse signal and the first period of the first pulse signal can be set at a desired value. The difference between the first and second periods corresponds to the minimum resolution of the low order bit of the digital signal, and therefore, A-D conversion can be performed with high precision.

In one embodiment of the analog-to-digital converter according to the invention, a first prescaler divides a frequency corresponding to the first period of the first pulse signal by the B; and a second prescaler divides a frequency corresponding to the second period of the second pulse signal by the A. A phase comparator compares phases of outputs of the first and second prescalers; and an output from the comparator is used for controlling at least one of the first and second periods through the LPF. Thus, feedback is effected so that the first and second periods can maintain the ratio A:B, whereby calibration of the first and second periods is possible.

In one embodiment of the analog-to-digital converter according to the invention, a delay circuit adds a predetermined delay amount to the first pulse signal, and the predetermined delay amount is a delay amount that has been measured in advance and is produced between activation of the sampling signal and start of oscillation of the second pulse signal. Even when the oscillation of the second pulse signal does not start immediately after activation of the sampling signal, a corresponding delay amount is added to the first pulse signal; therefore, the delay caused between the activation of the sampling signal and the start of oscillation of the second pulse signal can be cancelled so that a match in the phases between the first and second pulse signals can be detected with high precision.

In one embodiment of the analog-to-digital converter according to the invention, the low-order calculating unit includes: a shift register having one of the first and second pulse signals as a signal input and the other one of the first and second pulse signals as a clock input; and an encoder for outputting a numerical value corresponding to an output pattern of the shift register as the phase difference. Because output patterns of the shift register vary depending on the time point at which the phases of the first and second pulse signals match, an appropriate phase difference can be output by associating the output numerical values from the encoder with the phase differences corresponding to various output patterns of the shift register. Therefore, the invention can be achieved with a simple circuit configuration.

In one embodiment of the analog-to-digital converter according to the invention, the high-order calculating unit identifies, for each the sampling period, the number of pulses in the first pulse signal at the activation time point of the sampling signal based on the count value of the first counter held in the register which is a value at a time point shifted half a period of the second period from the time point at which the phases match and on the phase difference calculated by the low-order calculating unit. When the pulse number of the first pulse signal at the activation time point of the sampling signal is identified based on activation of the sampling signal, calculation errors tend to occur in the high-order calculating unit if activation of the first pulse signal and activation of the sampling signal are close to each other; however, because the pulse number is identified based on the count value of the first counter held by the register, at a time point shifted half a period of the second period from the time point at which the phases match and on the phase difference calculated by the low-order calculating unit, calculation errors do not occur in the high-order calculating unit.

In one embodiment of the analog-to-digital converter according to the invention, the register is a shift register capable of holding, for each the sampling period, at least the count value of the first counter at the time point shifted half a period of the second period from the time point at which the phases of the first and second pulse signals match each other in response to the count value of the first counter, and the high-order calculating unit further includes: a selecting unit for selecting a count value of the first counter at the time point shifted half a period of the second period from the time point at which the phases of the first and second pulse signals match each other; and a computing unit for identifying the number of pulses in the first pulse signal at the activation time point of the sampling signal based on the count value of the first counter selected by the selecting unit and the phase difference calculated by the low-order calculating unit. Therefore, the invention can be achieved with a simple circuit configuration.

In one embodiment of the analog-to-digital converter according to the invention, the high-order calculating unit further includes: a detecting unit; and a computing unit, and wherein the detecting unit causes the register to hold the count value of the first counter at the time point shifted half a period of the second period from the time point at which the phases match each other when the detecting unit has detected the time point at which the phases of the first and second pulse signals match each other; and the computing unit identifies the number of pulses in the first pulse signal at the activation time point of the sampling signal based on the count value of the first counter held by the register and on the phase difference calculated by the low-order calculating unit. Therefore, the invention can be achieved without using a shift register having a large circuit scale but with a simple circuit configuration.

In one embodiment of the analog-to-digital converter according to the invention, the low-order calculating unit includes: a detecting unit; third and fourth counters; and a computing unit, wherein the computing unit calculates the phase difference by dividing a count value of the third counter by a count value of the fourth counter for each the sampling period. Since the value obtained by dividing the count value of the third counter by the count value of the fourth counter corresponds to the V-F conversion value that is less than the first period, the phase difference can be calculated properly even when the first period of the first VCO and the second period of the second VCO may be any values.

BRIEF DESCRIPTION OF DRAWINGS

FIG. 1 is a circuit diagram showing an A-D converter according to a first preferred embodiment.

FIG. 5 is a timing chart showing an operation of the A-D converter according to the first preferred embodiment.

FIG. 16 is a diagram showing the detailed configuration of the delay adding circuit.

FIG. 17 is a circuit diagram showing an A-D converter according to a fifth preferred embodiment.

FIG. 18 is a timing chart showing an operation of the A-D converter according to the fifth preferred embodiment.

FIG. 26 is a state transition diagram for a rising-edge detection state machine.

FIG. 30 is a diagram showing the detailed configuration of a low-order bit calculating unit.

FIG. 34 is a timing chart showing an operation of the A-D converter according to the eighth preferred embodiment.

BEST MODE FOR CARRYING OUT THE INVENTION

First Preferred Embodiment

Figure 2:
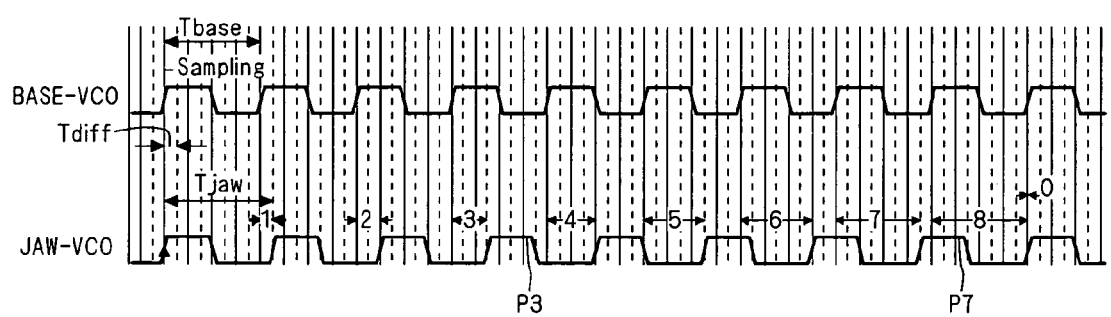
FIG. 2 is a timing chart showing one example of a pulse signal of BASE-VCO and a pulse signal of JAW-VCO.

The present preferred embodiment discusses an A-D converter utilizing V-F conversion. The A-D converter has two VCOs such as to utilize the period difference between the two VCOs in finding a V-F conversion value that is less than the period of the main VCO, in order to perform highly precise A-D conversion.

FIG. 1 is a circuit diagram showing an A-D converter according to the present preferred embodiment. As shown in FIG. 1, this A-D converter is an A-D converter for converting an input voltage Vin, which is an analog signal, into a digital signal, and is furnished with a BASE-VCO (Voltage Controlled Oscillator) 1 for outputting a pulse signal that oscillates at a period Tbase, and a JAW-VCO 2 for outputting a pulse signal that oscillates at a period Tjaw, which is different from the period Tbase.

The A-D converter is also furnished with: a phase difference determining circuit 3; a counter 4 and a first register 5, which serve as a high-order calculating unit; a high- and low-order combining unit 6; a second register 7; a first subtracter 8; an operation control circuit 9; and a third register 10 and second and third subtracters 11 and 12, which serve as a low-order calculating unit. The phase difference determining circuit 3, the high-order calculating unit (the counter 4 and the first register 5), the high- and low-order combining unit 6, the second register 7, the first subtracter 8, the operation control circuit 9, and the low-order calculating unit (the third register 10 and the second and third subtracters 11 and 12) work in concert with one another to function as a digital value calculating unit.

First, the principle of the present invention will be described. Basically, in the present invention too, the pulse number of the pulse signal that is output from the BASE-VCO 1 is counted by the counter 4 in order to generate a digital signal, as in the previously-mentioned A-D converter shown in the previously-cited document. The output signal from the BASE-VCO 1 is input to a clock input terminal T of the counter 4, so that the counter 4 can count the number of oscillations of the BASE-VCO 1.

In other words, the input voltage Vin that is the analog signal is supplied to the BASE-VCO 1 as a voltage control signal for the BASE-VCO 1. The period Tbase of the BASE-VCO 1 is controlled by the input voltage Vin.

The higher the input voltage Vin, the faster the BASE-VCO 1 operates, and thus the period Tbase becomes smaller. When the period Tbase is smaller, the number of pulses in the pulse signal that is output from the BASE-VCO 1 per unit time becomes greater. On the other hand, the lower the input voltage Vin, the slower the BASE-VCO 1 operates, and thus the period Tbase becomes larger. When the period Tbase is larger, the number of pulses in the pulse signal that is output from the BASE-VCO 1 per unit time becomes less.

Accordingly, when the counter 4 counts the number of pulses in the pulse signal that is output from the BASE-VCO 1 during a predetermined duration (=1 sampling period), the number of counted values indicates the size of the input voltage Vin, which is an analog signal, and that count value itself corresponds to the converted value of the input voltage Vin, which is an analog signal, to a digital signal. By outputting this count value, A-D conversion utilizing V-F conversion is achieved. It should be noted that the resolution of the A-D converter can be found using the oscillation frequency of the BASE-VCO 1 and the sampling frequency, as AD resolution=$\log_2$ (oscillation frequency of the BASE-VCO 1/sampling frequency). Thus, when the oscillation frequency of the BASE-VCO 1 is 50 MHz and the sampling frequency is 44 kHz, the calculated resolution is 10 bits.

As already pointed out in the Description of the Background Art above, however, highly precise A-D conversion cannot be attained by merely counting the pulse signal of the BASE-VCO 1 when, for example, the number of pulses contained in the pulse signal is small in the first place because in such cases almost no change will be seen in the value counted by the counter 4.

More specifically, for example, assume that there are four pulses in the pulse signal that is output from the BASE-VCO 1 during one sampling period when the input voltage Vin is 4 V or higher but less than 5 V, and that there are three pulses in the pulse signal that is output from the BASE-VCO 1 during one sampling period when the input voltage Vin is 3V or more but less than 4V; in these cases, the number of counted pulses will be four regardless of whether the input voltage Vin is 4.2 V or 4.8 V, and the number of counted pulses will be three regardless of whether the input voltage Vin is 3.5 V or 3.9 V.

In other words, when A-D conversion is carried out by counting the numbers of pulses, the decimal parts of the numbers of the counted pulses cannot be distinguished; therefore, even though there is a small difference in analog voltage, for example, as in the cases of 4.2 V and 4.8 V, the digital signal value that is output after conversion results in "4" in both cases. Of course, if the conversion frequency of V-F conversion can be increased, that is, if the oscillation frequency of the BASE-VCO 1 can be increased (in the case of the above illustrative values, if the number of pulses can be increased to 40 to 49 pulses when the input voltage Vin is 4 V or more but less than 5 V), the precision with which A-D conversion is carried out can be enhanced (in the case of the above illustrative values, it is possible to distinguish between 42 and 48 pulses). However, as already mentioned above, the conversion frequency cannot be increased easily.

In the present invention, a JAW-VCO 2 is provided that has a period different from that of the BASE-VCO 1, and the phase difference between the outputs of these two VCOs is measured in order to find a V-F conversion value that is less than the period Tbase of the BASE-VCO 1. Enhancing the conversion precision in A-D conversion utilizing V-F conversion means that the decimal part of the count value, which cannot be counted from the number of pulses of the pulse signal that is output from the BASE-VCO 1, must be measured, and for this reason, the JAW-VCO 2 is employed in this application for the purpose of measuring the decimal part of the pulse number.

The input voltage Vin, which is an analog signal, also functions as a voltage control signal for the JAW-VCO 2. The period Tjaw of the JAW-VCO 2 is also controlled by the input voltage Vin. Here, when the ratio of the period Tbase to the period Tjaw is denoted as A:B (A≠B), the values of the periods Tbase and Tjaw are controlled by the input voltage Vin while the ratio A:B is maintained.

In the present invention, the high order bit of the digital signal to be output is calculated based on the number of pulses in the pulse signal that is output from the BASE-VCO 1 per one sampling period. Meanwhile, the low order bit of the digital signal is calculated based on the number of pulses in the pulse signal of the BASE-VCO 1 or the JAW-VCO 2 that are contained in a period from the point of activation of a sampling signal Ps that indicates the sampling period for the digital signal up to the time point at which the phase of the pulse signal of the BASE-VCO 1 and the phase of the pulse signal of the JAW-VCO 2 match each other.

When the periods Tbase and Tjaw are made different values, the phases of the oscillation outputs of the two VCOs BASE-VCO 1 and JAW-VCO 2 match at a constant interval. This interval is defined as M. The BASE-VCO 1 starts oscillation of its output pulse signal by free running. Meanwhile, the JAW-VCO 2 starts oscillation in conjunction with activation of the sampling signal Ps. That is, the JAW-VCO 2 starts oscillation at the same time that the sampling signal Ps is activated, and the time point at which the sampling signal Ps is activated is defined as the oscillation starting point of the JAW-VCO 2.

FIG. 2 is a timing chart showing an example of the pulse signal of the BASE-VCO 1 and the pulse signal of the JAW-VCO 2. FIG. 2 illustrates a case in which the activation time point of the sampling signal Ps (i.e., the oscillation starting point of the JAW-VCO 2) is simultaneous with the rise of a certain pulse of the BASE-VCO 1, and there are 8 pulses of the JAW-VCO 2 with respect to 9 pulses of the BASE-VCO 1. In this case, the ratio A:B of the period Tbase and the period Tjaw is 8:9.

Figure 3:
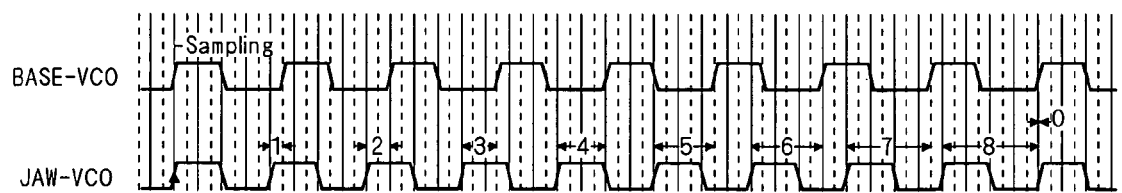
FIG. 3 is a timing chart showing another example of the pulse signal of BASE-VCO and the pulse signal of JAW-VCO.

FIG. 3 is a timing chart showing another example of the pulse signal of the BASE-VCO 1 and the pulse signal of the JAW-VCO 2. FIG. 3 similarly shows the case in which the activation time point of the sampling signal Ps (i.e., the oscillation starting point of the JAW-VCO 2) is simultaneous with the rise of a certain pulse of the BASE-VCO 1, but FIG. 3 shows a case in which there are 9 pulses of the JAW-VCO 2 with respect to 8 pulses of the BASE-VCO 1. In this case, the ratio A:B of the period Tbase and the period Tjaw is 9:8.

In the present invention, the period difference between the BASE-VCO 1 and the JAW-VCO 2 may be set so that the period Tjaw of the JAW-VCO 2 is larger, as in FIG. 2, or may be set so that the period Tbase of the BASE-VCO 1 is larger, as in FIG. 3. Nevertheless, setting the period Tjaw of the JAW-VCO 2 larger than the period Tbase of the BASE-VCO 1 allows the phase difference between the output of the two VCOs to be detected more easily. Thus, the following description is made taking as an example the case in which there are 8 pulses of the JAW-VCO 2 with respect to 9 pulses of the BASE-VCO 1, as shown in FIG. 2.

Figure 4:
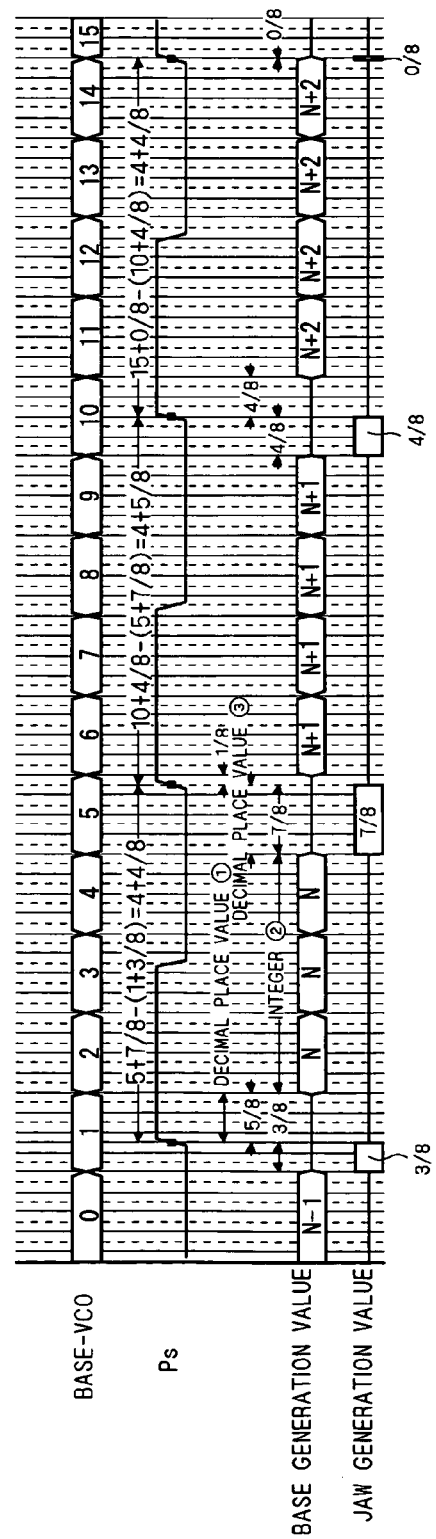
FIG. 4 is a timing chart for illustrating the principle with which a V-F conversion value having a period of less than the period Tbase can be obtained by using BASE-VCO and JAW-VCO.

FIG. 4 is a timing chart for illustrating the principle of finding a V-F conversion value that is less than the period Tbase by using the BASE-VCO 1 and the JAW-VCO 2.

The digital value that is to be generated by the A-D converter utilizing V-F conversion has a total pulse number that contains an integer and a decimal place number of the number of pulses from the BASE-VCO 1 in one sampling period of the sampling signal Ps. Looking at FIG. 4, it can be understood that the first sampling period of the sampling signal Ps includes three units, these being a decimal place value (①) from the activation time point of the sampling signal Ps (that is, its start within the sampling period) up to the first pulse generation by the BASE-VCO 1 in the sampling period (the rising edge of the second pulse of the BASE-VCO 1), the number of pulses (positive value, ②) of the BASE-VCO 1 from the first pulse generation by the BASE-VCO 1 in the sampling period (the rising edge of the second pulse of the BASE-VCO 1) up to the start of the next sampling period, and a decimal place value (③) from the last pulse generation by the BASE-VCO 1 in the sampling period (the rising edge of the fifth pulse of the BASE-VCO 1) up to the start of the next sampling period.

In FIG. 4, the section corresponding to ②, that is, the positive number, can be found in the same way as in the prior art by calculating the number of pulses of the BASE-VCO 1. On the other hand, in the present invention it is also possible to count the sections corresponding to ① and ③ which are decimal place values, and this was not possible with the prior art.

When the period difference between the period Tbase and the period Tjaw is represented as Tdiff, the section corresponding to ① in FIG. 4 is, for example, a period that is Tdiff×5. Similarly, the section corresponding to ③ is, for example, a period that is Tdiff×7. It should be noted that as shown in FIG. 2, the period difference Tdiff satisfies the relationships Tbase=A×Tdiff=8×Tdiff, and Tjaw=B× Tdiff=9×Tdiff. Thus, the section corresponding to ① in FIG. 4 is a period that is ⅝ of the period Tbase. Similarly, the section corresponding to ③ in FIG. 4 is the period of Tdiff×7, or in other words, a period that is ⅞ of the period Tbase.

Adding all the sections corresponding to ① to ③ in FIG. 4 yields a total pulse number that includes an integer and a decimal place value of the number of pulses from the BASE-VCO 1 in a single sampling period. That is, this value is a more accurate A-D conversion value. In the initial sampling period in FIG. 4, the section corresponding to ① is ⅝, the section corresponding to ② is 3, and the section corresponding to ③ is ⅞, and thus the sum of the ① to ③ is the positive number 4 and the fraction ⁴⁄₈. Similarly, in the second sampling period in FIG. 4, the section corresponding to ① is ⅛, the section corresponding to ② is 4, and the section corresponding to ③ is ⅘, and thus the sum of the ① to ③ is the positive number 4 and the fraction ⅝. In the third sampling period in FIG. 4, the section corresponding to ① is ⅘, the section corresponding to ② is 4, and the section corresponding to ③ is ⁰⁄₈, and thus the sum of the ① to ③ is the positive number 4 and the fraction ⁴⁄₈.

Here, as shown in the initial sampling period, even though the sections corresponding to ① and ③ are decimal place values, the sum of the two may lead to an increase in the integer value. In this case, the number of pulses should not be determined using only the section corresponding to ②. Therefore, a counting method that includes this increase in integer value is necessary. The following is a description of such a method.

First, in the N-th sampling, the section corresponding to ① can be calculated as (1−[value of ③]) using the value of ③ in the (N−1)-th sampling. For example, in the initial sampling period in FIG. 4, the section corresponding to ① can be calculated as 1−⅜=⅝, in the second sampling period it can be calculated as 1−⅞=⅛, and in the third sampling period it can be calculated as 1−⅘=⅘.

Then, in the N-th sampling, the sum of ① to ③ can be calculated from the difference between the value that is obtained by adding the decimal place value of the section corresponding to the N-th ③ to the count value of the (N+1)-th sampling of the BASE-VCO 1, and the value that is obtained by adding the decimal place value of the section corresponding to the (N−1)-th ③ to the count value of the N-th sampling of the BASE-VCO 1.

For example, in the initial sampling period in FIG. 4, the total value can be calculated as (5+⅞)−(1+⅜)=4+⁴⁄₈ by subtracting the sum of the count value "1" of the BASE-VCO 1 at the start of the initial sampling and the fraction "⅜" of the section corresponding to ③ in the one sampling period prior (here, this does not exist since this would be before the initial sampling) from the sum of the count value "5" of the BASE-VCO 1 at the start of the second sampling and the fraction "⅞" of the section corresponding to ③ in the initial sampling period.

Similarly, in the second sampling period in FIG. 4, the total value can be calculated as (10+⅘)−(5+⅞)=4+⅝ by subtracting the sum of the count value "5" of the BASE-VCO 1 at the start of the second sampling and the fraction "⅞" of the section corresponding to ③ in the sampling period one before, from the sum of the count value "10" of the BASE-VCO 1 at the start of the third sampling and the fraction "⅘" of the section corresponding to ③ in the second sampling period, and in the third sampling period, the total value can be calculated as (15+⁰⁄₈)−(10+⅘)=4+⅘, by subtracting the sum of the count value "10" of the BASE-VCO 1 at the start of the third sampling and the fraction "⅘" of the section corresponding to ③ in the sampling period one before, from the sum of the count value "15" of the BASE-VCO 1 at the start of the fourth sampling and the fraction "⁰⁄₈" of the section corresponding to ③ in the third sampling period.

In other words, for each sampling period, the pair of the count value of the BASE-VCO 1 and the decimal place value of the section corresponding to ③ are generated, and by subtracting the value of the N-th pair from the value of the (N+1)-th pair, it is possible to generate a digital value that has been A-D converted with high precision. Calculating the difference in this fashion also has the effect of reducing conversion error in the A-D converter with regard to converting the input voltage to a digital value. The reason is that since the error of the (N+1)-th pair and the error of the N-th pair is the same amount, the error is eliminated by subtraction.

Next, the method for calculating the value of ③ in FIG. 4 is discussed. The section corresponding to ③, which is a decimal value number, in FIG. 4 can be obtained by measuring the phase difference between the time point at which the BASE-VCO 1 is activated immediately prior to the start of sampling and the time point at which sampling is started.

For example, the time point at which the initial activation of the sampling signal Ps in FIG. 4 occurs exists during the "first" pulse of the BASE-VCO 1. That is, the activation time point of the BASE-VCO 1 immediately prior to the initial activation of the sampling signal Ps is the oscillation time point of the "first" pulse, and the initial activation time point of the sampling signal Ps is at a position that is delayed with respect to the oscillation time point of the "first" pulse of the BASE-VCO 1 by a duration that is ⅜ of the period Tbase. This value ⅜ is complementary to the value ⅝ of the period corresponding to ①.

The JAW-VCO 2 starts oscillation simultaneous with activation of the sampling signal Ps, and thus the JAW-VCO 2 also oscillates at the initial activation time point of the sampling signal Ps. Referring to FIG. 2, the rise of the JAW-VCO 2 located at a position that is delayed with respect to the rise of the BASE-VCO 1 by a duration that is ⅜ of the period Tbase is the pulse P3, which is denoted by the shift amount "3."

In FIG. 2, if the rise of the pulse P3, which is denoted by the shift amount "3", is regarded as the time point at which oscillation of the JAW-VCO 2 starts, the number of pulses contained from pulse P3 to the time point at which the phases of the pulse signals of the VCOs match each other (the time point denoted by the shift amount "8" or "0") is 5 for both the BASE-VCO 1 and the JAW-VCO 2. This value corresponds to the numerator part "5" of ⅝, which is the duration of ① in the initial sampling period. This value of ⅝ is complementary to ⅜, which is the duration of ③ in the sampling period one before (although here it does not exist because that would be before the initial sampling).

That is, it is possible to calculate, by measurement, a decimal value number that is less than the period Tbase to serve as the duration of ① in the (N+1)-th sampling and the duration of ③ in the N-th sampling based on the number of pulses of the pulse signal of the BASE-VCO 1 or the JAW-VCO 2 that are included in the period from the activation time point of the sampling signal Ps up to the time point at which the phases of the pulse signals of the BASE-VCO 1 and the JAW-VCO 2 match each other.

To find the section corresponding to ③ in the initial sampling period in FIG. 4, the number of pulses of the pulse signal of the BASE-VCO 1 or the JAW-VCO 2 that are included in the period from the activation time point of the subsequent second sampling signal Ps up to the time point at which the phases of the pulse signals of the BASE-VCO 1 and the JAW-VCO 2 match each other can be calculated and the section corresponding to ①, which is a decimal value number in the second sampling signal Ps, can be found in the same way as that mentioned above, and that value subtracted from 1.

The second activation time point of the sampling signal Ps in FIG. 4 occurs during the "fifth" pulse of the BASE-VCO 1. That is, the second activation time point of the sampling signal Ps is in a position that is delayed with respect to the time point of oscillation of the "fifth" pulse of the BASE-VCO 1 by a duration of ⅞ the period Tbase. This value of ⅞ is complementary to the value ⅛, which is the amount of the decimal point value located at the beginning of the second sampling period.

Since the JAW-VCO 2 starts oscillation at the same time that the sampling signal Ps is activated, the JAW-VCO 2 also oscillates at the second activation time point of the sampling signal Ps. Referring to FIG. 2, the pulse P7, which is denoted by the shift amount "7", is where the rise of the JAW-VCO 2 is located delayed with respect to the rise of the BASE-VCO 1 by a time period of ⅞ the period Tbase.

In FIG. 2, for both the BASE-VCO 1 and the JAW-VCO 2, the number of pulses included in the period from the pulse P7, which is denoted by the shift amount "7", to the time point at which the phases of the pulse signals of the two VCOs match each other (the time point denoted by the shift amount "8" or "0") is 1. This value corresponds to the numerator part of ⅛, which the duration of the ① in the second sampling period. This value ⅛ is complementary to ⅞, which is the value of the period corresponding to ③ in the sampling period one before (initial sampling period).

That is, by counting the number of pulses of the pulse signals of the BASE-VCO 1 and the JAW-VCO 2 that are included in the period from the activation of the sampling signal Ps until the phases of the pulse signals of the BASE-VCO 1 and the JAW-VCO 2 match each other, it is possible to measure a decimal value part that is less than the period Tbase (the duration of ① in the (N+1)-th sampling and the duration of ③ in the N-th sampling) based on that pulse number.

The following is a general description of the above matters. Because Tbase:Tjaw=A:B, Tjaw/Tbase=B/A, and thus Tjaw·A=Tbase·B=M, and the phases of the two VCOs match each other every B periods of the period Tbase of the output pulse signal of the BASE-VCO 1 with respect to A periods of the period Tjaw of the output pulse signal of the JAW-VCO 2.

Consider a case in which the start of oscillation of the output pulse signal of the JAW-VCO 2 is delayed with respect to the start of oscillation of the output pulse signal of the BASE-VCO 1 immediately prior by Tdiff·X. In conjunction with this delay, when the output pulse signal of the JAW-VCO 2 has oscillated X times, referring to FIG. 2, the expression Tjaw·(A−X)+Tdiff·X=Tjaw·A−(Tjaw−Tdiff)·X=Tjaw·A−Tbase·X=Tbase·(B−X) is possible. Thus, the counted value of pulse signals up to when the phases of the VCOs match each other is B−X when calculated using the output pulse signal of the BASE-VCO 1 and is A−X when calculated using the output pulse signal of the JAW-VCO 2.

It should be noted that from Tbase=Tdiff·A, the maximum value Xmax of X is A−1. This is because when X=A it is not possible to distinguish from when X=0. The larger the maximum value Xmax, the higher the resolution of A-D conversion. Example values for Tbase and Tjaw, etc. may be Tbase=32 nsec, Tdiff=2 nsec, and Tjaw=34 nsec, or Tbase=16 nsec, Tdiff=2 nsec, and Tjaw=18 nsec. In the former case A:B=16:17, while in the latter case A:B=8:9.

Next, the operation of the A-D converter of FIG. 1 is described referring to FIG. 5. FIG. 5 is a timing chart showing the operation of the A-D converter according to the present preferred embodiment. First, the output pulse signal of the BASE-VCO 1 oscillates by free running and the counter 4 counts the number of oscillations. In FIG. 5, the count value of the counter 4 is shown changing from "8" to "23."

The sampling signal Ps is input to the JAW-VCO 2. The JAW-VCO 2 then starts oscillation in conjunction with the activation of the sampling signal Ps. It should be noted that here, as in the case of FIG. 2, the ratio A:B of the period Tbase of the oscillating output of the BASE-VCO 1 and the period Tjaw of the oscillating output of the JAW-VCO 2 is 8:9.

For each sampling period of the sampling signal Ps, the counter 4 and the first register 5, which constitute the high-order calculating unit, calculate the number of pulses of the output pulse signal of the BASE-VCO 1 from the start of oscillation by the BASE-VCO 1 of its output pulse signal until the activation time point of the current sampling signal Ps as the high order (denoted as "high order bit" in FIG. 1). Specifically, the output of the counter 4 is supplied to the data input terminal D of the first register 5, the sampling signal Ps is supplied to the clock input terminal T of the first register 5, and in conjunction with activation of the sampling signal Ps, the first register 5 holds the output value of the counter 4 at the activation time point of the sampling signal Ps.

In FIG. 5, the sampling signal Ps is activated when the count value of the counter 4 is "10", and thus the information "10" is held in the first register 5. That is, the first register 5 holds the pulse number of the counter 4 at the time point that the sampling signal Ps is activated each sampling period, and outputs it as the high order.

On the other hand, for each sampling period, the third register 10 and the second and third subtracters 11 and 12, which constitute the low-order calculating unit, calculate the phase difference (that is, the section corresponding to ③ in FIG. 4) from the final pulse within the sampling period of the output pulse signal of the BASE-VCO 1 until the end of the sampling period, based on the number of pulses of the output pulse signal of the BASE-VCO 1 in the period from the time point that the current sampling signal Ps is activated until the time point at which the phases of the output pulse signals of the BASE-VCO 1 and the JAW-VCO 2 match, as the low order (shown as "low order bit" in FIG. 1).

The phase difference determining circuit 3 is a circuit that detects a match between the phases of the rises in the output pulse signals of the BASE-VCO 1 and the JAW-VCO 2, and activates its output at the time of this detection. The phase difference determining circuit 3 is constituted by an ordinary S-R (Set-Reset) flip-flop circuit. The operation control circuit 9 activates its output S1 in conjunction with activation of the sampling signal Ps, and deactivates its output S1 in conjunction with detection by the phase difference determining circuit 3 of a match in the phases of the output pulse signals of the BASE-VCO 1 and the JAW-VCO 2. The operation control circuit 9 is constituted by an ordinary S-R flip-flop circuit as well.

The output of the counter 4 is received by the data input terminal D of the third register 10, and the output pulse signal of the BASE-VCO 1 is received by the clock input terminal T of the third register 10. Further, the output S1 from the operation control circuit 9 is given to the enable input terminal enabl of the third register 10.

The third register 10 becomes capable of operation in a one-shot manner when the signal to its enable input terminal enabl switches from Hi to Low, and in conjunction with the oscillation of the output pulse signal of the BASE-VCO 1, the third register 10 holds the output value of the counter 4 at the rising edge of the output pulse signal of the BASE-VCO 1.

FIG. 5 shows various cases (X=0 to 7) in which the start of oscillation of the output pulse signal of the JAW-VCO 2 is delayed by Tdiff·X with respect to the start of oscillation of the output pulse signal of the BASE-VCO 1 immediately prior, as Delay 0 to Delay 7.

When X=4, the phases of the rise in the output pulse signals of the BASE-VCO 1 and the JAW-VCO 2 match when the count value of the counter 4 is "15." Thus, the output pulse signal of the BASE-VCO 1 at this time is rising and the signal S1 at the enable input terminal enabl has switched from Hi to Low, and thus the third register 10 holds the pulse number "15" output by the counter 4.

The second subtracter 11, which is one of the other components making up the low-order calculating unit, subtracts the count value "10" that is held by the first register 5 from the count value "15" that is held by the third register 10. Thus, in this case the output value of the second subtracter 11 becomes 15−10="5." It should be noted that the output value of the second subtracter 11 fluctuates depending on the case (Delay 0 to Delay 7), and for example in the case of Delay 0, the value held in the third register 10 is "19" and thus the value of the second subtracter 11 becomes 19−10="9", and in the case of Delay 7, the value held in the third register 10 is "12" and thus the value of the second subtracter 11 becomes 12−10="2."

The third subtracter 12, which is one of the other components making up the low-order calculating unit, subtracts a value "5" that has been calculated by the second subtracter 11 from the predetermined value "9" (this value "9" is the "9" from the ratio A:B of 8:9). Thus, in the case of X=4, the output value of the third subtracter 12 becomes 9−5="4." The output value of the third subtracter 12 is the phase difference (that is, the section corresponding to ③ in FIG. 4) from the final pulse in the sampling period of the output pulse signal of the BASE-VCO 1 to the end point of that sampling cycle, that is, it becomes the low order.

It should be noted that the output value of the third subtracter 12 fluctuates depending on the case (Delay 0 to Delay 7), and for example in the case of Delay 0, the value of the second subtracter 11 is "9" and thus the value of the third subtracter 12 becomes 9−9="0", and in the case of Delay 7, the value of the second subtracter 11 is "2" and thus the value of the third subtracter 12 becomes 9−2="7."

The high- and low-order combining unit 6 generates a combined value by synthesizing the information of the high order that is output from the first register 5 and the information of the low order that is output from the third subtracter 12. Specifically, the high- and low-order combining unit 6 is made of a shift register, for example, that holds the information of the low order on its low order bit side and holds the information of the high order on its high order bit side. The low order bit side corresponds to the decimal number value of the section corresponding to ③ in FIG. 4, and the high order bit side corresponds to the count value of the BASE-VCO 1 at the activation time point of the sampling signal Ps in FIG. 4.

In the case where X=4 in FIG. 5, the high order is "10" and the low order is "4", and thus the combined value in the high- and low-order combining unit 6 is "10+4/8." This combined value is held in the second register 7 at the time of activation of the sampling signal Ps.

The output of the high- and low-order combining unit 6 is supplied to the data input terminal D of the second register 7, and the sampling signal Ps is supplied to the clock input terminal T of the second register 7, and in conjunction with activation of the sampling signal Ps, the second register 7 holds the combined value "10+4/8" at the time of the N-th sampling. It should be noted that before holding the combined value "10+4/8", the second register 7 holds the information "5+7/8" as the combined value at the time of the (N−1)-th sampling. These values correspond to the numerical values in the second sampling period in FIG. 4.

Then, the first subtracter 8 outputs the difference "4+5/8" between a value "5+7/8" held in the second register 7 in the sampling period one before the current sampling period (the (N−1)-th sampling period) and the current combined value "10+4/8" as a digital value that is constituted by a high order bit and a low order bit.

In the present invention, with the ratio of A:B maintained, the values of the period Tbase of the BASE-VCO 1 and the period Tjaw of the JAW-VCO 2 are controlled by the input voltage Vin. If the sensitivity of the two VCOs to the analog input voltage Vin is linear, the sensitivity of the two VCOs to the period difference Tdiff is also linear. This period difference Tdiff corresponds to the minimum resolution of the low order bit. Even though the width of the period Tbase changes in correspondence with the analog input voltage Vin, the width of the period difference Tdiff also changes with the same sensitivity, and thus the value Tbase/Tdiff is constant regardless of the value of the analog input voltage Vin and the resolution of the low order bit is constant regardless of the analog input voltage Vin.

Figure 6:
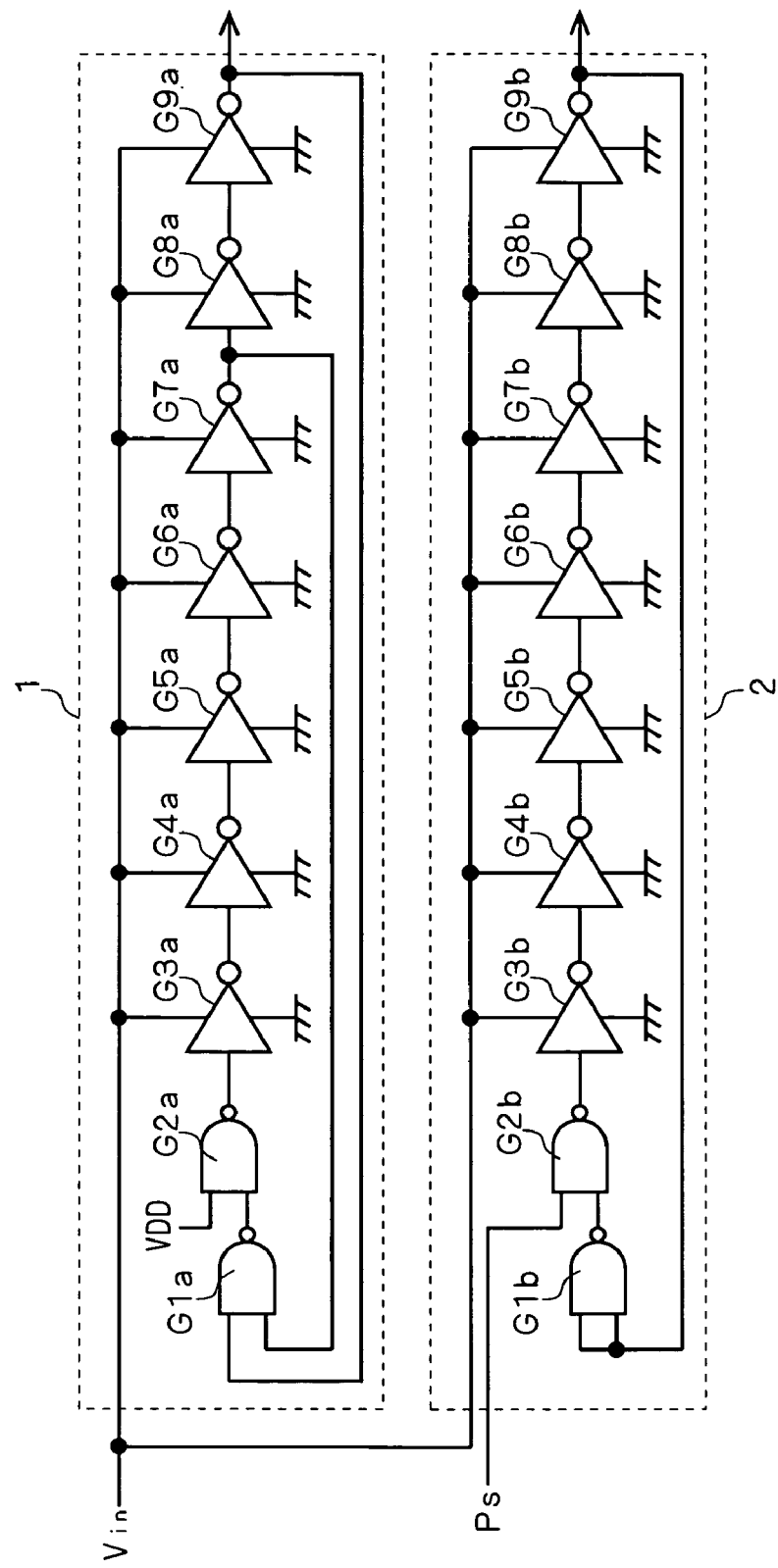
FIG. 6 is a circuit diagram showing the detailed configurations of the BASE-VCO and the JAW-VCO.

FIG. 6 is a circuit diagram that shows the configuration of the BASE-VCO 1 and the JAW-VCO 2 in detail. As shown in FIG. 6, the BASE-VCO 1 is furnished with dual input NAND circuits G1*a* and G2*a* and inverters G3*a* to G9*a*. The dual input NAND circuits G1*a* and G2*a* and the inverters G3*a* to G9*a* function as a plurality of inverting circuits in an odd number of stages that are connected in series in a ring shape.

The JAW-VCO 2 is also provided with dual input NAND circuits G1*b* and G2*b* and inverters G3*b* to G9*b*. The dual input NAND circuits G1*b* and G2*b* and the inverters G3*b* to G9*b* as well function as a plurality of inverting circuits in an odd number of stages that are connected in series in a ring shape.

The number of inverting circuits that the BASE-VCO 1 is furnished with is the same as the number of inverting circuits that the JAW-VCO 2 is furnished with. All of the inverters G3a to G9a and G3b to G9b receive the input voltage Vin, which functions as a voltage control signal. The input voltage Vin is supplied to one terminal of the CMOS circuits (not shown in detail) making up the inverters G3a to G9a and G3b to G9b as the power supply voltage. It should be noted that the other terminals of the CMOS circuits making up the inverters G3a to G9a and G3b to G9b are connected to the ground.

The dual input terminal of the dual input NAND circuit G1b, which functions as the initial inverting circuit in the JAW-VCO 2, also receives the output of the inverter G9b, which functions as the final inverting circuit. The dual input NAND circuit G2b, which functions as the second-stage inverting circuit in the JAW-VCO 2, receives the output of the dual input NAND circuit G1b at one input terminal, and receives the sampling signal Ps at its other input terminal. When the sampling signal Ps becomes activated, the JAW-VCO 2 starts oscillation. The output of the dual input NAND circuit G2b is supplied to the input terminal of the inverter G3b, which functions as the third stage of inverting circuit in the JAW-VCO 2, and in the same fashion with the subsequent inverters G4b to G9b of the other stages as well, the output of the previous stage is supplied to the input terminal of the next stage. The output of the final stage inverter G9b is supplied to the phase determining circuit 3 and functions as the output pulse signal of the JAW-VCO 2.

On the other hand, while the output of the inverter G9a, which functions as the final stage inverting circuit, is supplied to one input terminal of the dual input NAND circuit G1a, which functions as the initial inverting circuit in the BASE-VCO 1, the output of the inverting circuit an even number of stages from the final inverting circuit, and more specifically the inverter G7a, for example, is supplied to its other input terminal. The dual input NAND circuit G2a, which functions as the second inverting circuit in the BASE-VCO 1, receives the output of the dual input NAND circuit G1a at one input terminal and receives a power supply voltage VDD at its other input terminal. The power supply voltage VDD is constantly supplied, so that in effect the dual input NAND circuit G2a functions as an inverter. The output of the dual input NAND circuit G2a is supplied to the input terminal of the inverter G3a, which functions as the third inverting circuit in the BASE-VCO 1, and in the same manner with the subsequent inverters G4a to G9a as well, the output of the previous stage is supplied to the input terminal of the next stage. The output of the final stage inverter G9a is output to the phase determining circuit 3, the counter 4, and the third register 10, and functions as the output pulse signal of the BASE-VCO 1.

It should be noted that the BASE-VCO 1 and the JAW-VCO 2 are made of the same number and type of elements—dual input NAND circuits and inverters—so that the gate delay characteristics of the two VCOs match.

Figure 7:
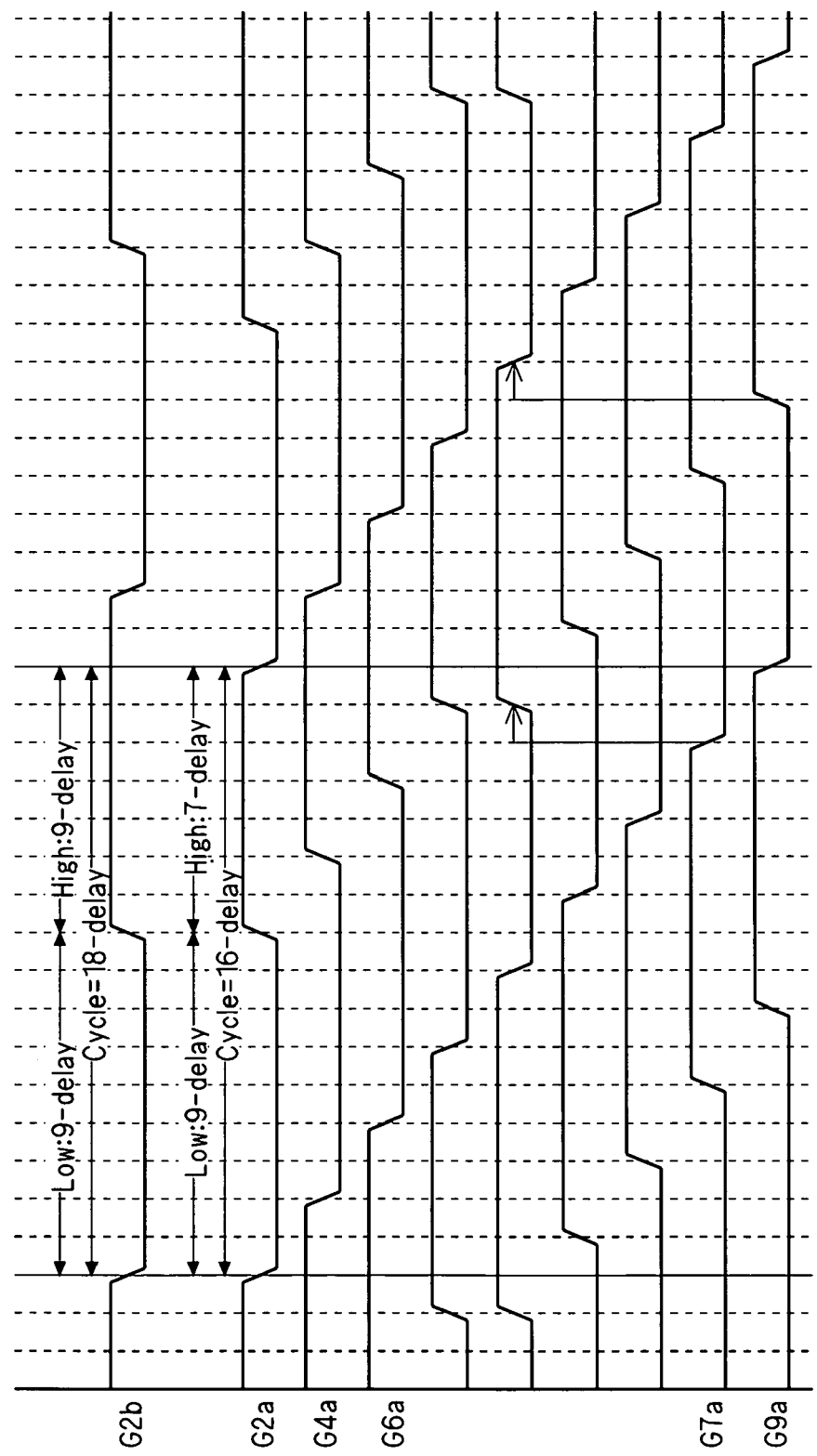
FIG. 7 is a timing chart showing an operation of the BASE-VCO and the JAW-VCO.

FIG. 7 is a timing chart showing the operation of the BASE-VCO 1 and the JAW-VCO 2. In the drawing, G1a to G9a denote the pulse signals that are output by the various stages in the BASE-VCO 1. Similarly, in the drawing, G2b denotes the pulse signal that is output by the dual input NAND circuit G2b in the JAW-VCO 2.

Taking the pulse signals G2a and G2b shown at the top of FIG. 7 as examples, the Low period and the High period of the pulse signal G2b, which is the output of the JAW-VCO 2, both are periods corresponding to a delay corresponding to nine stages, which is the number of stages of inverting circuits in the JAW-VCO 2. On the other hand, in the pulse signal G2a, which is an output of the BASE-VCO 1, the low period is a period that corresponds to a delay corresponding to nine stages, which is the number of stages of inverting circuits in the BASE-VCO 1, however its high period is a period that corresponds to a delay of seven stages, which is two stages less than the nine stages of inverting circuits with which the BASE-VCO 1 is provided. Thus, the ratio of the period of the pulse signal G2a to the period of the pulse signal G2b is 16:18=8:9.

This matter will be described using the pulse signal G1a. The pulse signal G1a is activated and deactivated after a delay of two stages from the pulse signal G8a of the inverter G8a of the eighth stage. FIG. 7 shows a shift from Hi to Low as an example of this pulse transition of the pulse signal G1a.

This transition is sequentially transmitted to the circuit of the next stage. The transition is then transmitted to the inverter G7a, and when the pulse signal G7a moves from Hi to Low, the output of the inverter G7a is being supplied to one input terminal of the dual input NAND circuit G1a, and thus the pulse signal G1a changes from Low to Hi.

Thereafter, the transition of the pulse signal G1a is transmitted in sequence from one circuit to the subsequent circuits and arrives at the inverter G9a. At that time, the pulse signal G1a changes from Hi to Low in conjunction with the change in the pulse signal G9a from Low to Hi. The same signal transition occurs thereafter in the other stages as well.

As shown in the timing chart of FIG. 7, by doing this it is possible for the output pulse signal of the JAW-VCO 2 to have a period that corresponds to a delay of nine stages while the output pulse signal of the BASE-VCO 1 has a period that corresponds to a delay of eight stages. That is, the ratio A:B of the period Tbase of the oscillating output of the BASE-VCO 1 and the period Tjaw of the oscillating output of the JAW-VCO 2 can be set to 8:9.

It should be noted that for example as shown in FIG. 3, in a case where the ratio A:B of the period Tbase and the period Tjaw is to be set to 9:8, the circuit structure of the BASE-VCO 1 and the circuit structure of the JAW-VCO 2 in FIG. 6 can be switched, or if the ratio A:B is to be set to a ratio other than 8:9 (such as to 6:9 or 4:9), a larger number of even stage values can be taken when obtaining the output of the inverting circuit of the even-numbered stage before the final stage. On the other hand, if the ratio A:B is to be set to an odd ratio such as 7:9, instead of supplying the pulse signal of the last stage it is possible to simply supply the pulse signal of an odd-numbered stage (such as G7a) of the BASE-VCO 1 to both input terminals of the dual input NAND circuit G1a of the initial stage. Further, it is also possible to adopt dual input NOR circuits in place of the dual input NAND circuits G1a and G1b. Alternatively, it is also possible to employ inverters in place of the dual input NAND circuits G1a and G1b and have the inverters G7a and G9a function as open collectors or open drains and combine the outputs of the inverters G7a and G9a and supply them to the input of the inverter that has been adopted in place of the dual input NAND circuit G1a, that is, it is also possible to adopt the structure of a so-called wired OR.

That is, as discussed above, when the output of the inverting circuit G9a in the last stage is supplied to one input terminal of the dual input NAND circuit G1a or the dual input NOR circuit that has been adopted in its place, and the output of an inverting circuit that is an even number of stages from the last stage (such as G7a) is supplied to the other input terminal of the dual input NAND circuit G1a or the dual input NOR circuit that has been adopted in its place, the output pulse signal of the BASE-VCO 1 oscillates at the same period as a VCO that includes an even number of inverting circuit stages (8 stages) that is less than the output pulse signal of the JAW-VCO 2 by a predetermined number of stages (such as one stage). Thus, a ring oscillation can be reliably generated when there are an odd number of stages of inverting circuits in the BASE-VCO 1 (if it is made up of an even number of stages, the transmission of Hi and Low in the delay stage will freeze) while the difference between the period Tbase of the BASE-VCO 1 and the period Tjaw of the JAW-VCO 2 can be set as the target value by selecting the inverting circuit whose output is supplied to the other input terminal of the dual input NAND circuit G1a or the dual input NOR circuit that has been adopted in its place toward the final stage. The difference between the period Tbase and the period Tjaw corresponds to the minimum resolution of the low order bit of the digital signal, and thus A-D conversion can be performed with high precision.

It should be noted that the above method is not the only possible method for configuring the BASE-VCO 1 and the JAW-VCO 2. In addition to the above method, it is also possible to adopt a method in which the BASE-VCO 1 and the JAW-VCO 2 are constituted by the same number of inverters connected in a ring shape, except that the area ratio of the CMOS transistors making up the inverters is 8:9 between the two VCOs.

According to the invention of the present preferred embodiment, the digital value calculating unit (the phase difference determining circuit 3, the high-order calculating unit (the counter 4 and the first register 5), the high- and low-order combining unit 6, the second register 7, the first subtracter 8, the operation control circuit 9, and the lower order calculating unit (the third register 10 and the second and third subtracters 11 and 12)) calculates the high order bit of the digital signal based on the number of pulses of the output pulse signal of the BASE-VCO 1 that are included in a sampling period, and calculate the low order bit of the digital signal based on the number of pulses of the output pulse signal of the BASE-VCO 1 that are included from the activation time point of the sampling signal to the point at which the phases of the output pulse signals of the BASE-VCO 1 and the JAW-VCO 2 match each other. Because the period Tbase and the period Tjaw are different, the number of pulses of the output pulse signal of the BASE-VCO 1 that are contained from the activation time point of the sampling signal Ps to the point at which the phases of the output pulse signals of the two VCOs match each other becomes a V-F conversion value that is less than the period Tbase, and thus an A-D converter utilizing V-F conversion with which A-D conversion can be performed with high precision is obtained.

The digital value calculating unit is furnished with the high-order calculating unit (counter 4 and first register 5), the low-order calculating unit (third register 10 and second and third subtracters 11 and 12), the high- and low-order combining unit 6, the second register 7, and the first subtracter 8, and outputs as the digital signal the difference between the current combined value and the value held in the second register 7 in the sampling period one before the current one. Thus, the configuration of the invention according to the present preferred embodiment can be achieved with a simple circuit configuration.

Further, the high-order calculating unit is furnished with the counter 4 and the first register 5, and the low-order calculating unit is furnished with the third register 10, and each sampling period the low-order calculating unit calculates the phase difference based on the difference between the pulse number held in the third register 10 and the pulse number held in the first register 5. Thus, the invention according to the present preferred embodiment can be configured with a simple circuit configuration.

It should be noted that if the maximum value of the low order bit (low order digit) that has been calculated is a value that is obtained by subtracting 1 from a power of 2, such as "0" to "7" above, the low order bit can be output without being converted to a base other than binary, and this allows the circuit configuration to be simple. If the maximum value of the low order bit is not a value that has been obtained by subtracting 1 from a square value, it is necessary to convert it to a base other than binary, and in that case a computing circuit for $\log_2$ ((output bit number)/A) becomes necessary.

Second Preferred Embodiment

The present preferred embodiment discusses a variation of the A-D converter according to the first preferred embodiment, in which the low-order calculating unit in the first preferred embodiment is made of a single down counter, in place of the third register 10 and the second and third subtracters 11 and 12.

Figure 8:
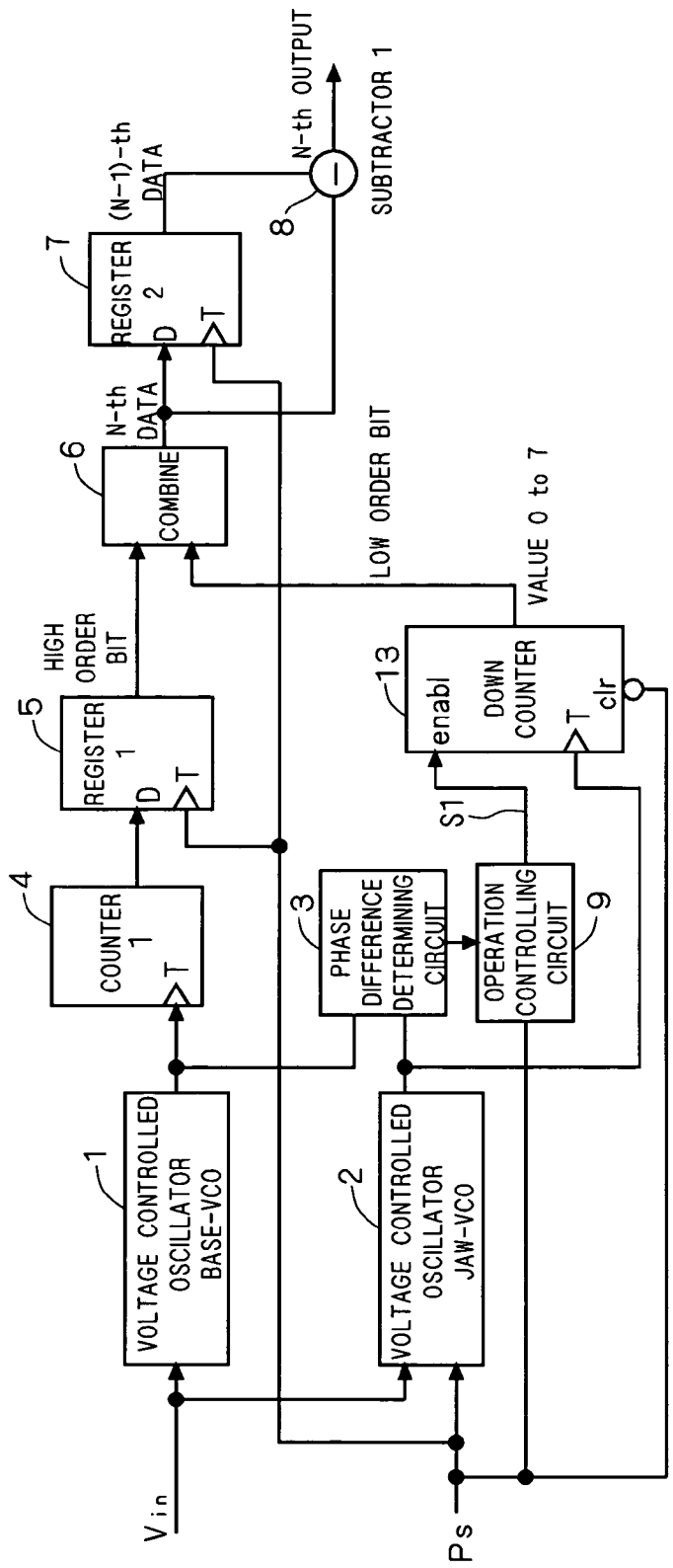
FIG. 8 is a circuit diagram showing an A-D converter according to a second preferred embodiment.

FIG. 8 shows an A-D converter according to the present preferred embodiment. As shown in FIG. 8, the present preferred embodiment adopts a down counter 13, in place of the third register 10 and the second and third subtracters 11 and 12. It should be noted that in FIG. 8 device configuration is the same as that of FIG. 1 except that the low-order calculating unit is made of the down counter 13.

The down counter 13 carries out counting corresponding to oscillation of the JAW-VCO 2's output pulse signal from the activation time point of the sampling signal Ps until a time point at which the phases of the output pulse signals of the BASE-VCO 1 and the JAW-VCO 2 match each other. More specifically, the JAW-VCO 2's output pulse signal is supplied to a clock input terminal T of the down counter 13, and the output S1 from the operation control circuit 9 is supplied to its enable input terminal enabl. In addition, the sampling signal Ps is supplied to its reset input terminal clr.

The down counter 13 becomes capable of counting when the signal at its enable input terminal enabl switches from Low to Hi, performs counting such that the value is reduced in conjunction with oscillation of the JAW-VCO 2's output pulse signal at the clock input terminal T, and stops the counting when the signal to the enable input terminal enabl switches from Hi to Low.

Figure 9:
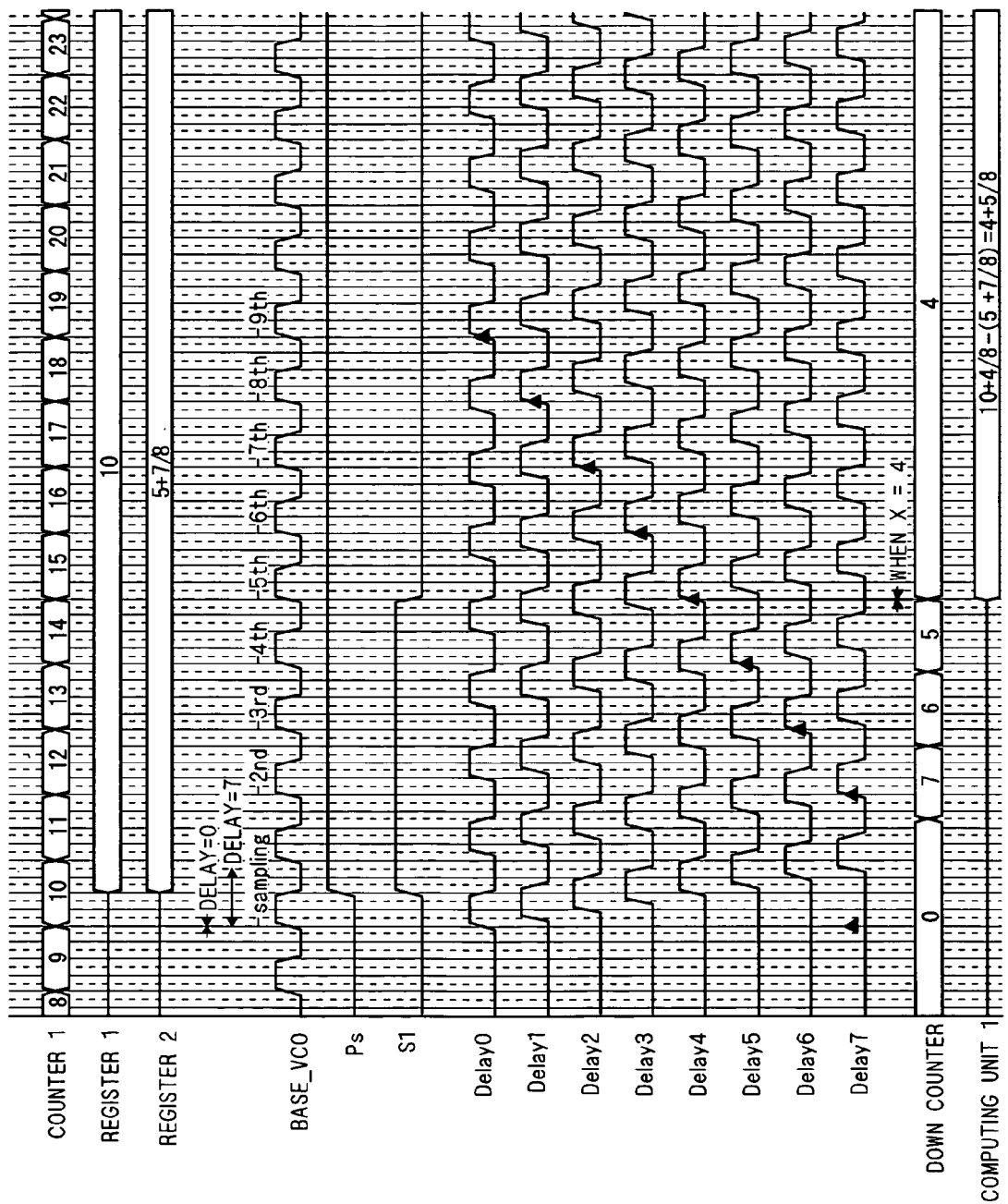
FIG. 9 is a timing chart showing an operation of the A-D converter according to the second preferred embodiment.

FIG. 9 is a timing chart showing the operation of the A-D converter according to the present preferred embodiment. This timing chart also shows the count value of the counter 4 changing from "8" to "23", as the timing chart shown in FIG. 5, and it shows the case in which the first subtracter 8 outputs the difference "4+⅝" between the current combined value "10+⅘" and a value "5+⅞" held in the second register 7 in the sampling period one before the current sampling period (the (N−1)-th sampling period) as a digital signal that is constituted by a high order bit and a low order bit.

The down counter 13 sets the its initial count value to "7" in response to the first one of oscillation (pulse rising edge) of the output pulse signal from the JAW-VCO 2 after the output S1 from the operation control circuit 9 switches from Low to Hi, and thereafter reduces the count value "1" by "1" sequentially in conjunction with oscillation of the JAW-VCO 2's output pulse signal.

Now, assuming that X=4, the first oscillation of the JAW-VCO 2's output pulse signal appears when the count value of the counter 4 is "11", and then, the down counter 13 sets its count value to "7". Thereafter, when the count value of the counter 4 is "15", the phases of the rises of the output pulse signals of the BASE-VCO 1 and the JAW-VCO 2 match each other. Consequently, the signal S1 at the enable input terminal enabl switches from Hi to Low at this time, the down counter 13 stops its counting. In this case, the count value of the down counter 13 stops at "4".

The value at the down counter 13 when the counting had stopped is the phase difference from the last pulse in the sampling period for the BASE-VCO 1's output pulse signal up to the end point of the sampling period (that is, the section corresponding to ③ in FIG. 4), that is, it becomes the low order. For example, in the case of Delay 0, the down counter 13 stops counting at "0", and thus, the low order value that is output from the low-order calculating unit becomes "0"; whereas in the case of Delay 7, the down counter 13 stops counting at "7", and thus, low order value that is output from the low-order calculating unit becomes "7". Then, the down counter 13 resets the count value when the sampling signal Ps at the reset input terminal clr switches from Hi to Low.

The other details concerning the operations are identical to those of the A-D converter according to the first preferred embodiment and are therefore not further elaborated upon.

Thus, the down counter 13 that constitutes the low-order calculating unit calculates, for each sampling period, the phase difference from the last pulse in the sampling period of the BASE-VCO 1's output pulse signal to the end point of the sampling period based on its count value. Therefore, the invention according to the present preferred embodiment can be configured with a simple circuit configuration.

It should be noted that in the present preferred embodiment, the calculation of the low order bit of the digital signal is not performed based on the pulse number of the BASE-VCO 1's output pulse signal that is contained in a period from the activation time point of the sampling signal to the time point at which the phases of the output pulse signals of the BASE-VCO 1 and the JAW-VCO 2 match each other, as performed in the first preferred embodiment, but it is performed based on the pulse number of the JAW-VCO 2's output pulse signal that is contained in a period from the activation time point of the sampling signal to the time point at which the phases of the output pulse signals of the BASE-VCO 1 and the JAW-VCO 2 match each other.

Thus, the calculation of the low order bit may be carried out based either on the pulse number of the BASE-VCO 1's output pulse signal as in the first preferred embodiment or on the pulse number of the JAW-VCO 2's output pulse signal, as in the present preferred embodiment.

Although the low-order calculating unit is made only of the down counter 13, it is not always necessary to employ this configuration, and the low-order calculating unit may be made of an up counter (now shown) having a clock input terminal T, an enable input terminal enable, and a reset input terminal clr, to which similar signals are to be supplied, in addition to the down counter 13.

If the up counter is configured to be capable of counting from "1" to "8", the output value from the down counter 13 can be made use of a decimal value corresponding to the section of ③ in FIG. 4 in the (N−1)-th sampling period while the output value from the up counter can be made use of a decimal value of the section corresponding to ① in FIG. 4 in the N-th sampling period. In this case, the configurations of the high- and low-order combining unit 6, the second register 7, and the first subtracter 8 should be changed so as to be capable of holding information in any sections of ① through ③ during one sampling period in FIG. 4 so that the sections of ① through ③ in FIG. 4 during one sampling period can be added. The section corresponding to ② can be found by calculating easily the difference between sampling periods of the first register 5.

Third Preferred Embodiment

The present preferred embodiment is a variation of the A-D converter according to the second preferred embodiment, in which a frequency adjusting circuit capable of calibrating a period Tbase and a period Tjaw is added to the A-D converter of the second preferred embodiment.

Figure 10:
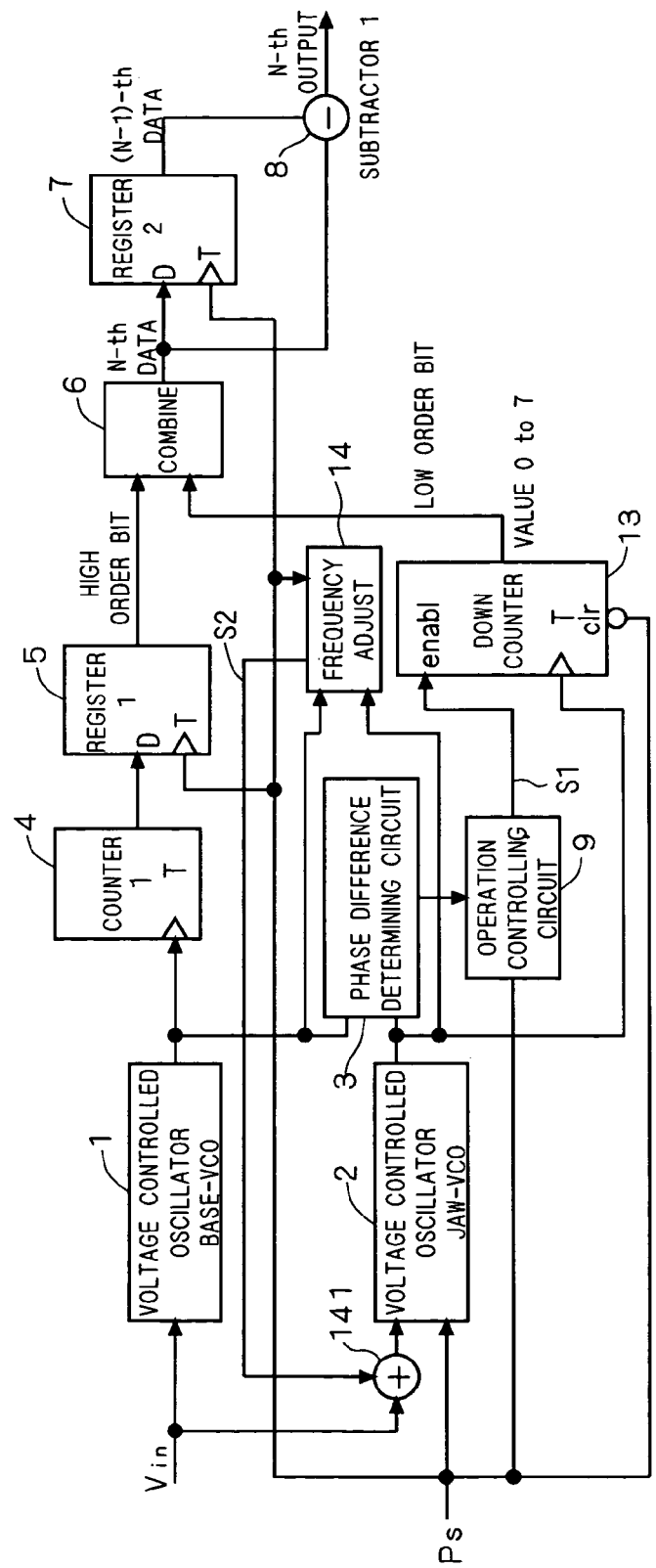
FIG. 10 is a circuit diagram showing an A-D converter according to a third preferred embodiment.

FIG. 10 is a circuit diagram showing an A-D converter according to the present preferred embodiment. As illustrated in FIG. 10, a frequency adjusting circuit 14 and an adder 141 are additionally provided in the present preferred embodiment. In FIG. 10, the device configuration is the same as that shown in FIG. 8 except that the frequency adjusting circuit 14 and the adder 141 are additionally provided.

Figure 11:
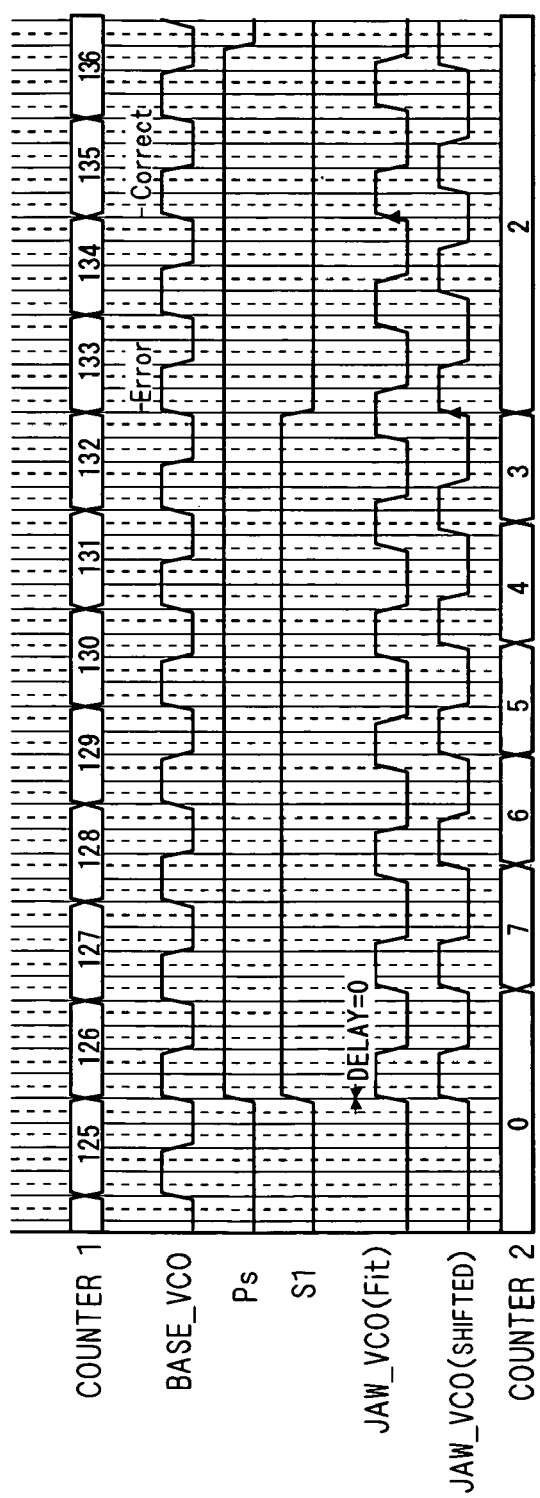
FIG. 11 is a timing chart indicating the necessity of a frequency adjusting circuit.

FIG. 11 is a timing chart for illustrating the necessity of the frequency adjusting circuit 14. FIG. 11 depicts a signal JAW_VCO (Fit) and a signal JAW_VCO (Shifted). The former represents an output pulse signal of the JAW-VCO 2 in the case in which the ratio A:B of the period Tbase and the period Tjaw is kept at a preset value 8:9, whereas the latter represents an output pulse signal of the JAW-VCO 2 in the case in which the ratio A:B of the period Tbase and the period Tjaw has deviated from the preset value 8:9. Both the signal JAW_VCO (Fit) and the signal JAW_VCO (Shifted) are signals in the case of Delay 0.

In the case of the signal JAW_VCO (Fit), the ratio A:B of the period Tbase and the period Tjaw is kept at the predetermined value 8:9; therefore, the duration for 8 periods in the signal JAW_VCO (Fit) and the duration for 9 periods in the BASE-VCO 1's output pulse signal match, and the time point at which their phases match, which is designated as "Correct", falls at a correct location. On the other hand, in the case of the signal JAW_VCO (Shifted), in which the period Tjaw is slightly greater, the time point at which the phases match is shifted to the location designated as "Error", which is earlier than "Correct". When such a shift occurs, a V-F conversion value that is less than the period Tbase cannot be detected properly, so the A-D conversion cannot be performed with high precision.

In the present preferred embodiment, if the ratio A:B of the period Tbase and the period Tjaw deviates from the predetermined value 8:9, the frequency adjusting circuit 14 and the adder 141 carry out calibration such that the ratio A:B becomes the proper value.

Figure 12:
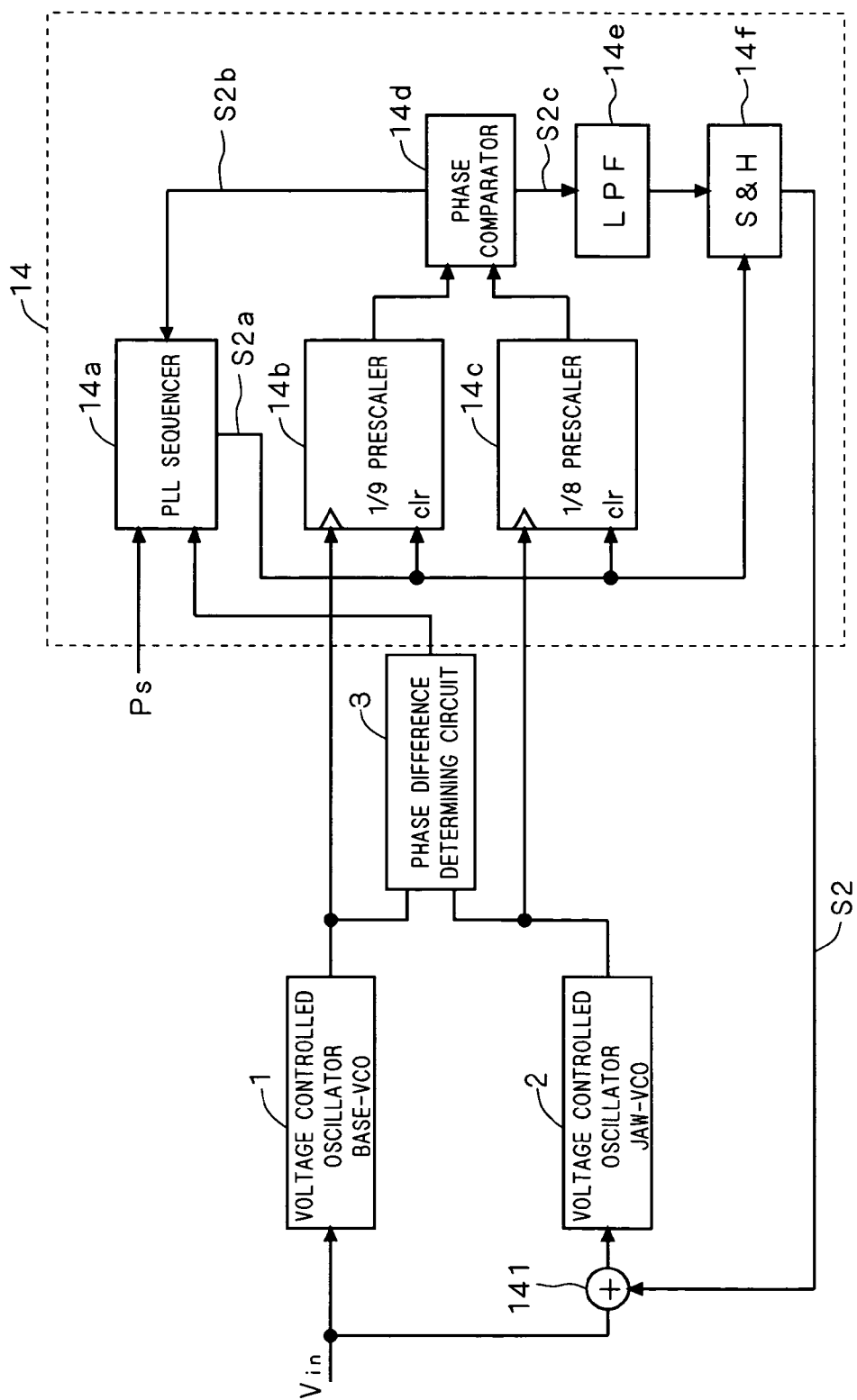
FIG. 12 is a diagram showing the detailed configuration of the frequency adjusting circuit.

FIG. 12 is a diagram showing the detailed configuration of the frequency adjusting circuit. The frequency adjusting circuit 14 is provided with: a PLL (Phase Locked Loop) sequencer 14a; a ⅑ prescaler 14b that divides a frequency corresponding to the period Tbase of the BASE-VCO 1's output pulse signal by B (=9); a ⅛ prescaler 14c that divides a frequency corresponding to the period Tjaw of the JAW-VCO 2's output pulse signal by A (=8); a phase comparator 14d that compares the phases of the outputs from the ⅑ prescaler 14b and the ⅛ prescaler 14c; a LPF (Low Pass Filter) 14e that receives the output from the phase comparator 14d; and a sample and hold circuit 14f that can hold the output of the LPF 14e.

The PLL sequencer 14a is a circuit that receives the sampling signal Ps and the output of the phase difference determining circuit 3, that automatically enters a period adjusting mode after generation of a digital value for each sampling period, and that continues the period adjusting operation until the next measurement operation, in other words, until the activation of the sampling signal Ps.

The ⅑ prescaler 14b receives the output pulse signal of the BASE-VCO 1, and divides its frequency corresponding to the period Tbase into ⅑ to output it to the phase comparator 14d.

Likewise, the ⅛ prescaler 14c receives the output pulse signal of the JAW-VCO 2 and divides its frequency corresponding to the period Tjaw into ⅛ to output it to the phase comparator 14d. The ⅑ prescaler 14b and the ⅛ prescaler 14c stops its frequency-division operation when its reset input terminal clr receives a signal S2a from the PLL sequencer 14a.

The phase comparator 14d compares the phases of the output signals from the two prescalers 14b and 14c, and sets the value of the output S2c to Hi or Low according to the phase difference between them. Then, upon receiving the output S2c, the LPF 14e outputs the integral value of the output S2c, and upon receiving the signal S2a from the PLL sequencer 14a, the sample and hold circuit 14f samples the output of the LPF 14e.

The output of the sample and hold circuit 14f is supplied to the adder 14l as a signal S2. The adder 14l adds the output value of the sample and hold circuit 14f to the input voltage Vin and thereby produces a voltage control signal for the JAW-VCO 2.

Then, the phase comparator 14d outputs a match signal S2b when the phases of the output signals from the two prescalers 14b and 14c match. When receiving the match signal S2b, the PLL sequencer 14a activates the signal S2a, thereby stops the frequency-division operations in both prescalers 14b and 14c, and causes the sample and hold circuit 14f to hold the output of the LPF 14e. The phase comparator 14d outputs "Low" as an output S2c when the rising edge of the output signal from the ⅛ prescaler 14c is faster than the rising edge of the output signal from the ⅑ prescaler 14b (when the JAW side is faster). On the other hand, the phase comparator 14d outputs "High" as the output S2c when the rising edge of the output signal from the ⅑ prescaler 14b is faster than the rising edge of the output signal from the ⅛ prescaler 14c (when the BASE side is faster). When the phases of the two prescaler 14b and 14c match, the comparator 14d brings the output S2c to high impedance.

Thus, in the frequency adjusting circuit 14, the JAW-VCO 2, the ⅛ prescaler 14c, the phase comparator 14d, and the LPF 14e constructs a kind of PLL circuit, so that the output value of the sample and hold circuit 14f is fluctuated until the phase matching between the output signal of the ⅑ prescaler 14b and the output signal of the ⅛ prescaler 14c is detected. Then, when a match is detected between the phases of the output signals of the two prescalers 14b and 14c, it is determined that the ratio A:B of the period Tbase and the period Tjaw has matched the predetermined value 8:9, and accordingly, the output value of the sample and hold circuit 14f at that time point is added as a voltage correction value to the input voltage Vin, to produce the voltage control signal.

According to the invention of the present preferred embodiment, the ⅑ prescaler 14b divides a frequency corresponding to the period Tbase of the BASE-VCO 1's output pulse signal by B, and the ⅛ prescaler 14c divides a frequency corresponding to the period Tjaw of the JAW-VCO 2's output pulse signal by A. Then, the phase comparator 14d compares the phases of the outputs of the two prescalers 14b and 14c, and the output from the phase comparator 14d is used to control the period Tjaw through the LPF 14e. Accordingly, feedback is effected in such a manner that the period Tbase and the period Tjaw maintain the ratio A:B, and thus, calibration of the period Tbase and the Tjaw is possible.

Although the period Tjaw is added to the input voltage Vin and controlled also by the output from the LPF 14e in the foregoing, it is possible to control the period Tbase also by the output from the LPF 14e, or to control both the periods Tbase and Tjaw also by the output from the LPF 14e. Specifically, the adder 14l may apply the output of the sample and hold circuit 14f to the input voltage Vin for the BASE-VCO 1, not the input voltage Vin for the JAW-VCO 2, or to both of the input voltages Vin for the BASE-VCO 1 and the JAW-VCO 2.

It is also possible to employ a configuration in which the oscillation outputs of the BASE-VCO 1 and the JAW-VCO 2 are taken out and supplied to an external PLL circuit (not shown) so that application of the output of the external PLL circuit is performed by the adder 14l.

In addition, without using the technique of increasing/decreasing the voltage of the input voltage Vin by means of the adder 14l, it is also possible to adopt a technique of, for example, changing the threshold values of the CMOS transistors in the inverters shown in FIG. 6, which form the BASE-VCO 1 and the JAW-VCO 2, by a substrate bias effect to control the amount of delay.

Fourth Preferred Embodiment

The present preferred embodiment is also a variation of the A-D converter according to the second preferred embodiment, in which a delay circuit for adding a predetermined delay amount to the BASE-VCO 1's output pulse signal is additionally provided in the second preferred embodiment.

Figure 13:
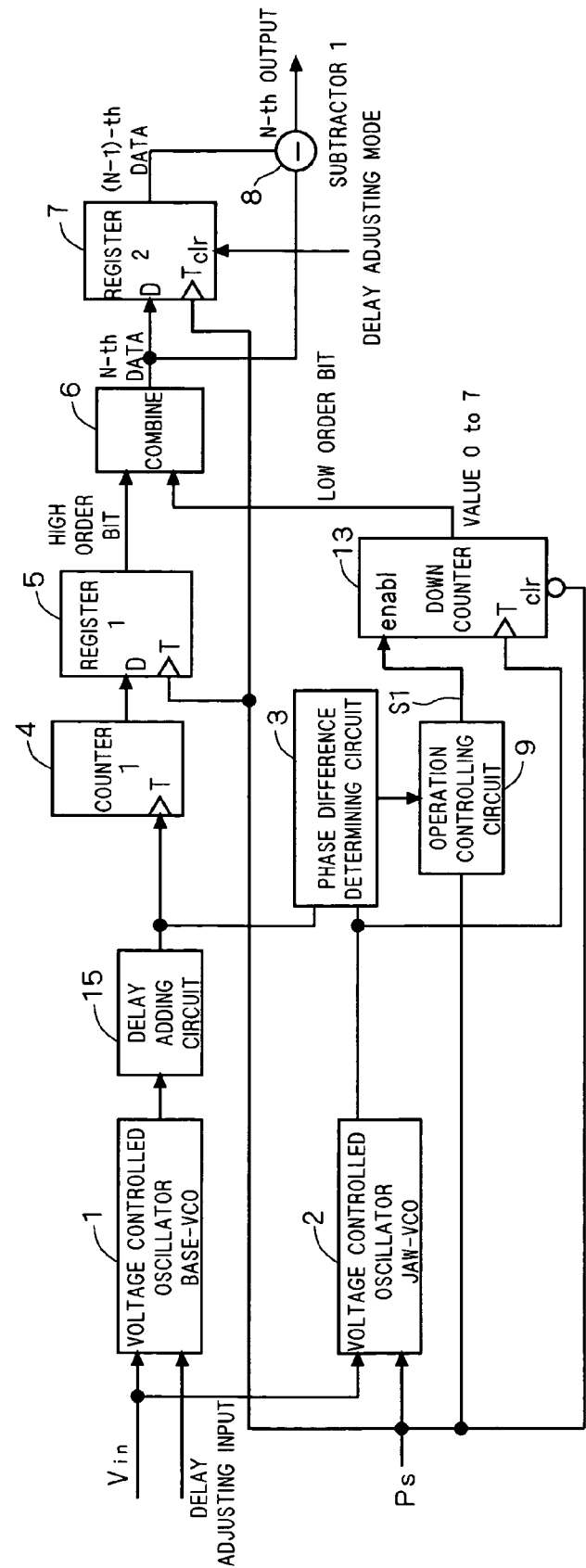
FIG. 13 is a circuit diagram showing an A-D converter according to a fourth preferred embodiment.

FIG. 13 is a circuit diagram showing an A-D converter according to the present preferred embodiment. As illustrated in FIG. 13, a delay adding circuit 15 is additionally provided in the present preferred embodiment. In addition, a delay adjusting input signal is supplied to the BASE-VCO 1, and a delay adjusting mode signal is supplied to the reset input terminal clr of the second register 7. In FIG. 13, the device configuration is the same as that shown in FIG. 8 except that the delay adding circuit 15, the delay adjusting input signal, and the delay adjusting mode signal are additionally provided.

Figure 14:
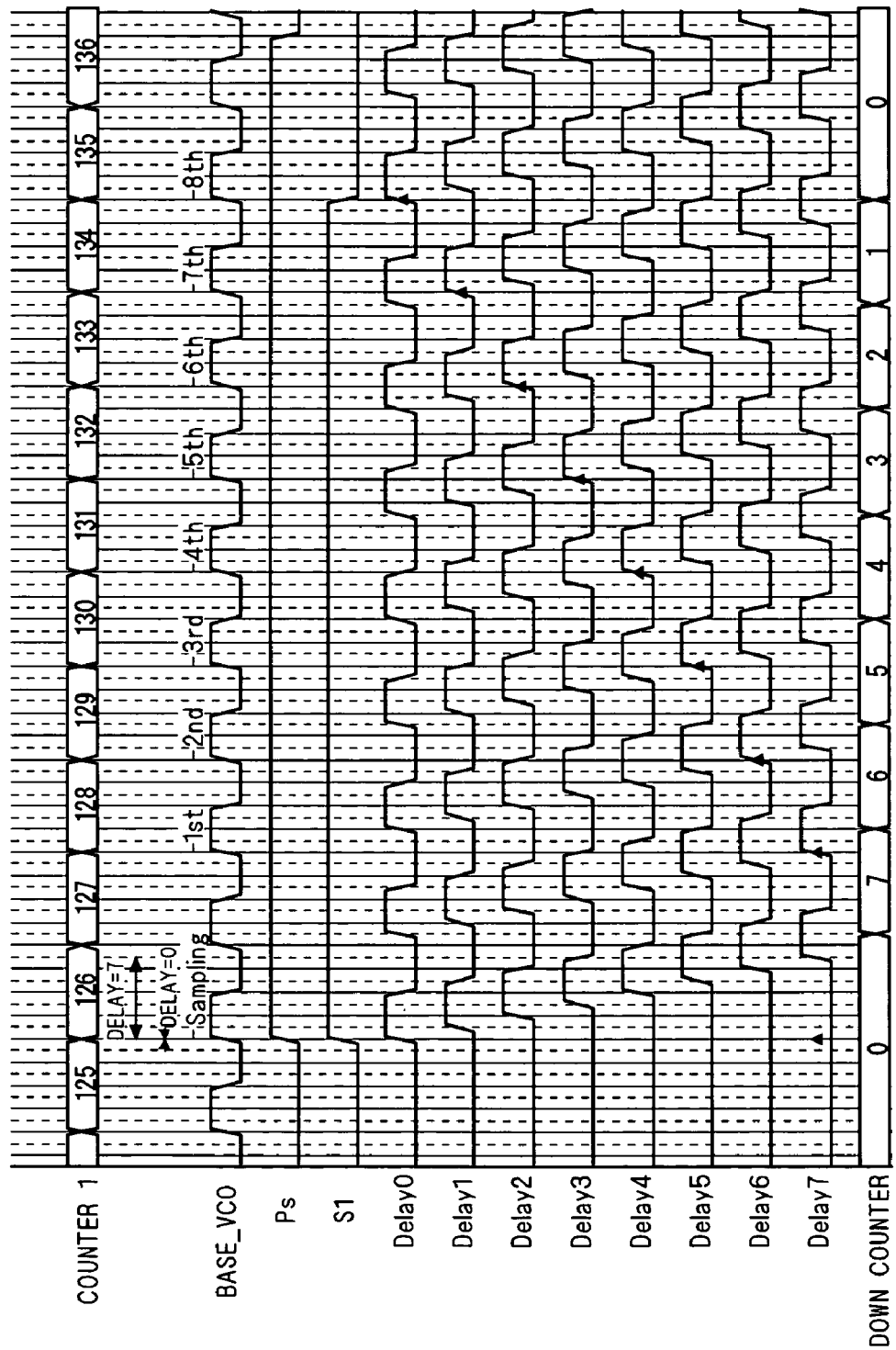
FIG. 14 is a timing chart illustrating the necessity of a delay adding circuit.
Figure 15:
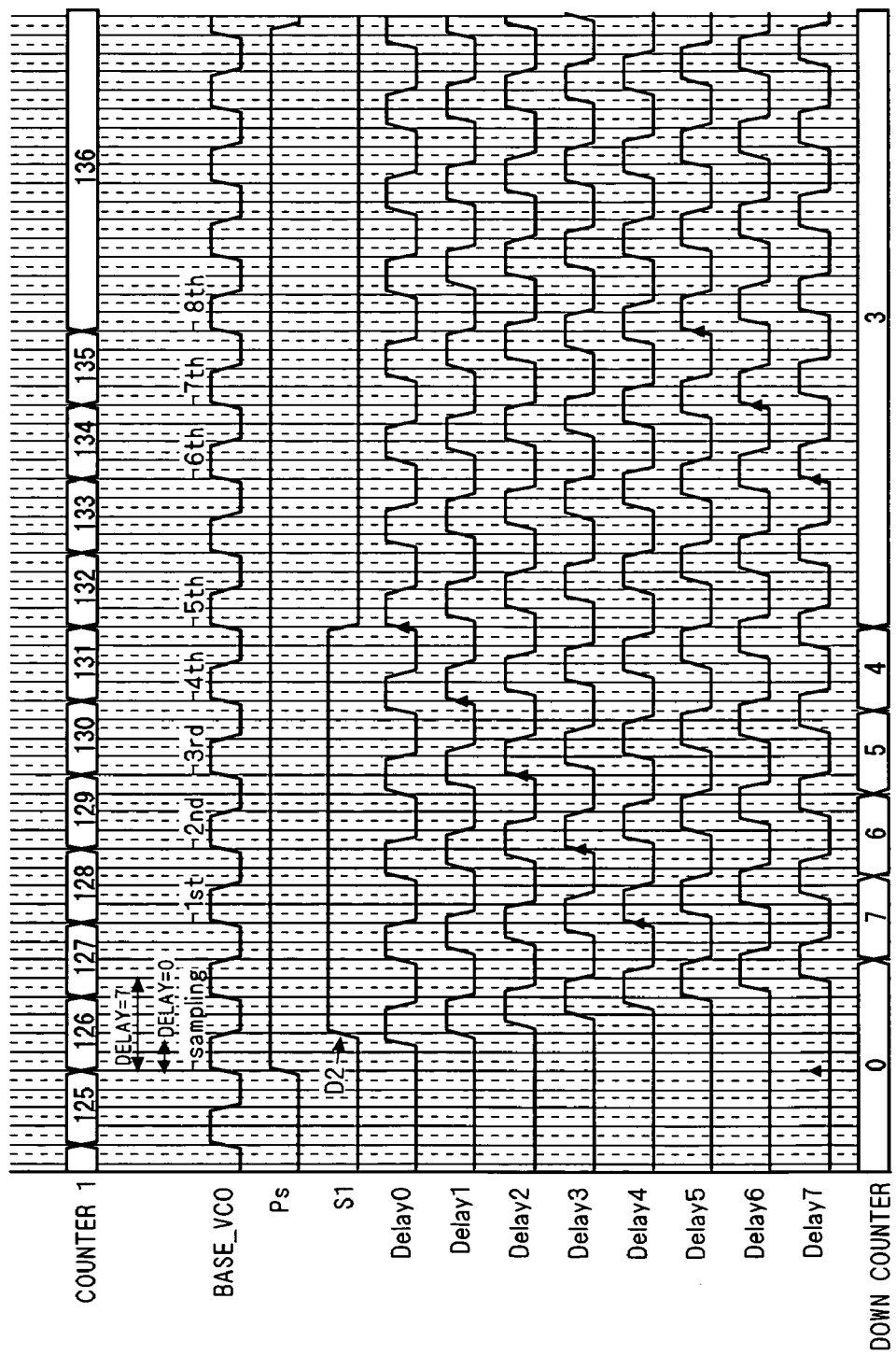
FIG. 15 is a timing chart illustrating the necessity of the delay adding circuit.

FIGS. 14 and 15 are timing charts for illustrating the necessity of the delay adding circuit 15. First, FIG. 14 illustrates a case in which the operation control circuit 9 immediately activates its output S1 in response to activation of sampling signal Ps and correspondingly the JAW-VCO 2's output pulse signal in the case of Delay 0 starts oscillation normally.

On the other hand, FIG. 15 shows a case in which the operation control circuit 9 activates its output S1 with delaying it by a delay amount D1, in response to the activation of the sampling signal Ps. In this case, the start of oscillation of the JAW-VCO 2's output pulse signal in the case of Delay 0 is delayed by the delay amount D1. Consequently, the phases match at the fifth oscillation of the JAW-VCO 2's output pulse signal, which should match at the eighth oscillation, leading to misdetection of the phase matching point.

In the present preferred embodiment, the delay amount that occurs between the activation of the sampling signal Ps and the start of oscillation of the JAW-VCO 2's output pulse signal is measured in advance, and the same amount of delay as the amount of delay that has been measured is generated by the delay adding circuit 15 so that the delay is added to the BASE-VCO 1's output pulse signal. Adding the delay to the BASE-VCO 1's output pulse signal means that the same amount of delay is caused in the BASE-VCO 1's output pulse signal as shown in FIG. 15; therefore, the erroneous phase matching point cannot be detected even if the start of oscillation of the JAW-VCO 2's output pulse signal is delayed by the delay amount D1.

In measuring the delay amount produced between the activation of the sampling signal Ps and the start of oscillation of the JAW-VCO 2's output pulse signal, first, an Enable terminal (delay adjusting input) is provided for the BASE-VCO 1 (the other input terminal of the dual input NAND circuit G2a in FIG. 6, to which the power supply voltage VDD is supplied, is assigned as the Enable terminal) so that the phase of the BASE-VCO 1's output pulse signal and the phase of the JAW-VCO 2's output pulse signal can match at the start of oscillation.

The delay adjusting input signal supplied to this Enable terminal is Hi enable, and Hi, that is, the power supply voltage VDD is supplied during normal operation. On the other hand, the sampling signal Ps is input to this Enable terminal during a delay adjusting mode. Further, since the output value of the generated decimal part becomes the output of the A-D converter as it is, the reset input terminal clr of the second register 7 is utilized as the terminal to which a delay adjusting mode signal is to be input and the reset input terminal clr is brought to Hi during the delay adjusting mode, whereby the output of the second register 7 is forcibly brought to 0.

During the delay adjusting mode, both the BASE-VCO 1 and the JAW-VCO 2 start oscillation based on the sampling signal Ps, and accordingly their oscillations start in the condition in which the phases of the BASE-VCO 1's output pulse signal and the JAW-VCO 2's output pulse signal match each other. If the output value of the first subtracter 8 is detected in this state, it is possible to measure the amount of delay caused between the activation of the sampling signal Ps and the start of oscillation of the JAW-VCO 2's output pulse signal. It should be noted that the delay amount of the delay adding circuit 15 is adjusted by varying the input voltage Vin so that the same delay value results regardless of whether the input voltage Vin is high or low.

FIG. 16 shows the detailed configuration of the delay adding circuit 15. As shown in FIG. 16, the delay adding circuit 15 can be configured with, for example, a D-A converter 15a and inverters 15b and 15c.

An output of the D-A converter 15a is supplied to power supply voltage inputs of the inverters 15b and 15c. Then, the BASE-VCO 1's output pulse signal is supplied as the input of the inverter 15b, and the output of the inverter 15b is supplied as the input of the inverter 15c. The output of the inverter 15c is supplied to the counter 4 and the phase difference determining circuit 3. Because the operating speed of the inverters 15b and 15c changes according to the power supply voltage, the amount of delay can be controlled by the output value of the D-A converter 15a.

The input of the D-A converter 15a may be supplied with a signal S3 from a circuit that controls calibration of the A-D converter, such as a control CPU or a control sequencer (not shown) that receives the output of the A-D converter.

According to the invention of the present preferred embodiment, the delay adding circuit 15 adds a predetermined amount of delay to the BASE-VCO 1's output pulse signal, and the predetermined delay amount is the amount of delay, which has been measured in advance, produced between the activation of the sampling signal Ps and the start of oscillation of the JAW-VCO 2's output pulse signal. Even when the oscillation of the JAW-VCO 2's output pulse signal does not start immediately after the activation of the sampling signal Ps, a corresponding amount of delay is added to the BASE-VCO 1's output pulse signal, and therefore, the delay caused between the activation of the sampling signal Ps and the start of oscillation of the JAW-VCO 2's output pulse signal can be cancelled; thus, a match in the phases between the output pulse signals of the BASE-VCO 1 and the JAW-VCO 2 can be detected more precisely.

It should be noted that the delay adding circuit 15 may be configured to add a separate delay to the JAW-VCO 2's output pulse signal independently in addition to adding a delay to the BASE-VCO 1's output pulse signal. In addition, the delay adding circuit 15 may be a type that adds voltage to the input voltage Vin for the BASE-VCO 1 or the JAW-VCO 2, as with the adder 141 of FIG. 10, other than the type that adds a delay to the output pulse signal of the BASE-VCO 1 or the JAW-VCO 2 as described above. Moreover, it is possible to adopt a technique of controlling the amount of delay by varying the threshold value of the CMOS transistors in the inverters shown in FIG. 6, which form the BASE-VCO 1 and the JAW-VCO 2, by substrate bias effect.

Fifth Preferred Embodiment

The present preferred embodiment is a variation of the A-D converters according to the first and second preferred embodiments, in which the phase difference determining circuit 3 and the low-order calculating unit (the third register 10 and the second and third subtracters 11 and 12, or the down counter 13) in the A-D converters of the first and second preferred embodiments are integrated.

FIG. 17 is a circuit diagram showing an A-D converter according to the present preferred embodiment. As illustrated in FIG. 17, the present preferred embodiment adopts a 1-bit 8-entry shift register 16 and an encoder 17 in place of the phase difference detecting circuit 3 and the low-order calculating unit. In addition, an operation control circuit 90 is adopted in place of the operation control circuit 9. In FIG. 17, the device configuration is the same as those shown in FIGS. 1 and 8, except that the 1-bit 8-entry shift register 16, the encoder 17, and the operation control circuit 90 are adopted.

This A-D converter uses the 1-bit 8-entry shift register 16 and the encoder 17 as a phase difference determining circuit that can determine even the sequential relationship of the phases of oscillation outputs of the two VCOs. In the present invention, it is necessary to accurately detect the point at which the phase relationship of the JAW-VCO 2's output pulse signal and the BASE-VCO 1's output pulse signal changes. Although a common S-R flip-flop type phase difference determining circuit may be able to indicate the phase distance between two pulses, it is not suitable to accurately detect the point at which one phase matches or overtakes the other, that is, to accurately detect which of the phases is ahead or behind.

A change of the phase difference in oscillation outputs of two VCOs may be determined by storing changes in the phase relationship in the output pulse signals of the VCOs in time series before and after the point to be determined, and checking a new phase relationship against the stored state, to detect the change point of the phase relationship. This is the reason why the 1-bit 8-entry shift register 16 and the encoder 17 are adopted in the present preferred embodiment.

FIG. 18 is a timing chart illustrating the operation of the A-D converter according to the present preferred embodiment. FIG. 18 shows how the operation control circuit 90 activates the output S1a in response to activation of the sampling signal Ps, and how the JAW-VCO 2's output pulse signal oscillates in the cases of Delay 0 to Delay 7.

Figure 19:
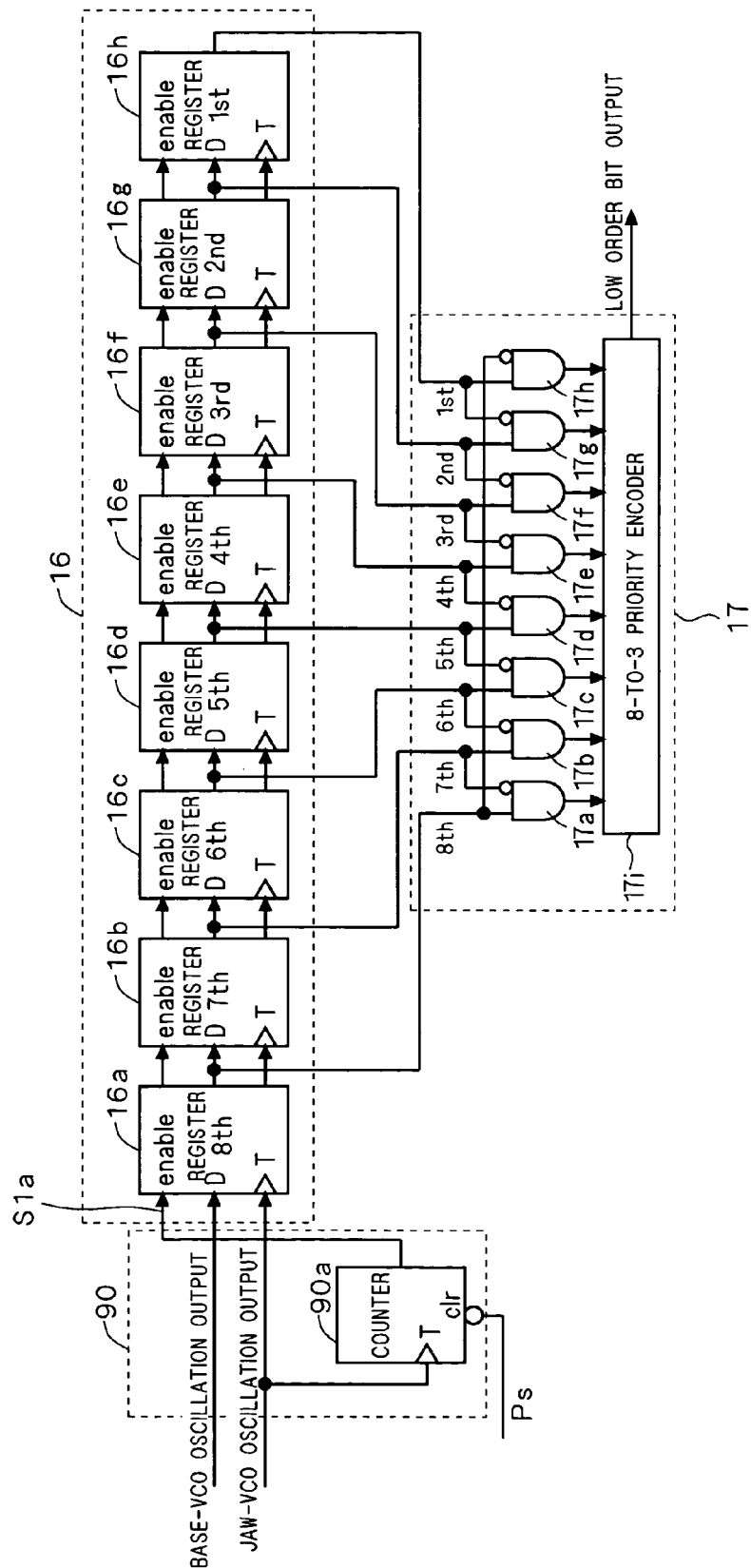
FIG. 19 is a diagram showing the detailed configurations of an operation controlling circuit, a 1-bit 8-entry shift register, and an encoder.

FIG. 19 is a diagram showing the detailed configurations of the operation controlling circuit 90, the 1-bit 8-entry shift register 16, and the encoder 17. The operation control circuit 90 has a counter 90a. The 1-bit 8-entry shift register 16 has registers 16a to 16h connected in series. The encoder 17 has dual input AND circuits 17a to 17h and a 8 to 3 priority encoder 17i.

The counter 90a receives a JAW-VCO 2's output pulse signal at its clock input terminal T and a sampling signal Ps at its reset input terminal clr. The output S1a of the counter 90a is supplied to every enable terminal enabl of the registers 16a to 16h in the 1-bit 8-entry shift register 16.

The JAW-VCO 2's output pulse signal is supplied to each clock input terminal T of all the registers 16a to 16h in the 1-bit 8-entry shift register 16. The BASE-VCO 1's output pulse signal is supplied to a signal input terminal D of a first stage register 16a, and its output is supplied to a signal input terminal D of a second stage register 16b. Likewise, in the respective stages of the following registers 16b to 16h as well, the outputs from the previous stages are supplied to the input terminals D of the following stages.

The output of the first stage register 16a is supplied to one of the input terminals of the dual input AND circuit 17a in the encoder 17, and an inverted output of the second stage register 16b is supplied to the other input terminal. The output of the second stage register 16b is supplied to one of the input terminals of the dual input AND circuit 17b, and an inverted output of the third stage register 16c is supplied to the other input terminal. Thereafter, likewise, in the dual input AND circuits 17c to 17h, the outputs of the corresponding registers 16c to 16h are supplied to each respective one of the input terminals, and an inverted output of one of the registers 16d to 16h that is one stage after is supplied to each of the other respective one of the input terminals (for the dual input AND circuit 17h, the inverted output of the first stage register 16a). The 8 to 3 priority encoder 17i receives outputs of the dual input AND circuits 17a to 17h (only one of the circuits outputs Hi, and all the circuits as a whole output a 8-bit signal) and converts them into a 3-bit low order bit output of "0" to "7".

Figure 20:
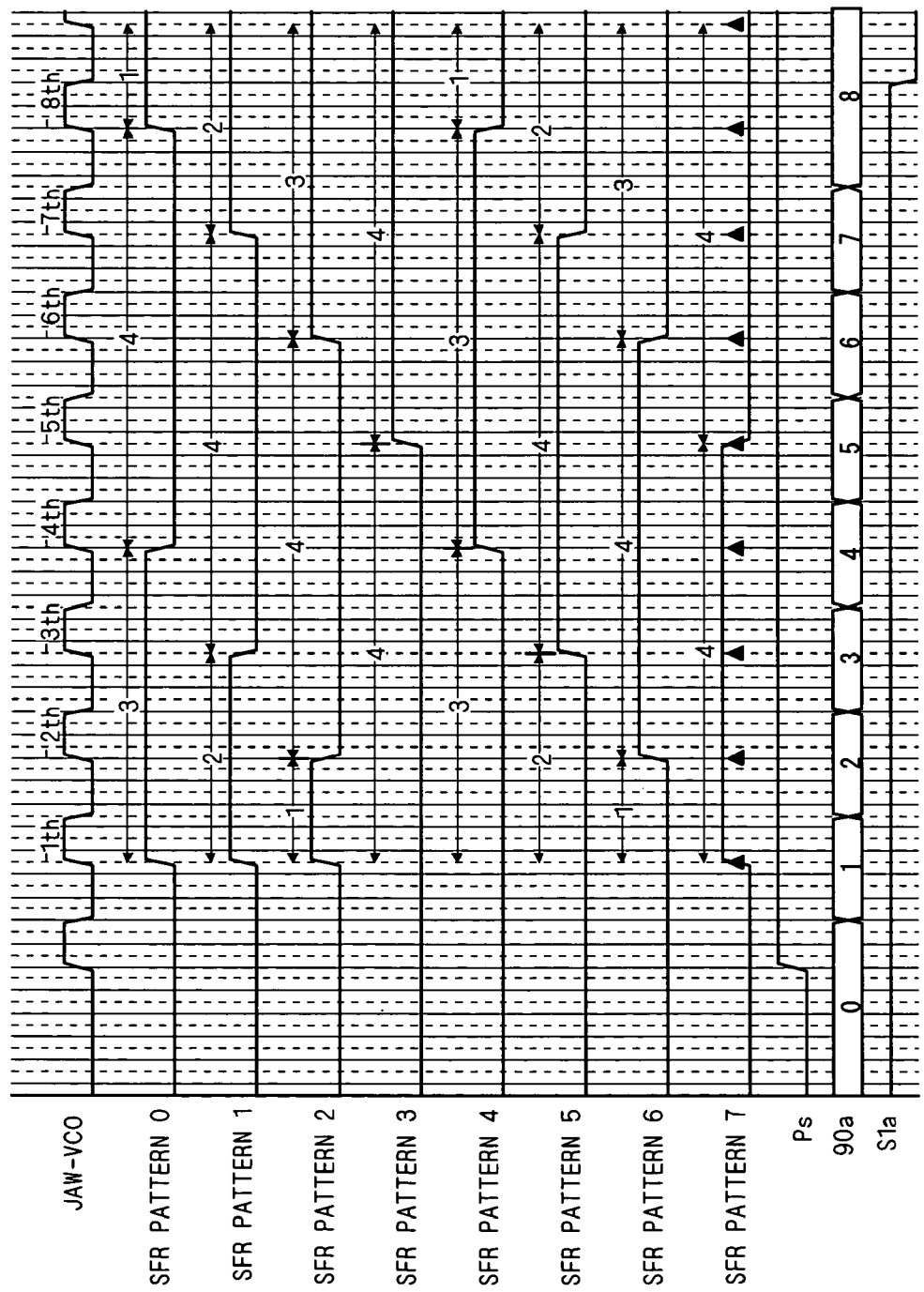
FIG. 20 is a timing chart showing operations of the operation controlling circuit, the 1-bit 8-entry shift register, and the encoder

FIG. 20 is a timing chart illustrating the operations of the operation control circuit 90, the 1-bit 8-entry shift register 16, and the encoder 17. First, the counter 90a in the operation control circuit 90 performs counting for 8 times, which is the number of entries of the 1-bit 8-entry shift register 16, in response to the falling edge of the JAW-VCO 2's output pulse signal.

The register 16a in the 1-bit 8-entry shift register 16 sequentially holds either Hi or Low value of the BASE-VCO 1's output pulse signal in conjunction with oscillation of the JAW-VCO 2's output pulse signal (performs sampling). Then, it shifts the held information to the following stage registers 16b to 16h. This shift of information is carried out 8 times, which is the count of the counter 90a.

Then, at the time point where the counter 90a has counted 8 times, the information held by the registers 16a to 16h in the 1-bit 8-entry shift register 16 shows, as illustrated by SFR pattern 0 to SFR pattern 7 in FIG. 20, particular Hi/Low patterns corresponding to the respective cases of Delay 0 to Delay 7 in FIG. 18. Specifically, taking the case of Delay 0 in FIG. 18 as an example, as the register 16a sequentially samples Hi or Low values of the BASE-VCO 1's output pulse signal in conjunction with oscillation of the JAW-VCO 2's output pulse signal, the pattern "Hi", "Hi", "Hi", "Low", "Low", "Low", "Low", "Hi" shown in FIG. 18 results. This pattern corresponds to SFR pattern 0 in FIG. 20. The other cases of Delay 1 to Delay 7 in FIG. 18 correspond to SFR patterns 1 to 7 in FIG. 20, respectively.

Of the dual input AND circuits 17a to 17h in the encoder 17, only one of them outputs Hi and the others output Low in conjunction with the respective cases of SFR pattern 0 to SFR pattern 7 and the circuits 17a to 17h generate 8-bit signal. For example, in the case of SFR pattern 0, the dual input AND circuit 17a to 17h generates an 8-bit signal for the pattern "Low", "Low", "Hi", "Low", "Low", "Low", "Low", "Low".

The 8 to 3 priority encoder 17i converts this 8-bit signal into a predetermined corresponding value (specifically, delay amount "0" in the case of SFR pattern 0, delay amount "1" in the case of SFR pattern 1, ... and delay amount "7" in the case of SFR) and outputs the value as the information of the low order bit.

In each of SFR pattern 0 to SFR pattern 7 in FIG. 20, the portions where the signal changes from Low to Hi correspond to the phase matching points in the cases of Delay 0 to Delay 7 in FIG. 18, so when a time point at which the phases match is determined using the patterns from SFR pattern 0 to SFR pattern 7, the result will be reliable. The reason is that a match in the phases is not determined from the phase distance of the output pulse signals of the two VCOs, but a match in the phases is determined from patterns of the BASE-VCO 1's output pulse signal using oscillation of the JAW-VCO 2's output pulse signal as sampling timing so that the ahead or behind of the phases can be determined.

That is, the present preferred embodiment employs the low-order calculating unit in which the BASE-VCO 1's output pulse signal is used for the signal input to the 1-bit 8-entry shift register 16 while the JAW-VCO 2's output pulse signal is used for the clock input to the 1-bit 8-entry shift register 16, so that the encoder 17 outputs numerical values corresponding to output patterns of the 1-bit 8-entry shift register 16 as the phase difference.

The output patterns of the 1-bit 8-entry shift register 16 vary depending on the time point at which the phases of the output pulse signals of the BASE-VCO 1 and the JAW-VCO 2 match each other; therefore, an appropriate phase difference can be output by associating output numerical values from the encoder 17 with the phase differences in the cases of respective output patterns of the 1-bit 8-entry shift register 16. Thus, an A-D converter according to the present invention can be configured with a simple circuit configuration.

It should be noted that it is possible to adopt a configuration in which an 8-output multiplexer and 8 registers may be provided in place of the 1-bit 8-entry shift register 16 so that the 8-output multiplexer sequentially stores sampling values in corresponding 8 registers according to the numerical value of the signal S1a of the operation control circuit 90.

Sixth Preferred Embodiment

The present preferred embodiment is a variation of the A-D converters according to the first through fifth preferred embodiments, in which the high-order calculating unit, which is constructed by the counter 4 and the first register 5 in the first to fifth preferred embodiments, is configured with the counter 4 and shift registers such as to identify the number of pulses in the BASE-VCO 1's output pulse signal at the time point of activation of the sampling signal Ps based on a phase difference calculated by a low-order calculating unit.

Figure 21:
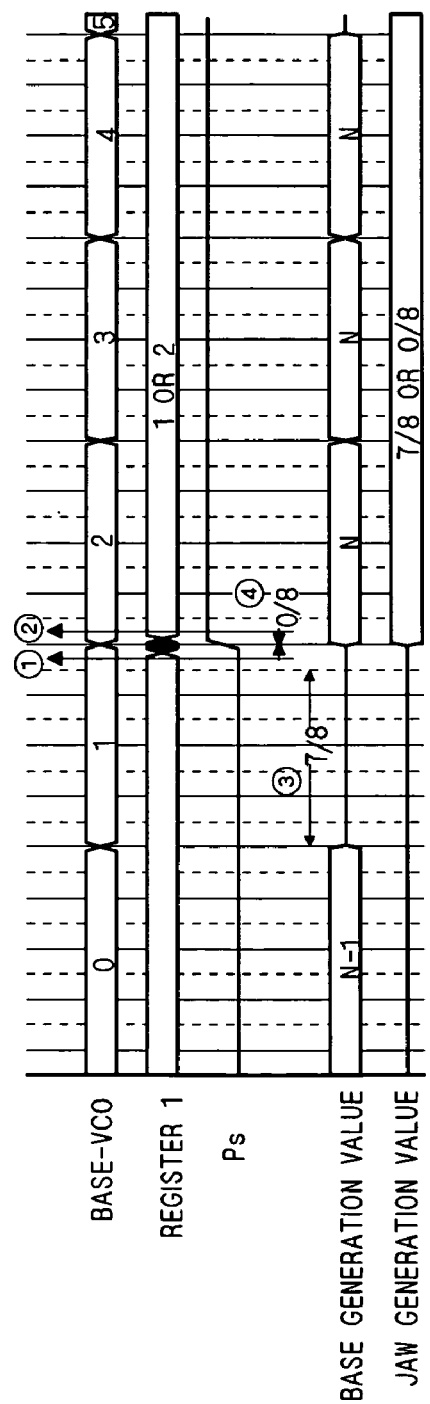
FIG. 21 is a timing chart illustrating the necessity of a high-order calculating unit in a sixth preferred embodiment.

FIG. 21 is a timing chart illustrating the necessity of a high-order calculating unit of the present preferred embodiment. FIG. 21 shows a case in which the first register 5 in FIGS. 1 and 8 experiences a problem with the timing that captures the count value of the counter 4.

When the activation time point of the sampling signal Ps is close to the activation time point of the BASE-VCO 1, the count value held by the first register 5 becomes different (indicated as "1 or 2" FIG. 21) depending on whether the capture of the pulse number of the BASE-VCO 1 is carried out in the counter 4 with the timing designated by ① or the timing designated by ② in FIG. 21. Such shift of capturing timing in the counter 4 can occur due to jitter introduced into oscillation timing of the BASE-VCO 1, or jitter introduced into sampling signal Ps.

If the introduction of jitter such as described above occurs, not only errors occur in the capturing of number of pulses by the counter 4, but also the time point at which the phases match can be different in the detection of the phase difference in the output pulse signals of the two VCOs, as designated by ③ and ④ in FIG. 21 (indicated as "⅞ or ⅝" in FIG. 21). If ① and ② become combined with ③ and ④ in FIG. 21, a large deviation occurs in the detected value, like "2+⅞" and 1+⅝".

Figure 22:
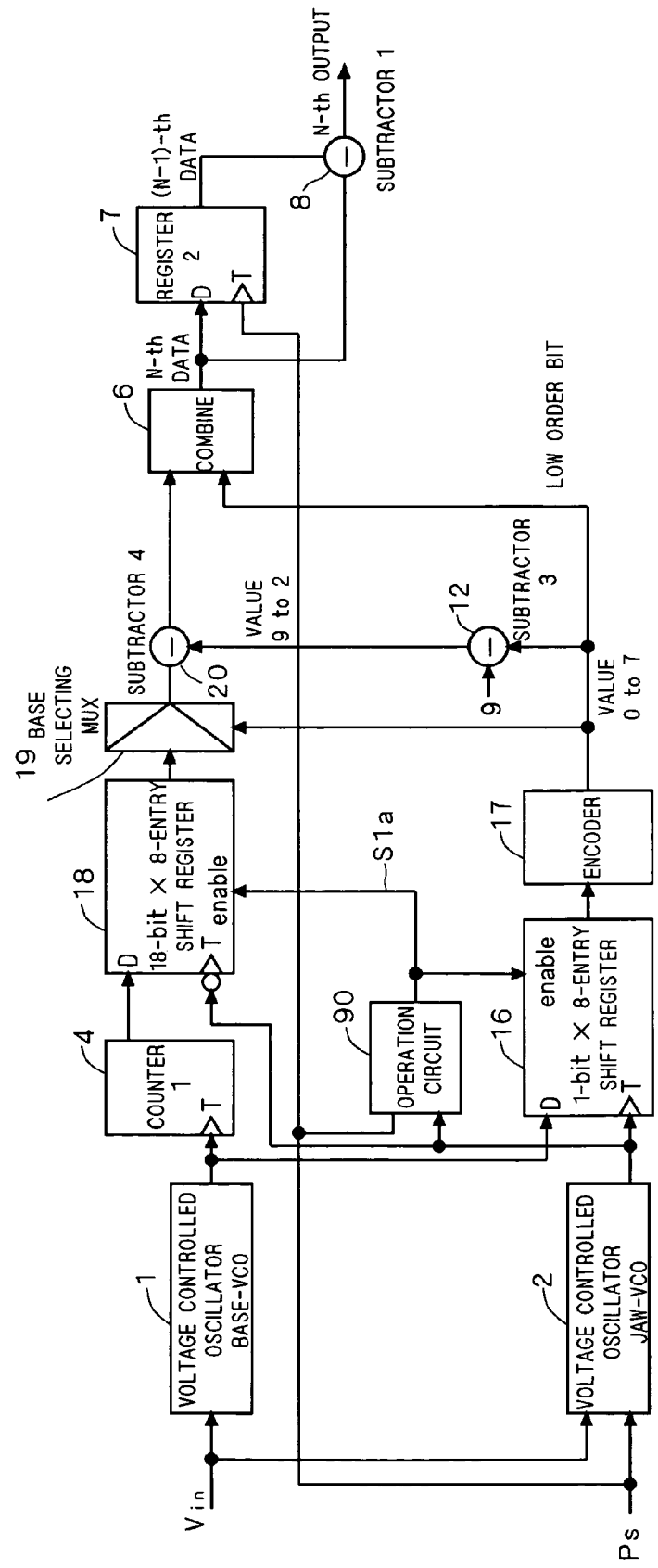
FIG. 22 is a circuit diagram showing an A-D converter according to the sixth preferred embodiment.

For this reason, the present preferred embodiment realizes an A-D converter that is highly resistant to jitter. FIG. 22 is a circuit diagram showing an A-D converter according to the present preferred embodiment. As shown in FIG. 22, the present preferred embodiment adopts a 18-bit 8-entry shift register 18, a BASE selection multiplexer 19, and third and fourth subtracters 12 and 20, in place of the first register 5 in the fifth preferred embodiment. In FIG. 22, the device configuration is the same as that shown in FIG. 17 except that the 18-bit 8-entry shift register 18, the BASE selection multiplexer 19, and third and fourth subtracters 12 and 20 are adopted.

In this A-D converter, the 18-bit 8-entry shift register 18 holds changes in time series of the count value of the counter 4 at the fall timing of the JAW-VCO 2's output pulse signal (it should be noted that the term "18 bit" refers to a case in which the output of the counter 4 is a 18-bit signal. Of course it may be a different bit number according to the number of output bits of the counter 4), and the BASE selection multiplexer 19 selects a count value of the counter 4 for each sampling period, at the time point that is shifted half a period Tjaw from the time point at which the phases of pulse signal match among the count values of the counter 4 that are stored in the 18-bit 8-entry shift register 18, based on the phase difference calculated by the low-order calculating unit. The third and fourth subtracters 12 and 20, which constitute a computing unit, identifies the number of pulses in the BASE-VCO 1's output pulse signal at the activation time point of the sampling signal Ps based on the count value of the counter 4 selected by the BASE selection multiplexer 19 and the phase difference calculated by the low-order calculating unit.

Specifically, this means that the 18-bit 8-entry shift register 18 at least holds the count value of the counter 4 for each sampling period at the time point that is shifted half a period Tjaw from the time point at which the phases of pulse signals match, and the high-order calculating unit identifies, for each sampling period, the number of pulses in the BASE-VCO 1's output pulse signal at the activation time point of the sampling signal based on the count value held by the 18-bit 8-entry shift register 18 and the phase difference calculated by the low-order calculating unit.

Figure 23:
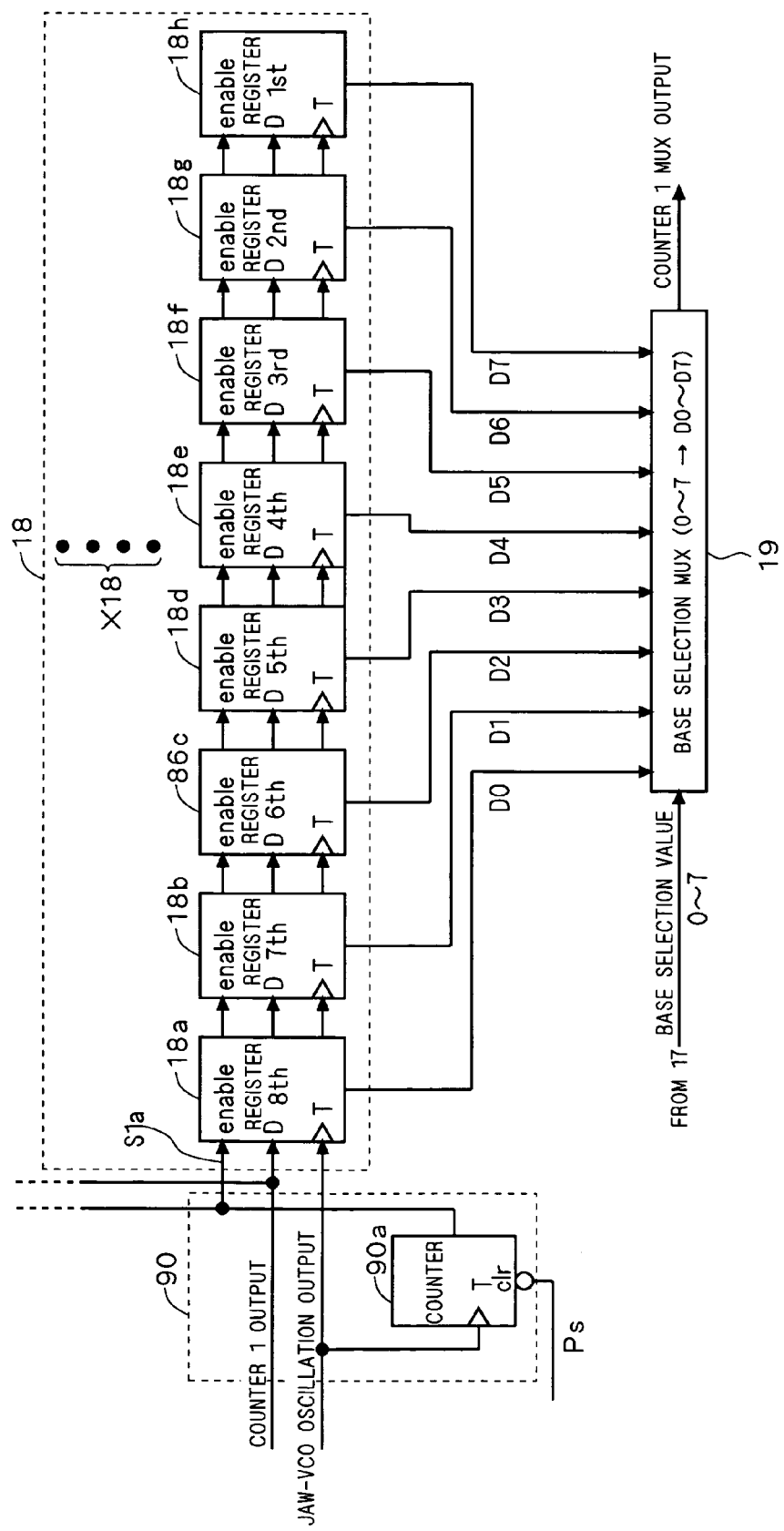
FIG. 23 is a diagram showing the detailed configurations of an operation controlling circuit, a 18-bit 8-entry shift register, and a BASE selection multiplexer.

FIG. 23 is a diagram illustrating the detailed configurations of the operation control circuit 90, the 18-bit 8-entry shift register 18, and the BASE selection multiplexer 19. The operation control circuit 90 has the same counter 90*a* as that shown in FIG. 19. The 18-bit 8-entry shift register 18 has registers 18*a* to 18*h* for 18 bits, connected in series (FIG. 23 depicts only those for 1 bit).

The counter 90*a* receives a JAW-VCO 2's output pulse signal by its clock input terminal T and a sampling signal Ps by its reset input terminal clr. The counter 90*a* performs counting for 8 times, which corresponds to the number of entries to the 1-bit 8-entry shift register 16 and the 18-bit 8-entry shift register 18 in response to the falling edge of the JAW-VCO 2's output pulse signal. The output S1*a* of the counter 90*a* is supplied to each enable terminal enabl of all the registers 18*a* to 18*h* for 1 bit in the 18-bit 8-entry shift register 18, as well as to each enable terminal of all the other registers for the other bits (not shown).

The JAW-VCO 2's output pulse signal is supplied to each clock input terminal T of all the registers 18*a* to 18*h* for 1 bit in the 18-bit 8-entry shift register 18 as well as to each clock input terminal of all the registers (not shown) for the other bits. A signal for 1 bit among the 18 bits of the count value of the counter 4 is supplied to the signal input terminal D of the first stage register 18*a*, and the output is supplied to the signal input terminal D of the second stage register 18*b*. In the following stages of the registers 18*b* to 18*h* too, the output from the previous stage is likewise supplied to the input terminal D of the following stage. Also in all the registers for the other bits, a signal for a corresponding bit among the 18 bits of the count value of the counter 4 is supplied to the signal input terminal of the first stage register, and thereafter, in each of the following stages too, the output from the previous stage is likewise supplied to the input terminal of the following stage.

The 18-bit 8-entry shift register 18 sequentially holds (samples) the value of the counter 4 in response to the falling edge of oscillation of the JAW-VCO 2's output pulse signal. Then, the held information is shifted to the following stage registers for 18 bits. This information shift is carried out 8 times, which corresponds to the count of the counter 90*a*.

The BASE selection multiplexer 19 is supplied with a 18-bit signal D0, which incorporates the output of the first stage register 18*a* for 1 bit and the outputs of the first stage registers (not shown) corresponding to the other 17 bits altogether. Likewise, the BASE selection multiplexer 19 is supplied with a 18-bit signal D1, which incorporates the output of the second stage register 18*b* and the outputs of the second stage registers (not shown) corresponding to the other 17 bits altogether, and the BASE selection multiplexer 19 is also supplied with similar 18-bit signals D2 to D7 from the following stages as well.

Figure 24:
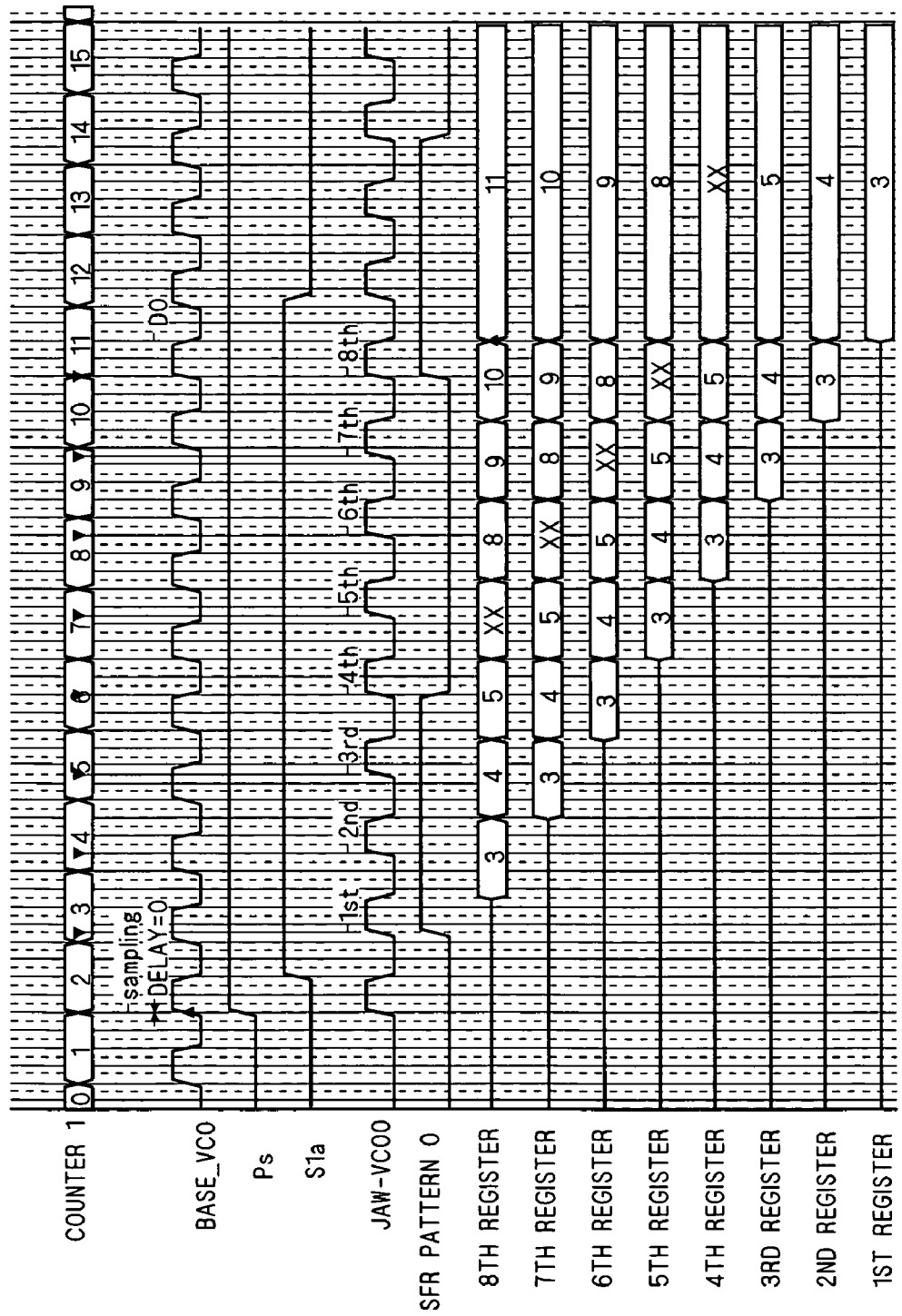
FIG. 24 is a timing chart showing an operation of the A-D converter according to the sixth preferred embodiment.

FIG. 24 is a timing chart showing the operation of the A-D converter according to the present preferred embodiment. In FIG. 24, the operation control circuit 90 activates the output S1*a* in response to the activation of the sampling signal Ps and causes its output S1*a* to oscillate a predetermined number of times in synchronization with the JAW-VCO 2's output pulse signal, and correspondingly, the 18-bit 8-entry shift register 18 holds changes in time series of the value of the counter 4.

The upper half of FIG. 24 shows a case in which the output pulse signals of the BASE-VCO 1 and the JAW-VCO 2 are in a phase relationship Delay=0, and it indicates that the 1-bit 8-entry shift register 16 outputs SFR pattern 0 shown in FIG. 20. Since the 1-bit 8-entry shift register 16 outputs SFR pattern 0, the encoder 17 outputs "0" as the low order bit value.

When the encoder 17 outputs "0" as a low order bit value, the BASE selection multiplexer 19 receives the value and outputs the corresponding information among the 18-bit signals D0 to D7 to the fourth subtracter 20. In this case, the information of 18-bit signal D0 (the information indicating the value "11" in the counter 4), which is the most current information in the 18-bit 8-entry shift register 18, is selected by the BASE selection multiplexer 19. In FIG. 24, this is represented as the eighth register.

When the encoder 17 outputs "1" as the low order bit value, the BASE selection multiplexer 19 outputs the 18-bit signal D1; when the encoder 17 outputs "2" as the low order bit value, the BASE selection multiplexer 19 outputs the 18-bit signal D2; . . . , and when the encoder 17 outputs "7" as the low order bit value, the BASE selection multiplexer 19 outputs the 18-bit signal D7, respectively.

From the output value from the BASE selection multiplexer 19, the result of the calculation obtained through a third subtracter 12 by subtracting the output value from the encoder 17 from "9" is subtracted by a fourth subtracter 20. Specifically, when the encoder 17 outputs "0" as the low order bit value, the third subtracter 12 outputs "9"−"0"="9" and the fourth subtracter 20 outputs "11"−"9"="2". Then, a combined value of this value "2" and the low order bit "0/8", "2+0/8", is held by the second register 7.

The value held by the second register 7 indicates the number of pulses in the BASE-VCO 1's output pulse signal at the activation time point of the sampling signal Ps, and when the low order bit output by the encoder 17 is "0", the number of pulses of the BASE-VCO 1 at the activation time point of the sampling signal Ps is "2, as shown in FIG. 24.

The lower half of FIG. 24 illustrates, as the seventh register to the first register, the cases in which the BASE selection multiplexer 19 selects information of the 18-bit signals D1 to D7 while the phase difference is "0" hypothetically, in addition to the case in which the BASE selection multiplexer 19 selects the information of the 18-bit signal D0 (the eighth register).

As will be appreciated from the eighth register to the first register, the 18-bit 8-entry shift register 18 samples the value of the counter 4 in response to the falling edge of the pulse signal of the JAW-VCO 2; therefore, in the case of the eighth register, its sampling timing is at exactly the mid point between the point at which the counter 4 starts to output the value "11" and the point at which it outputs a next value "12".

However, in the case of the fourth register, its sampling timing is at the time point at which the counter 4 finishes outputting the value "6" or at the time point at which it starts to output the value "7". In this case, the problem of whether or not the count value produces a carry of "1" arises, as shown in FIG. 21. In FIG. 24, such an indeterminate sampling value in the 18-bit 8-entry shift register 18 is designated as "XX".

That is, in the case of the eighth register, the 18-bit 8-entry shift register 18 samples the value of the counter 4 the time point furthest from the time point at which the phases match, that is, at the time point that is shifted half a period Tjaw, while in the case of the fourth register, it samples the value of the counter 4 at the same point as the time point at which the phases match, or a point nearby.

Therefore, by appropriately associating the low order bit values "0" to "7" output by the encoder 17 with the 18-bit signals D0 to D7 selected by the BASE selection multiplexer 19, the present preferred embodiment allows the 18-bit 8-entry shift register 18 to sample the value of the counter 4 at the time point furthest from the time point at which the phases match, that is, at the time point that is shifted half a period Tjaw even when the low order bit value is any one of "0" to "7", thereby preventing the value of the counter 4 from becoming indeterminate due to the deviation of the sampling timing as shown in FIG. 21.

It should be noted that in the eighth register of FIG. 24, when jitter occurs in the JAW-VCO 2's output pulse signal and the eighth value Hi of SFR pattern 0 is, for example, delayed by 1 clock and shifted rearward, the encoder 17 carries out encoding assuming SFR pattern 7, that is, Delay=7, according to the encoding rule in FIG. 20. In this case, the BASE selection multiplexer 19 results in the first register (value "3"), the third subtracter 12 outputs "9"−"7"=value "2", and the fourth subtracter 20 (high order bit) outputs "3"−"2"=value "1". Thus, even when there is a delay of about 1 clock, the data held by the second register 7 at that time results in "1+7/8". This value only has a delay of 1 clock, compared to the correct value "2+0/8" and thus does not deviate greatly as in the case of FIG. 21.

According to the invention of the present preferred embodiment, the high-order calculating unit identifies the number of pulses in the BASE-VCO 1's output pulse signal at the activation time point of the sampling signal Ps based on the phase difference calculated by the low-order calculating unit and the count value of the counter 4 held by the 18-bit 8-entry shift register 18 at the time point that is shifted half a period of the period Tjaw from the time point at which the phases of the output pulse signals of the BASE-VCO 1 and the JAW-VCO 2 match each other for each sampling period.

When the number of pulses in the BASE-VCO 1's output pulse signal at the activation time point of the sampling signal Ps is identified based on activation of the sampling signal Ps as in the case of FIG. 21, calculation errors tend to occur in the high-order calculating unit if activation of the BASE-VCO 1's output pulse signal and activation of the sampling signal Ps are close to each other. However, because the pulse number is identified based on the count value of the counter 4 that is held by the 18-bit 8-entry shift register 18 and is at the time point that is shifted half a period of the period Tjaw from the time point at which the phases match, and the phase difference calculated by the low-order calculating unit, calculation errors do not occur in the high-order calculating unit.

In addition, according to the invention of the present preferred embodiment, the 18-bit 8-entry shift register 18 receives the count value of the counter 4 and is capable of holding at least the count value of the counter 4 for each sampling period at the time point shifted half a period of the period Tjaw from the time point at which the phases of the output pulse signals of the BASE-VCO 1 and the JAW-VCO 2 match each other, and the high-order calculating unit further includes the BASE selection multiplexer 19 that selects the count value of the counter 4 at the time point that is shifted half a period of the period Tjaw from the time point at which the phases match, and a computing unit (the third and fourth subtracters 12 and 20) that identifies the number of pulses in the BASE-VCO 1's output pulse signal at the activation time point of the sampling signal Ps based on the count value of the counter 4 selected by the BASE selection multiplexer 19 (18-bit signals D0 to D7) and on the phase difference calculated by the low-order calculating unit. Thus, the invention according to the present preferred embodiment can be configured with a simple circuit configuration.

It should be noted that an 8-output multiplexer and eight registers may be provided for 18 bits in place of the 18-bit 8-entry shift register 18 so that the 8-output multiplexer sequentially stores a sampled value into a corresponding one of the eight registers for each bit according to the numerical value of the signal S1a of the operation control circuit 90 for each bit.

Seventh Preferred Embodiment

The present preferred embodiment is a variation of the A-D converters according to the second and sixth preferred embodiments, which is provided with the first register 5 and the down counter 13 illustrated in the second preferred embodiment, as well as a detecting unit, which is presented first in the present preferred embodiment, for allowing the first register 5 to hold the count value of the counter 4 at the time point shifted half a period of the period Tjaw from the time point at which the phases match when detecting the time point at which the phases of the output pulse signals of the BASE-VCO 1 and the JAW-VCO 2 match each other, in place of the 18-bit 8-entry shift register 18, the 1-bit 8-entry shift register 16, the encoder 17, and the operation control circuit 90 in the sixth preferred embodiment.

Figure 25:
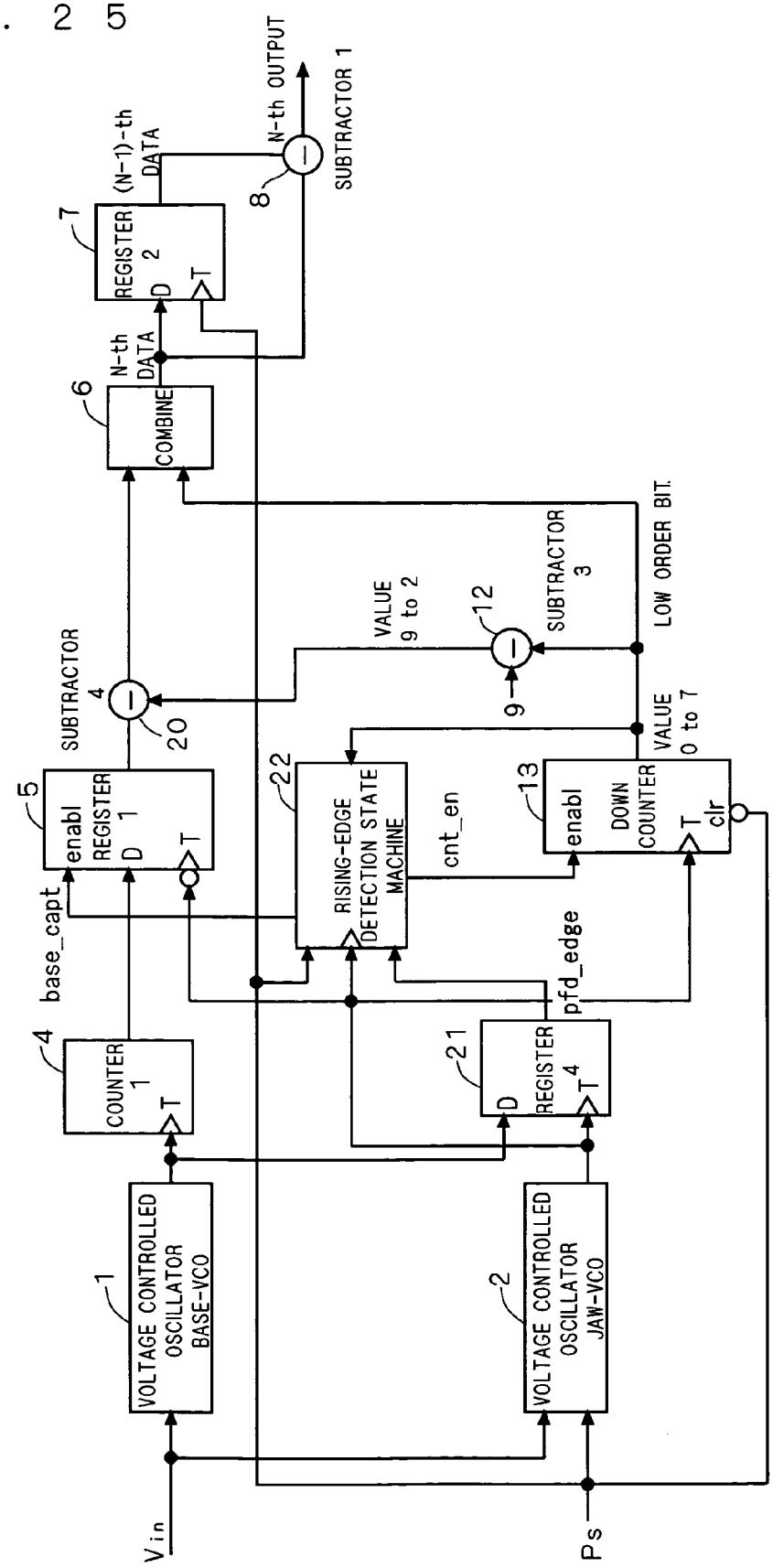
FIG. 25 is a circuit diagram showing an A-D converter according to a seventh preferred embodiment.

FIG. 25 is a circuit diagram showing an A-D converter according to the present preferred embodiment. As shown in FIG. 25, the present preferred embodiment employs a first register 5, a down counter 13, a fourth register 21, and a rising-edge detection state machine 22 in place of the 18-bit 8-entry shift register 18, the 1-bit 8-entry shift register 16, the encoder 17, and the operation control circuit 90 of the sixth preferred embodiment. It should be noted that the fourth register 21 and the rising-edge detection state machine 22 constitute the detecting unit in the present preferred embodiment. In FIG. 25, the device configuration is the same as that shown in FIG. 22 except that the first register 5, the down counter 13, the fourth register 21, and the rising-edge detection state machine 22 are provided.

In this A-D converter, as the register 16a in the 1-bit 8-entry shift register 16 shown in FIG. 19, the fourth register 21 sequentially holds (samples) a Hi or Low value of the BASE-VCO 1's output pulse signal in conjunction with oscillation of the JAW-VCO 2's output pulse signal.

The rising-edge detection state machine 22 detects a portion at which signal turns from Low to Hi (which corresponds to the points where phases match in the cases of Delay 0 to Delay 7 in FIG. 18, as mentioned above) in the patterns of SFR pattern 0 to SFR pattern 7 in FIG. 20 by referencing the content held by the fourth register 21. Detecting these portions makes it possible to determine a match between phases using oscillation of the JAW-VCO 2's output pulse signal as the sampling timing and thus to determine the ahead or behind of the phases, as discussed in the explanation about FIG. 20, thus making the determination reliable.

Figure 27:
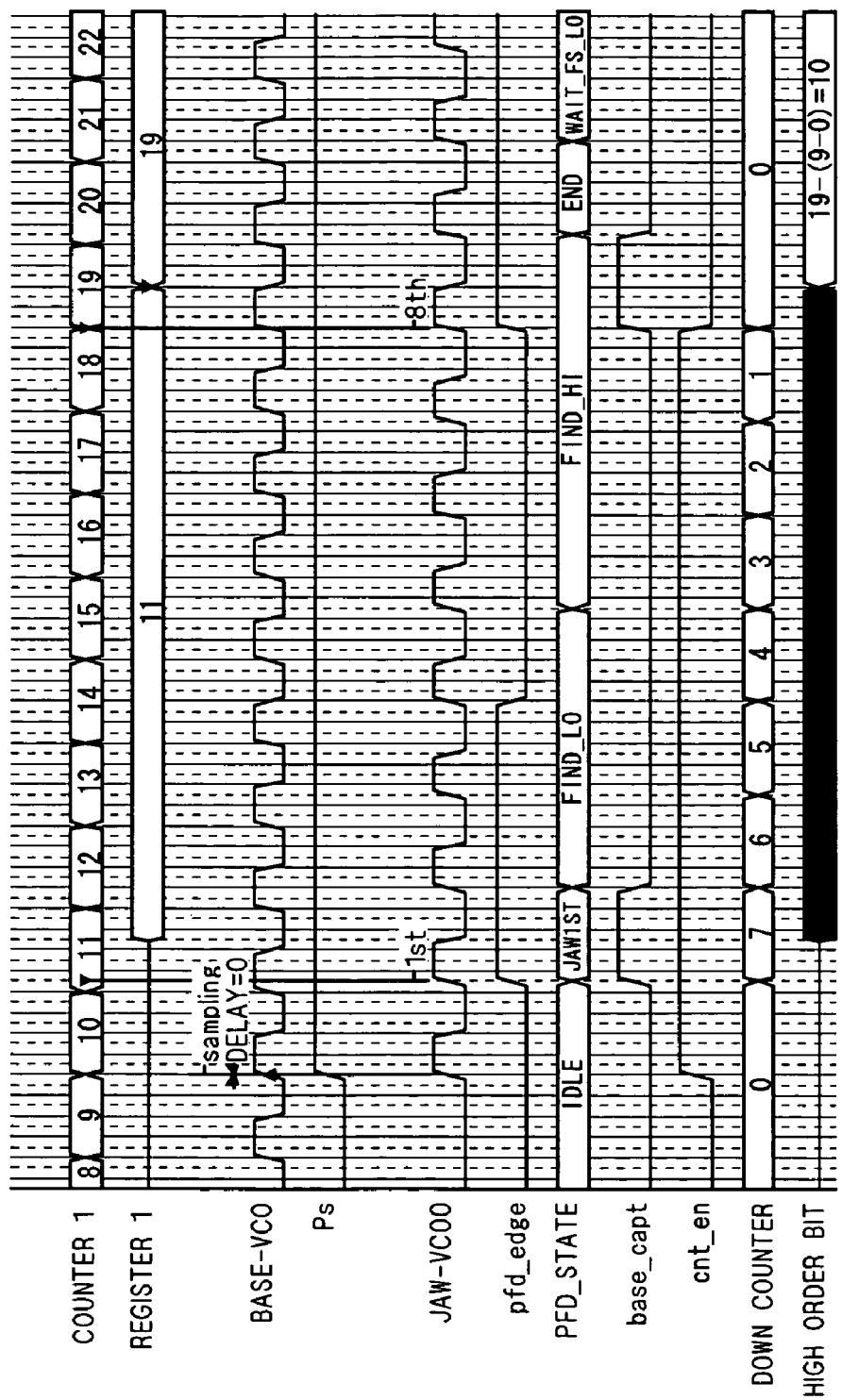
FIG. 27 is a timing chart showing an operation of the A-D converter according to the seventh preferred embodiment.
Figure 28:
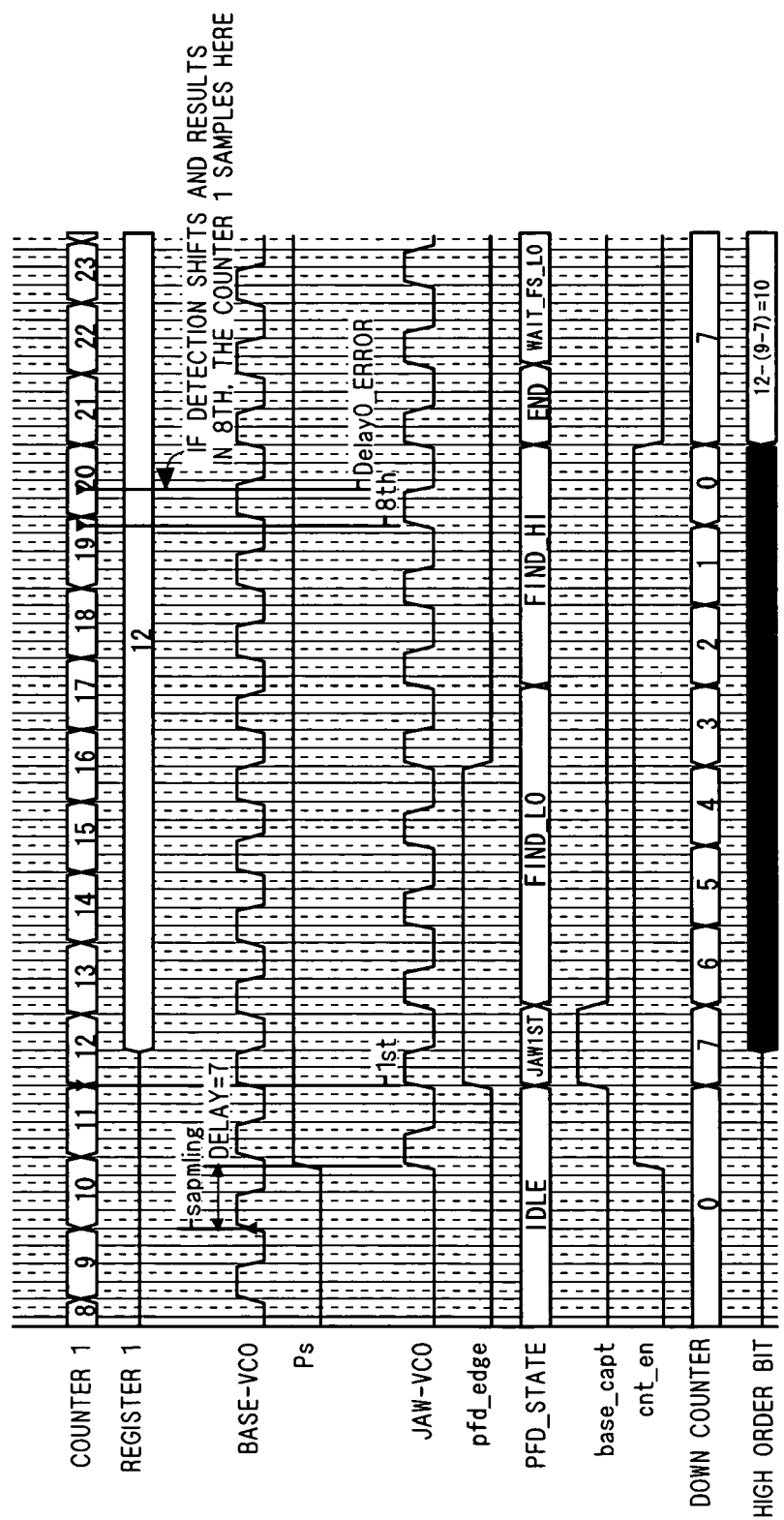
FIG. 28 is a timing chart showing an operation of the A-D converter according to the seventh preferred embodiment.

FIG. 26 is a state transition diagram of the rising-edge detection state machine 22. FIGS. 27 and 28 are timing charts illustrating the operation of an A-D converter according to the present preferred embodiment. Hereinbelow, first, the operation of the rising-edge detection state machine 22 is described with reference to the state transition diagram of FIG. 26 and the timing chart (in the case where Delay=0) of FIG. 27.

First, the rising-edge detection state machine 22 does not operate when the sampling signal Ps is in a deactivated state and stays in an "IDLE" state ST1 until the sampling signal Ps is brought to an activated state.

Next, when the signal value of the sampling signal Ps (referred to as FS) is activated and brought to Hi, the rising-edge detection state machine 22 activates (=Hi) an enable signal cnt_en for the down counter 13 and proceeds to a "JAW_1ST" state ST2. The down counter 13 thereby starts counting. Then, under this condition, an enable signal base_capt for the first register 5 is activated (=Hi) to allow the first register 5 to hold the count value of the counter 4 at a time point shifted half a period of the period Tjaw from the pulse rising edge of JAW_1ST (that is, at the pulse falling edge of JAW_1ST). (In FIG. 27, the value "11" is held by the first register 5.)

In the "JAW_1ST" state ST2, it is determined whether the value pfd_edge held by the fourth register 21 is Hi or Low. Since the fourth register 21 carries out sampling of the value of BASE-VCO 1's output pulse signal at the rising edge of the JAW-VCO 2's output pulse signal, the value pfd_edge becomes Hi at the pulse rising edge of JAW_1ST in FIG. 27.

If the value pfd_edge is detected as Hi, the rising-edge detection state machine 22 proceeds to a "FIND_LO" state ST3 and stays on standby until the value pfd_edge becomes Low. If the value pfd_edge changes to Low, the rising-edge detection state machine 22 proceeds to a "FIND_HI" state ST4. In the case of FIG. 27, since the value pfd_edge changes to Low at 3 pulses after the pulse JAW_1ST, the rising-edge detection state machine 22 proceeds from the "FIND_LO" state ST3 into the "FIND_HI" state ST4 at the next rising edge of the pulse JAW-VCO 2. When the value pfd_edge is detected as Low in the "JAW_1ST" state ST2 as well, the rising-edge detection state machine 22 proceeds to the "FIND_HI" state ST4.

In the "FIND_HI" state ST4, the rising-edge detection state machine 22 stays on standby until the value pfd_edge becomes Hi or the output value count of the down counter 13 becomes "0". In the case of FIG. 27, because the value pfd_edge returns to Hi at 4 pulses after the value pfd_edge has changed to Low (the phases match at this time point), the rising-edge detection state machine 22 activates an enable signal base_capt (=Hi) for the first register 5 to allow the first register 5 to hold the count value of the counter 4 at the time point shifted half a period of the period Tjaw from the time point at which the phases match (the value "19" is held by the first register 5 in FIG. 27). Further, at this time, the rising-edge detection state machine 22 deactivates an enable signal cnt_en (=Low) for the down counter 13. Then, the rising-edge detection state machine 22 proceeds to a "PFD_END" state ST5 and finishes the detection of the time point at which the phases match.

Since FIG. 27 illustrates the case where Delay=0, the count value of the down counter has reached "0" at this time point and the third subtracter 12 outputs a value "9"−"0"="9". The first register 5 holds the value "19", and therefore, the fourth subtracter 20 outputs a value "19"−"9"="10". This value "10" represents the number of pulses in the BASE-VCO 1's output pulse signal at the activation time point of the sampling signal Ps, and thus, the third and fourth subtracters 12 and 20 function as a computing unit for identifying the pulse number of the BASE-VCO 1's output pulse signal at the activation time point of the sampling signal Ps, as in the sixth preferred embodiment.

Thereafter, the rising-edge detection state machine 22 proceeds to a "WAIT_FS_LO" state ST6 and stays on standby until the signal value FS of the sampling signal Ps becomes Low. After the signal value FS has become Low, the rising-edge detection state machine 22 again proceeds to the "IDLE" state ST1 and stays on standby until the sampling signal Ps is next brought to an activated state.

FIG. 28 shows a timing chart in the case where Delay=7. In this case, the rising-edge detection state machine 22 proceeds from the "IDLE" state ST1 to the "JAW_1ST" state ST2 in response to activation of the sampling signal Ps. At this time, the down counter 13 starts counting.

In the "JAW_1ST" state ST2, the rising-edge detection state machine 22 activates an enable signal base_capt (=Hi) for the first register 5 so as to allow the first register 5 to hold the count value of the counter 4 at the pulse falling edge of JAW_1ST (In FIG. 28, the value "12" is held by the first register 5).

In the "JAW_1ST" state ST2, since the value pfd_edge held by the fourth register 21 is Hi, the rising-edge detection state machine 22 proceeds to the "FIND_LO" state ST3 and stays on standby until the value pfd-edge becomes Low. Then, when the value pfd_edge changes to Low, the rising-edge detection state machine 22 proceeds to the "FIND_HI" state ST4. In the case of FIG. 28, since the value pfd_edge changes to Low at 4 pulses after the pulse JAW_1ST, the rising-edge detection state machine 22 proceeds from the "FIND_LO" state ST3 to the "FIND_HI" state ST4 at the next rising edge of the pulse JAW-VCO 2.

In the case of FIG. 28, after the value pfd_edge has changed to Low, the value pfd_edge does not become Hi but the output value count of the down counter 13 becomes "0". In this case the enable signal base_capt for the first register 5 is not activated, and the rising-edge detection state machine 22 proceeds to the "PFD_END" state ST5 and finishes the detection of the time point at which the phases match. It should be noted that the down counter 13 should be set so that it returns to the initial value "7" after its output value count becomes "0".

FIG. 28 illustrates the case where Delay=7, so the count value of the down counter at this time point has returned from "0" to the initial value "7", and the third subtracter 12 outputs a value "9"–"7"="2". Since the first register 5 is holding the value "12", the fourth subtracter 20 outputs a value "12"–"2"="10". This value "10" represents the number of pulses in the BASE-VCO 1's output pulse signal at the activation time point of the sampling signal Ps.

Here, assuming the case in which the sampling signal Ps is activated with a delay of ⅛ phase in FIG. 28, the entire output pulse JAW-VCO 2 is delayed ⅛ phase in FIG. 28. In this case, the operation is the same as that in the case of FIG. 27 until the "FIND_HI" state ST4 is entered, except that the value held by the first register 5 is not "11" but 12".

In this case the value pfd_edge returns to Hi at 4 pulses after the value pfd_edge has changed to Low in the "FIND_HI" state ST4 (the phases match at this time point), and therefore, the rising-edge detection state machine 22 activates the enable signal base_capt (=Hi) for the first register 5 to allow the first register 5 to hold the count value of the counter 4 at the time point shifted half a period of the period Tjaw from the time point at which the phases match (in the case of FIG. 28 the value "20" is held by the first register 5).

At this time the count value of the down counter has reached "0", and the third subtracter 12 outputs a value "9"–"0"="9". Since the first register 5 holds the value "20", the fourth subtracter 20 outputs a value "20"–"9"="11".

In FIG. 28, when there is no jitter, the output value of the high- and low-order combining unit 6 is "10+⅞", while when the sampling signal Ps is activated with a delay of ⅛ phase, the output value of the high- and low-order combining unit 6 is "11+⅝". Accordingly, even when jitter occurs, the detected value does not deviate greatly.

According to the invention of the present preferred embodiment, the first register 5 holds, for each sampling period, the count value of the counter 4 at the time point shifted half a period of the period Tjaw from the time point at which the phases of the output pulse signals of the BASE-VCO 1 and the JAW-VCO 2 match, and the high-order calculating unit identifies, for each sampling period, the number of pulses in BASE-VCO 1's output pulse signal at the activation time point of the sampling signal Ps, based on the count value held by the first register 5 and the phase difference calculated by the low-order calculating unit.

As in the case of FIG. 21, when the number of pulses in the BASE-VCO 1's output pulse signal at the activation time point of the sampling signal Ps is identified based on activation of the sampling signal Ps, calculation errors tend to occur in the high-order calculating unit if activation of the BASE-VCO 1's output pulse signal and activation of the sampling signal Ps are close to each other. However, since the number of pulses is identified based on the count value of the counter 4 held by the first register 5 at the time point shifted half a period of the period Tjaw from the time point at which the phases match and the phase difference calculated by the low-order calculating unit, no calculation error occurs in the high-order calculating unit.

In addition, according to the invention of the present preferred embodiment, the high-order calculating unit includes the detecting unit (the fourth register 21 and the rising-edge detection state machine 22) and the computing unit (the third and fourth subtracters 12 and 20); the detecting unit allows the first register 5 to hold the count value of the counter 4 at the time point that is shifted half a period of the period Tjaw from the time point at which the phases match when it detects the time point at which the phases of the output pulse signals of the BASE-VCO 1 and the JAW-VCO 2 match; and the computing unit identifies the number of pulses in the BASE-VCO 1's output pulse signal at the activation time point of the sampling signal Ps based on the count value of the counter 4 held by the first register 5 and the phase difference calculated by the low-order calculating unit. Therefore, the present invention can be configured without using a shift register that has a large circuit scale but with a small scale circuit configuration.

It should be noted that the rising-edge detection state machine 22 may be of any kind of circuit as long as it achieves the procedure shown in the state transition diagram of FIG. 26. In addition, the procedure shown in the state transition diagram of FIG. 26 should be considered as illustrative and not limiting, and other configurations are possible as long as the time point at which the value pfd_edge rises from Low to Hi can be specified.

Moreover, the combination of the down counter 13 and the third subtracter 12 is not essential, and in place, it is possible to employ an up counter that can count from "2" to "9". Furthermore, the fourth register 21 is not necessarily limited to a register, but it is possible to use one that is capable of holding an output value of the BASE-VCO 1, such as a sample and hold circuit.

Eighth Preferred Embodiment

The present preferred embodiment is a variation of the A-D converters according to the first through seventh preferred embodiments that is capable of obtaining a V-F conversion value that is less than a period of the main VCO even when the period Tbase and the period Tjaw have not been found in advance in the A-D converters of the first through seventh preferred embodiments.

In the calculation of the low order according to the first preferred embodiment, the value "9" needs to be entered in advance in the third subtracter 12. In addition, in the second to fourth and seventh preferred embodiments, the down counter 13 needs to be capable of counting from "7" to "0". In the fifth and sixth preferred embodiments, the number of entries in the 1-bit 8-entry shift register 16 and the 18-bit 8-entry shift register 18 need to set to "8".

All of these have been achievable under the circumstances in which the ratio A:B of the period Tbase and the period Tjaw has been found in advance (8:9 in FIGS. 2 and 4) and the circuit design can be made according to that ratio. However, in some cases, it may be necessary to use two VCOs whose values of the periods Tbase and Tjaw have not been found as the BASE-VCO 1 and the JAW-VCO 2. The present preferred embodiment makes available an A-D converter that is adaptable even when using such two VCOs whose values of the periods Tbase and Tjaw have not been found. It should be noted that in this case too, the two VCOs must of course have a period difference such that A≠B. If the VCOs have no period difference, it is impossible to determine a delay amount based on the detection of phase difference.

Figure 29:
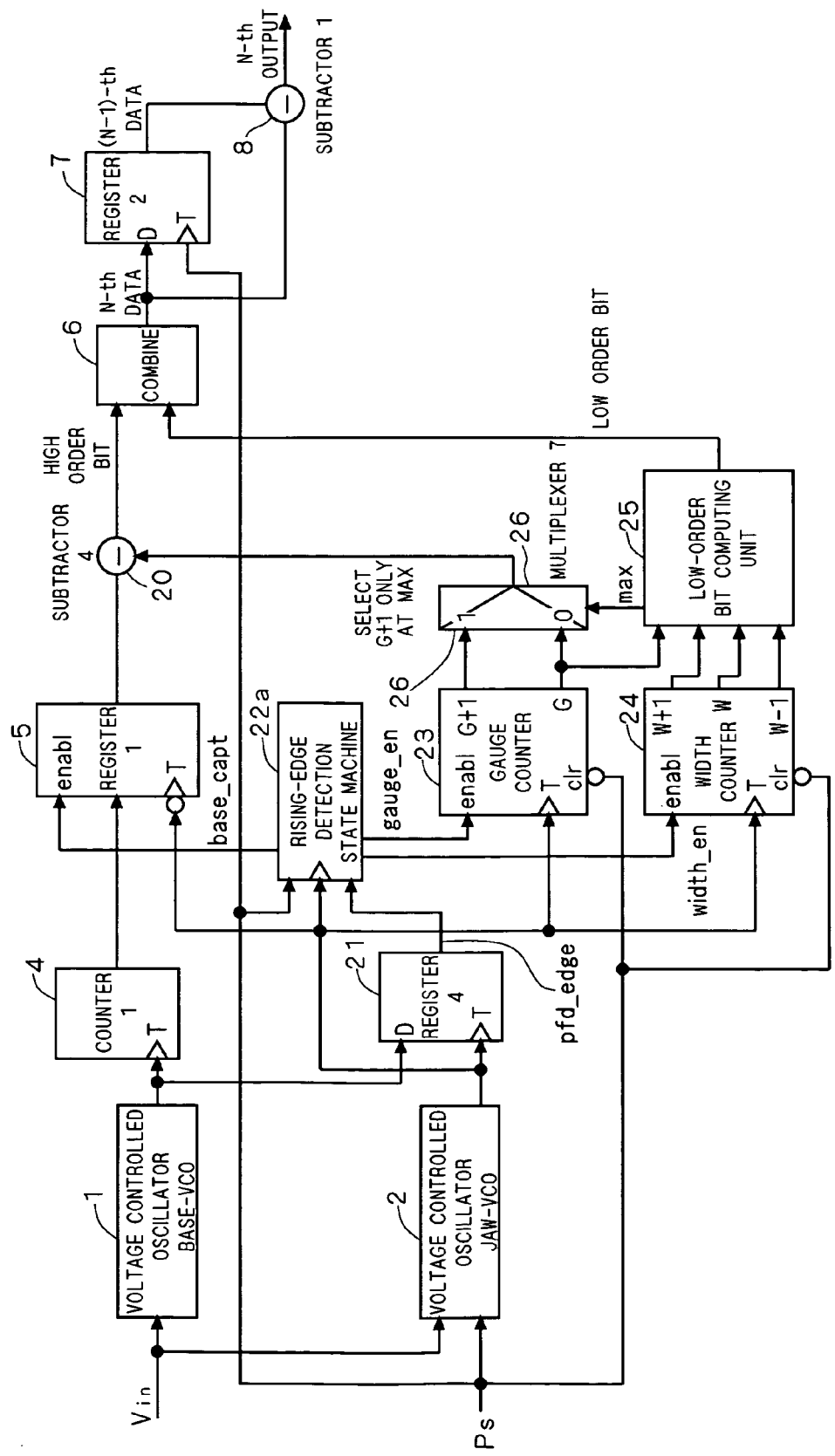
FIG. 29 is a circuit diagram showing an A-D converter according to an eighth preferred embodiment.

FIG. 29 is a circuit diagram showing an A-D converter according to the present preferred embodiment. As shown in FIG. 29, the present preferred embodiment is, as one example, based on the A-D converter according to the seventh preferred embodiment and employs a rising-edge detection state machine 22a in place of the rising-edge detection state machine 22 used in the seventh preferred embodiment. In addition, it employs a gauge counter 23, a width counter 24, a low-order bit computing unit 25, and a multiplexer 26, in place of the down counter 13 and the third subtracter 12. It should be noted that the fourth register 21 and the rising-edge detection state machine 22a constitute the detecting unit in the present preferred embodiment, and the low-order bit computing unit 25 constitutes the computing unit of the low-order calculating unit in the present preferred embodiment. In addition, the fourth subtracter 20 and the multiplexer 26 constitute the computing unit of the high-order calculating unit in the present preferred embodiment. In FIG. 29, the device configuration is the same as that shown in FIG. 25 except that the gauge counter 23, the width counter 24, the low-order bit calculating unit 25, and the multiplexer 26 are provided.

In this A-D converter, the rising-edge detection state machine 22a detects a time point at which the phases of the output pulse signals of the BASE-VCO 1 and the JAW-VCO 2 match and a time point at which the phases of the two pulse signals match each other inversely by referencing the content held in the fourth register 21, and the gauge counter 23 performs counting corresponding to oscillation of the JAW-VCO 2's output pulse signal from the activation time point of the sampling signal Ps to the time point detected by the rising-edge detection state machine 22a at which the phases match. In addition, the width counter 24 performs counting corresponding to either oscillation of the JAW-VCO 2's output pulse signal from the time point at which the phases of the BASE-VCO 1 and the JAW-VCO 2 match that has been detected by the rising-edge detection state machine 22a to the time point at which the phases of the BASE-VCO 1 and the JAW-VCO 2 match that will be detected next by the rising-edge detection state machine 22a, or oscillation of the JAW-VCO 2's output pulse signal in a period from the time point detected by the rising-edge detection state machine 22a at which the phases of the output pulse signals of the BASE-VCO 1 and the JAW-VCO 2 match each other inversely to the next time point at which the phases of the two pulse signals match each other inversely. Then, the computing unit constituted by the low-order bit computing unit 25 calculates, for each sampling period, the phase difference by dividing the count value of the gauge counter 23 by the count value of the width counter 24.

FIG. 30 is a diagram illustrating the detailed configuration of the low-order bit computing unit 25. As shown in FIG. 30, the low-order bit computing unit 25 has a subtracter 25a, a multiplexer 25b, and a divider 25c. The signal inputs to the subtracter 25a, the multiplexer 25b, and the divider 25c will be discussed later.

Figure 31:
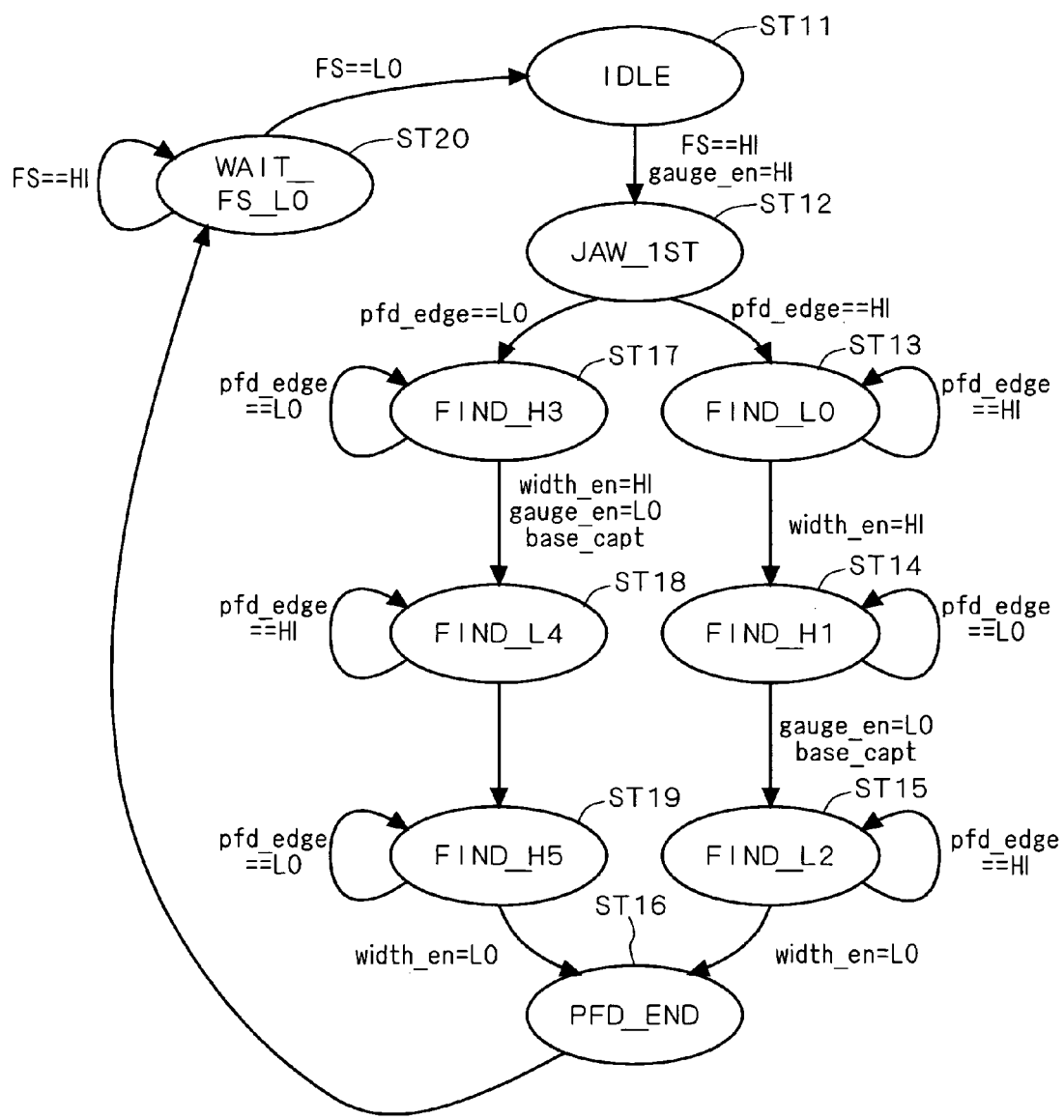
FIG. 31 is a state transition diagram for a rising-edge detection state machine.
Figure 32:
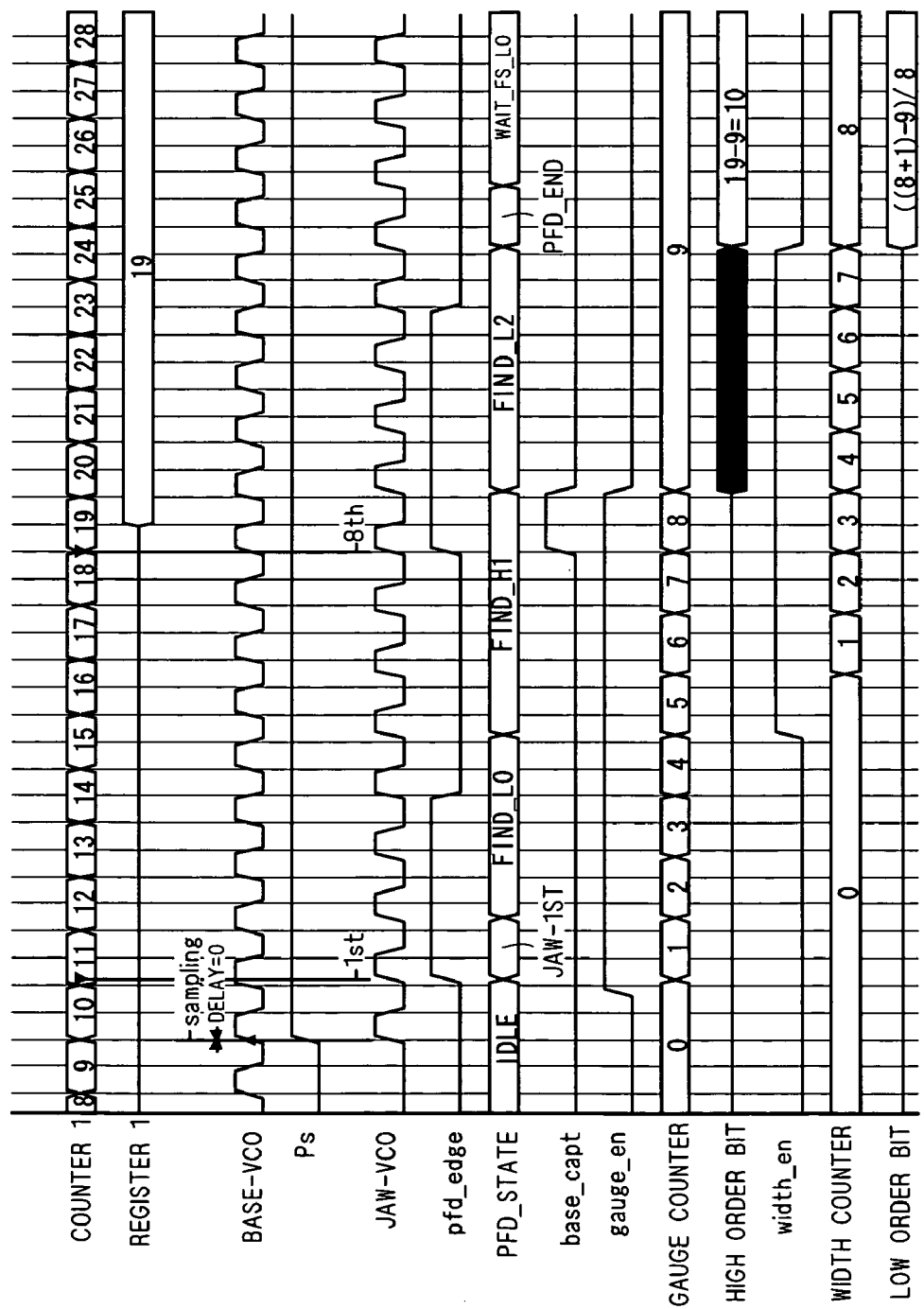
FIG. 32 is a timing chart showing an operation of the A-D converter according to the eighth preferred embodiment.
Figure 33:
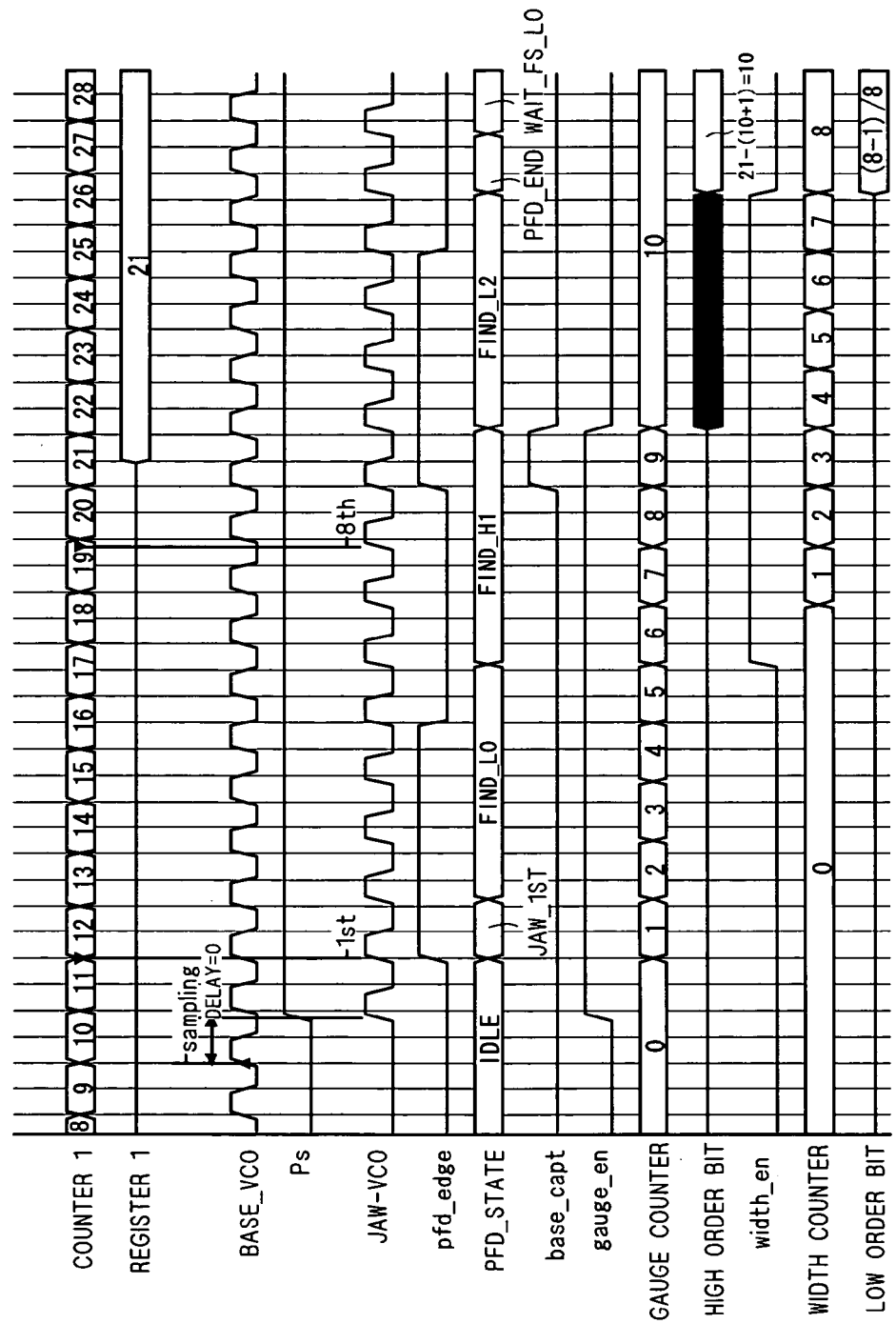
FIG. 33 is a timing chart showing an operation of the A-D converter according to the eighth preferred embodiment.

FIG. 31 is a state transition diagram of the rising-edge detection state machine 22a. FIGS. 32 to 34 are timing charts illustrating the operations of the A-D converter according to the present preferred embodiment. Hereinbelow, first, the operation of the rising-edge detection state machine 22a will be discussed with reference to the state transition diagram of FIG. 31 and the timing chart (in the case where Delay=0) of FIG. 32.

First, the rising-edge detection state machine 22a does not operate when the sampling signal Ps is in a deactivated state and stays on standby in an "IDLE" state ST11 until the sampling signal Ps is brought to an activated state.

Next, when the signal value of the sampling signal Ps (referred to as FS) is activated and turned to Hi, the rising-edge detection state machine 22a activates an enable signal gauge_en (=Hi) for the gauge counter 23 and proceeds to a "JAW__1ST" state ST12. The gauge counter 23 thereby starts counting (up counting).

In the "JAW__1ST" state ST12, it is determined whether the value pfd_edge held by the fourth register 21 is Hi or Low. Since the fourth register 21 performs sampling of the value of the BASE-VCO 1's output pulse signal at the rising edge of the JAW-VCO 2's output pulse signal, the value pfd_edge becomes Hi at the rising edge of the pulse JAW__1ST shown in FIG. 32. It should be noted that the rising-edge detection state machine 22a proceeds to a "FIND_H3" state ST17 when the value pfd_edge is detected as Low in the "JAW__1ST" state ST12. The operation in this case will be discussed in the description about FIG. 34 later.

If the value pfd_edge is detected as Hi, the rising-edge detection state machine 22a proceeds to a "FIND_L0" state ST13 and stays on standby until the value pfd_edge becomes Low. Then, if the value pfd_edge changes to Low, the rising-edge detection state machine 22a activates an enable signal width_en (=Hi) for the width counter 24 and proceeds to a "FIND_H1" state ST14. The width counter 24 thereby starts counting (up counting). In the case of FIG. 32, the pfd_edge value changes to Low at 3 pulses after the pulse JAW__1ST, and therefore, the rising-edge detection state machine 22a proceeds from the "FIND_L0" state ST13 to the "FIND__1H" state ST14 at the next rising edge of the pulse JAW-VCO 2.

In the "FIND_H1" state ST14, the rising-edge detection state machine 22 this time stays on standby until the value pfd_edge becomes Hi. In the case of FIG. 32, since the value pfd_edge returns to Hi at 4 pulses after it has changed to Low (the phases match at this time point), the rising-edge detection state machine 22a detects the value pfd_edge as being Hi and activates an enable signal base_capt (=Hi) for the first register 5 so as to allow the first register 5 to hold the count value of the counter 4 at the time point shifted half a period of the period Tjaw from the time point at which the phases match (in FIG. 32, the value "19" is held by the first register 5). At this time, the rising-edge detection state machine 22a deactivates the enable signal gauge_en (=Low) for the gauge counter 23. Then, the rising-edge detection state machine 22a proceeds to a "FIND_L2" state ST15.

In the "FIND_L2" state ST15, the rising-edge detection state machine 22a this time stays on standby until the value pfd_edge becomes Low. In the case of FIG. 32, since the value pfd_edge returns to Low at 4 pulses after it has changed to Hi, the rising-edge detection state machine 22a deactivates the enable signal width_en (=Low) for the width counter 24. Then, the rising-edge detection state machine 22a proceeds to a "PFD_END" state ST16.

Since FIG. 32 depicts the case where Delay=0, the count value of the gauge counter 23 has reached "9" at this time point and the count value of the width counter 24 has reached "8". The subtracter 25a in the low-order bit computing unit 25 receives a count value output value G from the gauge counter 23, and a value W+1, which is a value obtained by adding "+1" to a count value output W from the width counter 24, and it outputs a value obtained by subtracting the value G from the value W+1. It should be noted that if the value obtained by subtracting the value G from the value W+1 results in a negative value, the subtracter 25a activates a signal max. In the case of FIG. 32, the subtracter 25a outputs a value "8+1"–"9"="0".

The multiplexer 25b in the low-order bit computing unit 25 receives the output value from the subtracter 25a as an input signal 0 and a value W−1 obtained by adding "−1" to the count value output W of the width counter 24, as an input signal 1, and it selectively outputs the input signal 1 if the output value of the subtracter 25a is negative and outputs the input signal 0 if the output value of the subtracter 25a is equal to or greater than 0. In the case of FIG. 32, the subtracter 25a outputs the value "0", and therefore, the multiplexer 25b selects the input signal 0 and outputs its content value "0".

The divider 25c in the low-order bit computing unit 25 receives an output value of the multiplexer 25b and the count value output W from the width counter 24 and outputs a value obtained by dividing the output value of the multiplexer 25b by the value W. In the case of FIG. 32, the divider 25c outputs a value "0"+"8"="⅛". This output of the divider 25c is the low order (denoted as "low order bit" in FIG. 32).

The multiplexer 26 receives the count value output G of the gauge counter 23 as an input signal 0 and the value G+1 obtained by adding "+1" to the count value output G from the gauge counter 23 as an input signal 1, and it selectively outputs the input signal 1 if the signal max output by the subtracter 25a is activated and outputs the input signal 0 if the signal max is deactivated. In the case of FIG. 32, the subtracter 25a outputs the value "0", which is not a negative value, and accordingly the signal max is deactivated. Therefore, the multiplexer 26 outputs a count value output G "9" of the gauge counter 23 to the fourth subtracter 20.

Since the first register 5 is holding the value "19", the fourth subtracter 20 outputs a value 19"–"9"="10". At this time, the output value from the high- and low-order combining unit 6 is "10+⅛". This value "10" indicates the number of pulses in the BASE-VCO 1's output pulse signal at the activation time point of the sampling signal Ps; thus, the multiplexer 26 and the fourth subtracter 20 functions as a computing unit for identifying the number of pulses in the BASE-VCO 1's output pulse signal at the activation time point of the sampling signal Ps.

Thereafter, the rising-edge detection state machine 22a proceeds to a "WAIT_FS_LO" state ST20 and stays on standby until the signal value FS of the sampling signal Ps becomes Low. Then, after the signal value FS has become Low, the rising-edge detection state machine 22a proceeds again to the "IDLE" state ST11 and stays on standby until the sampling signal Ps is next brought to an activated state.

The timing chart of FIG. 33 shows the case where Delay=7. In this case, the rising-edge detection state machine 22a proceeds from the IDLE" state ST11 to the "JAW_1ST" state ST12 in response to activation of the sampling signal Ps (=Hi). At this time, the rising-edge detection state machine 22a activates the enable signal gauge_en (=Hi) for the gauge counter 23, and the gauge counter 23 thereby starts counting (up counting).

In the "JAW_1ST" state ST12, it is determined whether the value pfd_edge held by the fourth register 21 is Hi or Low. The value pfd_edge becomes Hi at the rising edge of the pulse JAW_1ST in FIG. 33, and therefore, the rising-edge detection state machine 22a proceeds to the "FIND_L0" state ST13, staying on standby until the value pfd_edge becomes Low. Then, if the value pfd_edge changes to Low, the rising-edge detection state machine 22a activates the enable signal width_en (=Hi) for the width counter 24 and proceeds to the "FIND_Hi" state ST14. The width counter 24 thereby starts counting (up counting). In the case of FIG. 33, the value pfd_edge changes to Low at 4 pulses after the pulse JAW_1ST, the rising-edge detection state machine 22a proceeds from the "FIND_L0" state ST13 to the "FIND_H1" state ST14 at the next rising edge of the pulse JAW-VCO 2.

In the "FIND_H1" state ST14, the rising-edge detection state machine 22a this time stays on standby until the value pfd_edge becomes Hi. In the case of FIG. 33, since the pfd-edge value returns to Hi at 4 pulses after it has changed to Low (the phases match at this time point), the rising-edge detection state machine 22a detects the value pfd_edge as Hi and activates the enable signal base_capt (=Hi) for the first register 5 to allow the first register 5 to hold the count value of the counter 4 at the time point shifted half a period of the period Tjaw from the time point at which the phases match (in FIG. 33 the value "21" is held by the first register 5). At this time, the rising-edge detection state machine 22a deactivates the enable signal gauge_en (=Low) for the gauge counter 23. Then, the rising-edge detection state machine 22a proceeds to the "FIND_L2" state ST15.

In the "FIND_L2" state ST15, the rising-edge detection state machine 22a this time stays on standby until the value pfd_edge becomes Low. In the case of FIG. 33, since the value pfd_edge returns to Low at 4 pulses after it has changed to Hi, the rising-edge detection state machine 22a deactivates the enable signal width_en (=Low) for the width counter 24 at this time. Then, the rising-edge detection state machine 22a proceeds to the "PFD_END" state ST16.

FIG. 33 shows the case where Delay=7, so at this time point, the count value G of the gauge counter 23 has reached "10" and the count value W of the width counter 24 has reached "8". Therefore, in the case of FIG. 33, the subtracter 25a outputs a negative value "8+1"–"10"="–1". Accordingly, in this case the subtracter 25a activates the signal max.

Also, since the subtracter 25a outputs a negative value, the multiplexer 25b in the low-order bit computing unit 25 outputs a value W–1 (="8"–1="7") to the divider 25c. Then, the divider 25c outputs a value "7"÷"8"="⅞". This output of the divider 25c is the low order.

The multiplexer 26 outputs the value "11" obtained by adding "+1" to the count value output G "10" of the gauge counter 23 to the fourth subtracter 20 since the signal max from the subtracter 25a is activated. Since the value "21" is held by the first register 5, the fourth subtracter 20 outputs a value "21"–"11"="10". At this time, the output value from the high- and low-order combining unit 6 is "10+⅞". This value "10" represents the number of pulses in the BASE-VCO 1's output pulse signal at the activation time point of the sampling signal Ps.

Thereafter, the rising-edge detection state machine 22a proceeds to the "WAIT_FS_LO" state ST20 and stays on standby until the signal value FS of the sampling signal Ps becomes Low. Then, after the signal value FS has become Low, the rising-edge detection state machine 22a proceeds to the "IDLE" state ST11 again and stays on standby until the sampling signal Ps is next brought to an activated state.

The timing chart of FIG. 34 illustrates the case where Delay=3. In this case, the rising-edge detection state machine 22a proceeds from the IDLE" state ST11 to the "JAW_1ST" state ST12 in response to activation of the sampling signal Ps (=Hi). At this time, the rising-edge detection state machine 22a activates the enable signal gauge_en (=Hi) for the gauge counter 23, and the gauge counter 23 thereby starts counting (up counting).

In the "JAW_1ST" state ST12, it is determined whether the value pfd_edge held by the fourth register 21 is Hi or Low. At the rising edge of the pulse JAW_1ST in FIG. 34, the value pfd_edge becomes Low, and therefore, the rising-edge detection state machine 22a proceeds to the "FIND_H3" state ST17 and stays on standby until the value pfd_edge changes to Hi (the phases match at this time point). Then, when the value pfd_edge changes to Hi, it activates the enable signal width_en (=Hi) for the width counter 24 and the enable signal base_capt (=Hi) for the first register 5 to allow the first register 5 to hold the count value of the counter 4 at the time point shifted half a period of the period Tjaw from the time point at which the phases match (in FIG. 34, the value "16" is held by the first register 5). At this time, the rising-edge detection state machine 22a deactivates the enable signal gauge_en (=Low) for the gauge counter 23. Then, the rising-edge detection state machine 22a proceeds to a "FIND_L4" state ST18.

In the "FIND_L4" state ST18, it stays on standby this time until the value pfd_edge becomes Low. In the case of FIG. 34, since the value of pfd_edge returns to Low at 4 pulses after it has changed to Hi, the rising-edge detection state machine 22a proceeds to a "FIND_H5" state ST19.

In the "FIND_H5" state ST19, it stays on standby this time until the value pfd_edge becomes Hi. In the case of FIG. 34, since the value of pfd_edge returns to Hi at 4 pulses after it has changed to Low, the rising-edge detection state machine 22a deactivates the enable signal width_en (=Low) for the width counter 24. Then, the rising-edge detection state machine 22a proceeds to the "PFD_END" state ST16.

FIG. 34 illustrates the case where Delay=3, so at this time point, the count value G of the gauge counter 23 has reached "6" and count value W of the width counter 24 has reached "8". Thus, in the case of FIG. 34, the subtracter 25a outputs a value "8+1"−"6"="3". Accordingly, in this case, the subtracter 25a deactivates the signal max.

In addition, because the subtracter 25a does not output a negative value, the multiplexer 25b in the low-order bit computing unit 25 outputs an output value W+1−G (="3") of the subtracter 25a to the divider 25c. The divider 25c outputs a value "3"÷"8"="3/8". This output of the divider 25c is the low order.

The multiplexer 26 outputs the count value output G "6" of the gauge counter 23 to the fourth subtracter 20 since the signal max from the subtracter 25a is deactivated. Because the value "16" held by the first register 5, the fourth subtracter 20 outputs a value "16"−"6"="10". At this time, the output value from the high- and low-order combining unit 6 is "10+3/8". This value "10" represents the number of pulses in the BASE-VCO 1's output pulse signal at the activation time point of the sampling signal Ps.

Thereafter, the rising-edge detection state machine 22a proceeds to the "WAIT_FS_LO" state ST20 and stays on standby until the signal value FS of the sampling signal Ps becomes Low. Then, after the signal value FS has become Low, the rising-edge detection state machine 22a proceeds to the "IDLE" state ST11 again and stays on standby until the sampling signal Ps is next brought to an activated state.

In the foregoing, "+1" is added to the output G of the gauge counter 23 and "+1" or "−1" is added to the output W of the width counter 24; this is for the purpose of correction such that the calculated value will be a normal value in each of the cases where Delay=0 to Delay=7. The count value G of the gauge counter 23 is counted corresponding to oscillation of the JAW-VCO 2's output pulse signal in a period from the activation time point of the sampling signal Ps to the time point detected by the rising-edge detection state machine 22a, at which the phases match. The count value W of the width counter 24 is counted corresponding to oscillation of the JAW-VCO 2's output pulse signal in a period from the time point, detected by the rising-edge detection state machine 22, at which the phases of the output pulse signals of the BASE-VCO 1 and the JAW-VCO 2 match to the next time point at which the phases of the two pulse signals match, or oscillation of the JAW-VCO 2's output pulse signal in a period from the time point, detected by the rising-edge detection state machine 22a, at which the phases of the output pulse signals of the BASE-VCO 1 and the JAW-VCO 2 inversely match each other to the time point at which the phases of the two pulse signals inversely match each other.

Regarding the width counter 22, specifically, when the width counter 22 is operated from the "FIND_L0" state ST13 as in the cases of FIGS. 32 and 33, the duration from a falling edge to the next falling edge of pfd_edge will be shortest when finding the value A of the period ratio A:B. This value A will be the denominator of the fraction part. In addition, when the width counter 22 is operated from the "FIND_H3" state ST17 as in the case of FIG. 34, the duration from a rising edge to the next rising edge of pfd_edge will be shortest when finding the value A of the period ratio A:B.

Here, for example, assuming a case where the sampling signal Ps is activated with a delay of 1/8 phase in FIG. 33, the entire output pulse JAW-VCO 2 is delayed by 1/8 phase in FIG. 33. In this case, the time point at which the phases match is made earlier to the pulse JAW_8TH in FIG. 33 and the position of the enable signal base_capt becomes earlier by the period Tjaw; thus, the value held by the first register 5 is not "21" but "20". Also, the value held by the gauge counter 23 is not "10", but "9". Therefore, the calculated value of the low order bit becomes "9/8", as in the case of FIG. 32.

In addition, since the first register 5 is holding the value "20", the fourth subtracter 20 outputs a value "20"−"9"="11".

In FIG. 33, the output value of the high- and low-order combining unit 6 is "10+7/8" when there is no jitter, and when this sampling signal Ps is activated by only 1/8 phase, the output value of the high- and low-order combining unit 6 is "11+9/8". Thus, even when jitter occurs, the values detected do not produce a large deviation.

According to the invention of the present preferred embodiment, the low-order calculating unit includes the detecting unit (the fourth register 21 and the rising-edge detection state machine 22a), the gauge counter 23, the width counter 24, and the low-order bit computing unit 25; the low-order bit computing unit 25 calculates a phase difference by dividing a count value G of the gauge counter 23 by a count value W of the width counter 24 for each sampling period. The value obtained by dividing a count value G of the gauge counter 23 by a count value W of the width counter 24 corresponds to a V-F conversion value that is a period of less than Tbase, and therefore, the phase difference can be calculated properly regardless of what values the period Tbase of the BASE-VCO 1 and the period Tjaw of the JAW-VCO 2 are.

According to the invention of the present preferred embodiment, the high-order calculating unit includes the detecting unit (the fourth register 21 and the rising-edge detection state machine 22a) and the calculating unit (the multiplexer 26 and the fourth subtracter 20), wherein the detecting unit causes the first register 5 to hold the count value of the counter 4 at the time point shifted half a period of the period Tjaw when finding the time point at which the phases of the BASE_VCO1 and the JAW-VCO 2 match, and the calculating unit identifies the number of pulses in the BASE-VCO 1's output pulse signal at the activation time point of the sampling signal Ps based on the count value of the counter 4 held by the first register 5 and on the phase difference calculated by the low-order calculating unit. Thus, the present invention can be configured without using shift register that has a large circuit scale but with a small scale circuit configuration.

It should be noted that the rising-edge detection state machine 22a may be any kind of circuit as long as it achieves the procedure of the above-discussed state transition diagram of FIG. 31. Moreover, the procedure shown in the state transition diagram of FIG. 31 should be considered as illustrative and not limiting, and other configurations are possible as long as the time point at which the value pfd_edge rises from Low to Hi can be specified.

Furthermore, the fourth register 21 is not necessarily limited to a register, but it is possible to use one that is capable of holding an output value of the BASE-VCO 1, such as a sample and hold circuit.

It should be noted that in the present preferred embodiment, the values of the period Tbase and the period difference Tdiff may be any value, but arithmetic errors tend to occur when the maximum value of the low order bit (low order) to be calculated becomes more distant from a power of 2. Furthermore, when the value A is not a positive integer, it means that measurement is not performed uniformly over the period Tbase, producing deviation in the output value of the low order bit.

The deviation may be lessened but cannot be eliminated with a delay adding device, etc., according to the invention of the fourth preferred embodiment. Nevertheless, these two errors reduce when the bit number of the low order bit is increased, that is, the value A is made greater.

When the invention according to the present preferred embodiment is to be applied, it is necessary to determine the magnitude of A so that these errors intrinsic to the invention according to the present preferred embodiment becomes less than the necessary output bit accuracy.

The invention claimed is:

1. An analog-to-digital converter for converting an input voltage that is an analog signal into a digital signal, comprising:
    a first VCO (Voltage Controlled Oscillator) for outputting a first pulse signal oscillating at a first period;
    a second VCO for outputting a second pulse signal oscillating at a second period; and
    a digital value calculating unit, wherein:
    a ratio of said first period and said second period is A:B ($A \neq B$);
    said first and second periods are controlled by said input voltage while said ratio is maintained;
    said first VCO starts oscillation of said first pulse signal by free running;
    said second VCO starts oscillation of said second pulse signal in response to activation of a sampling signal indicating a sampling period for said digital signal; and
    said digital value calculating unit calculates:
    a high order bit of said digital signal according to the number of pulses in said first pulse signal contained in said sampling period; and
    a low order bit of said digital signal according to the number of pulses in said first or second pulse signal contained from an activation time point of said sampling signal to a time point at which phases of said first and second pulses match.

2. The analog-to-digital converter according to claim 1, wherein:
    said digital value calculating unit comprises:
    a high-order calculating unit;
    a low-order calculating unit;
    a high- and low-order combining unit;
    a first register; and
    a subtracter, wherein
    said high-order calculating unit calculates, as a high order, the number of pulses in said first pulse signal from start of oscillation of said first pulse signal until a current activation time point of said sampling signal for each said sampling period;
    said low-order calculating unit calculates, as a low order, a phase difference from the last pulse within said sampling period of said first pulse signal until the end point of said sampling period for each said sampling period, based on the number of pulses contained in said first or second pulse signal from said current activation time point until a time point at which phases of said first and second pulse signals of said sampling signal match each other;
    said high- and low-order combining unit combines said high order and said low order to generate a combined value and lets said first register hold said combined value; and
    said subtracter outputs a difference value between a value held in said first register in said sampling period that is one before a current period and a current value of said combined value, as said digital signal composed of said high order bit and said low order bit.

3. The analog-to-digital converter according to claim 2, wherein:
    said high-order calculating unit comprises:
    a first counter for counting the number of pulses in said first pulse signal; and
    a second register, and
    said low-order calculating unit comprises:
    a third register, and wherein:
    said second register holds the number of pulses in said first counter at said activation time point of said sampling signal for each said sampling period and outputs the number of pulses as said high order;
    said third register holds the number of pulses in said first counter at a time point at which the phases of said first and second pulse signals match each other for each said sampling period; and
    said low-order calculating unit calculates said phase difference based on a difference between the number of pulses held in said third register and the number of pulses held in said second register for each said sampling period.

4. The analog-to-digital converter according to claim 2, wherein:
    said low-order calculating unit comprises a second counter for counting corresponding to oscillation of said second pulse signal from said activation time point of said sampling signal until said time point at which the phases of said first and second pulse signals match each other, and wherein
    said low-order calculating unit calculates said phase difference for each said sampling period, based on a count value of said second counter.

5. The analog-to-digital converter according to claim 2, wherein:
    said low-order calculating unit comprises:
    a shift register having one of said first and second pulse signals as a signal input and the other one of said first and second pulse signals as a clock input; and
    an encoder for outputting a numerical value corresponding to an output pattern of said shift register as said phase difference.

6. The analog-to-digital converter according to claim 2, wherein:
    said high-order calculating unit comprises:
    a first counter for counting the number of pulses in said first pulse signal; and
    a register, and wherein:
    said register holds, for each said sampling period, at least a count value of said first counter at a time point that is shifted half a period of said second period from said time point at which the phases of said first and second pulse signals match each other; and said high-order calculating unit identifies, for each said sampling period, the number of pulses in said first pulse signal at said activation time point of said sampling signal based on said count value held in said register and said phase difference calculated by said low-order calculating unit.

7. The analog-to-digital converter according to claim 6, wherein:
said register is a shift register capable of holding, for each said sampling period, at least said count value of said first counter at said time point shifted half a period of said second period from said time point at which the phases of said first and second pulse signals match each other in response to said count value of said first counter, and
said high-order calculating unit further comprises:
a selecting unit for selecting, for each said sampling period, a count value of said first counter stored in said shift register at said time point shifted half a period of said second period from said time point at which the phases of said first and second pulse signals match each other, based on said phase difference calculated by said low-order calculating unit; and
a computing unit for identifying the number of pulses in said first pulse signal at said activation time point of said sampling signal based on said count value of said first counter selected by said selecting unit and said phase difference calculated by said low-order calculating unit.

8. The analog-to-digital converter according to claim 6, wherein:
said high-order calculating unit further comprises:
a detecting unit; and
a computing unit, and wherein:
said detecting unit causes said register to hold said count value of said first counter at said time point shifted half a period of said second period from said time point at which said phases of said first and second pulse signals match each other when said detecting unit has detected said time point at which the phases match each other; and
said computing unit identifies the number of pulses in said first pulse signal at said activation time point of said sampling signal based on said count value of said first counter held by said register and on said phase difference calculated by said low-order calculating unit.

9. The analog-to-digital converter according to claim 2, wherein:
said low-order calculating unit comprises:
a detecting unit for detecting a time point at which phases of said first and second pulse signals match each other and a time point at which said phases of said first and second pulse signals inversely match each other;
a third counter for counting corresponding to oscillation of said second pulse signal from an activation time point of said sampling signal until said time point detected by said detecting unit, at which the phases of said first and second pulse signals match each other;
a fourth counter for counting corresponding to oscillation of said second pulse signal from said time point detected by said detecting unit at which the phases of said first and second pulse signals match each other to a next time point detected by said detecting unit at which the phases of said first and second pulse signals match each other, or oscillation of said second pulse signal from said time point detected by said detecting unit, at which the phases of said first and second pulse signals inversely match each other, to a next time point detected by said detecting unit at which the phases of said first and second pulse signals inversely match each other; and
a computing unit, wherein
said computing unit calculates said phase difference by dividing a count value of said third counter by a count value of said fourth counter for each said sampling period.

10. The analog-to-digital converter according to claim 1, wherein a maximum value of said low order bit calculated is a value obtained by subtracting 1 from a power of 2.

11. The analog-to-digital converter according to claim 1, wherein:
one of said first and second VCOs includes a plurality of inverting circuits connected in series in a ring shape;
the other one of said first and second VCOs includes a plurality of other inverting circuits connected in series in a ring shape;
said plurality of other inverting circuits has a dual input NAND circuit or a dual input NOR circuit as a first stage inverting circuit;
one of input terminals of said dual input NAND circuit or said dual input NOR circuit is supplied with an output of a last stage inverting circuit among said plurality of other inverting circuits;
the other input terminal of said dual input NAND circuit or said dual input NOR circuit is supplied with an output of an inverting circuit that is prior to said last stage among said plurality of other inverting circuits;
an output of a last stage inverting circuit among said plurality of inverting circuits functions as one of said first and second pulse signals corresponding to said one of said first and second VCOs; and
said output of said last stage inverting circuit among said plurality of other inverting circuits functions as the other one of said first and second pulse signals corresponding to said other one of said first and second VCOs.

12. The analog-to-digital converter according to claim 1, further comprising:
a first prescaler for dividing a frequency corresponding to said first period of said first pulse signal by said B;
a second prescaler for dividing a frequency corresponding to said second period of said second pulse signal by said A;
a phase comparator for comparing phases of outputs of said first and second prescalers; and
a LPF (Low Pass Filter) receiving an output from said phase comparator, and wherein:
at least one of said first and second periods is controlled by an output from said LPF in addition to said input voltage.

13. The analog-to-digital converter according to claim 1, further comprising:
a delay circuit for adding a predetermined delay amount to said first pulse signal, and wherein
said predetermined delay amount is a delay amount that has been measured in advance and is produced between activation of said sampling signal and start of oscillation of said second pulse signal.

* * * * *